(12) United States Patent
Setaka et al.

(10) Patent No.: US 7,131,851 B2
(45) Date of Patent: Nov. 7, 2006

(54) ANISOTROPIC CONDUCTIVITY CONNECTOR, CONDUCTIVE PASTE COMPOSITION, PROBE MEMBER, AND WAFER INSPECTION DEVICE, AND WAFER INSPECTING METHOD

(75) Inventors: Ryoji Setaka, Tokyo (JP); Terukazu Kokubo, Tokyo (JP); Koji Seno, Tokyo (JP); Takeo Hara, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/522,536
(22) PCT Filed: Aug. 7, 2003
(86) PCT No.: PCT/JP03/10056
§ 371 (c)(1), (2), (4) Date: Jan. 27, 2005
(87) PCT Pub. No.: WO2004/015761
PCT Pub. Date: Feb. 19, 2004

(65) Prior Publication Data
US 2005/0272282 A1 Dec. 8, 2005

(30) Foreign Application Priority Data
Aug. 9, 2002 (JP) ............................. 2002-232203
Aug. 9, 2002 (JP) ............................. 2002-232204

(51) Int. Cl.
*H01R 4/58* (2006.01)
(52) U.S. Cl. .......................... 439/86; 439/91
(58) Field of Classification Search ................ 439/86
See application file for complete search history.

(56) References Cited

U.S. PATENT DOCUMENTS 5,586,892 A 12/1996 Sato ............................ 439/91

(Continued)

FOREIGN PATENT DOCUMENTS

JP 2002-203879 7/2002
WO 02/47149 6/2002

OTHER PUBLICATIONS

U.S. Appl. No. 10/552,995, filed Oct. 13, 2005, Sato et al.

(Continued)

* cited by examiner

Primary Examiner—Briggitte R. Hammond
(74) Attorney, Agent, or Firm—Oblon, Spivak, McClelland, Maier & Neustadt, P.C.

(57) ABSTRACT

Disclosed herein are an anisotropically conductive connector, by which positioning, and holding and fixing to a wafer can be conducted with ease even when the wafer has a large area of 8 inches or greater in diameter, and the pitch of electrodes to be inspected is small, and good conductivity is retained even upon repeated use, and applications thereof. The anisotropically conductive connector has a frame plate, in which a plurality of anisotropically conductive film-arranging holes have been formed correspondingly to electrode regions in all or part of integrated circuits on a wafer, and a plurality of elastic anisotropically conductive films arranged in the respective anisotropically conductive film-arranging holes. The elastic anisotropically conductive films each have a plurality of conductive parts for connection extending in a thickness-wise direction thereof and containing conductive particles, and an insulating part mutually insulating them. The conductive particles are obtained by coating core particles exhibiting magnetism with a high-conductive metal, a proportion of the high-conductive metal to the core particles is at least 15% by mass, and the following t is at least 50 nm: $t=[1/(Sw \cdot \rho)] \times [N/(1-N)]$, wherein Sw is a BET specific surface area ($m^2/kg$) of the core particles, $\rho$ is a specific gravity ($kg/m^3$) of the high-conductive metal, and N is (mass of the high-conductive metal/total mass of the conductive particles).

14 Claims, 12 Drawing Sheets

U.S. PATENT DOCUMENTS

| | | | |
|---|---|---|---|
| 6,802,720 B1 * | 10/2004 | Weiss et al. | 439/86 |
| 2001/0030019 A1 | 10/2001 | Saitoh | 439/91 |
| 2005/0272282 A1 | 12/2005 | Setaka et al. | |

OTHER PUBLICATIONS

U.S. Appl. No. 10/560,347, filed Dec. 12, 2005, Yamada et al.
U.S. Appl. No. 10/548,832, filed Sep. 13, 2005, Igarashi et al.
U.S. Appl. No. 11/205,174, filed Aug. 17, 2005, Kokubo et al.
U.S. Appl. No. 10/522,536, filed Jan. 27, 2005, Setaka et al.

ANISOTROPIC CONDUCTIVITY CONNECTOR, CONDUCTIVE PASTE COMPOSITION, PROBE MEMBER, AND WAFER INSPECTION DEVICE, AND WAFER INSPECTING METHOD

TECHNICAL FIELD

The present invention relates to an anisotropically conductive connector suitable for use in conducting electrical inspection of a plurality of integrated circuits formed on a wafer in a state of the wafer, a conductive paste composition for obtaining this anisotropically conductive connector, a probe member equipped with this anisotropically conductive connector, a wafer inspection apparatus equipped with this probe member, and a wafer inspection method using this probe member, and particularly to an anisotropically conductive connector suitable for use in conducting electrical inspection of integrated circuits, which are formed on a wafer, a diameter of which is, for example, 8 inches or greater and a total number of electrodes to be inspected in the integrated circuits formed thereon is at least 5,000, in a state of the wafer, a conductive paste composition for obtaining this anisotropically conductive connector, a probe member equipped with this anisotropically conductive connector, a wafer inspection apparatus equipped with this probe member, and a wafer inspection method using this probe member.

BACKGROUND ART

In the production process of semiconductor integrated circuit devices, after a great number of integrated circuits are formed on a wafer formed of, for example, silicon, each of these integrated circuits is generally subjected to a probe test that basic electrical properties thereof are inspected, thereby sorting defective integrated circuits. This wafer is then cut, thereby forming semiconductor chips. Such semiconductor chips are contained and sealed in respective proper packages. Each of the packaged semiconductor integrated circuit devices is further subjected to a burn-in test that electrical properties thereof are inspected under a high-temperature environment, thereby sorting semiconductor integrated circuit devices having latent defects.

In such electrical inspection of integrated circuits, such as the probe test or the burn-in test, a probe member for electrically connecting each of electrodes to be inspected in an object of inspection to a tester is used. As such a probe member, is known a member composed of a circuit board for inspection, on which inspection electrodes have been formed in accordance with a pattern corresponding to a pattern of electrodes to be inspected, and an anisotropically conductive elastomer sheet arranged on this circuit board for inspection.

As such anisotropically conductive elastomer sheets, those of various structures have heretofore been known. For example, Japanese Patent Application Laid-Open No. 93393/1976 discloses an anisotropically conductive elastomer sheet (hereinafter referred to as "dispersion type anisotropically conductive elastomer sheet") obtained by uniformly dispersing metal particles in an elastomer, and Japanese Patent Application Laid-Open No. 147772/1978 discloses an anisotropically conductive elastomer sheet (hereinafter referred to as "uneven distribution type anisotropically conductive elastomer sheet") obtained by unevenly distributing conductive magnetic particles in an elastomer to form a great number of conductive parts extending in a thickness-wise direction thereof and an insulating part for mutually insulating them. Further, Japanese Patent Application Laid-Open No. 250906/1986 discloses an uneven distribution type anisotropically conductive elastomer sheet with which, a difference in level defined between the surface of each conductive part and an insulating part is formed.

In the uneven distribution type anisotropically conductive elastomer sheet, since the conductive parts are formed in accordance with a pattern corresponding to a pattern of electrodes to be inspected of an integrated circuit to be inspected, it is advantageous compared with the dispersion type anisotropically conductive elastomer sheet in that electrical connection between electrodes can be achieved with high reliability even to an integrated circuit small in the arrangement pitch of electrodes to be inspected, i.e., center distance between adjacent electrodes to be inspected.

In such an uneven distribution type anisotropically conductive elastomer sheet, it is necessary to hold and fix it in a particular positional relation to a circuit board for inspection and an object of inspection in an electrically connecting operation to them.

However, the anisotropically conductive elastomer sheet is flexible and easy to be deformed, and so it is low in handling property. In addition, with the miniaturization or high-density wiring of electric products in recent years, integrated circuit devices used therein tend to increase in number of electrodes and arrange electrodes at a high density as the arrangement pitch of the electrodes becomes smaller. Therefore, the positioning and the holding and fixing of the uneven distribution type anisotropically conductive elastomer sheet are going to be difficult upon its electrical connection to electrodes to be inspected of the object of inspection.

In the burn-in test on the other hand, there is a problem that even when the necessary positioning, and holding and fixing of the uneven distribution type anisotropically conductive elastomer sheet to an integrated circuit device has been realized once, positional deviation between conductive parts of the uneven distribution type anisotropically conductive elastomer sheet and electrodes to be inspected of the integrated circuit device occurs when they are subjected to thermal hysteresis by temperature change, since coefficient of thermal expansion is greatly different between a material (for example, silicon) making up the integrated circuit device that is the object of inspection, and a material (for example, silicone rubber) making up the uneven distribution type anisotropically conductive elastomer sheet, as a result, the electrically connected state is changed, and thus the stably connected state is not retained.

In order to solve such a problem, an anisotropically conductive connector composed of a metal-made frame plate having an opening and an anisotropically conductive sheet arranged in the opening of this frame plate and supported at its peripheral edge by an opening edge about the frame plate has been proposed (see Japanese Patent Application Laid-Open No. 40224/1999).

This anisotropically conductive connector is generally produced in the following manner.

As illustrated in FIG. 23, a mold for molding an anisotropically conductive elastomer sheet composed of a top force 80 and a bottom force 85 making a pair therewith is provided, a frame plate 90 having an opening 91 is arranged in alignment in this mold, and a molding material with conductive particles exhibiting magnetism dispersed in a polymeric substance-forming material, which will become an elastic polymeric substance by a curing treatment, is fed into a region including the opening 91 of the frame plate 90 and an opening edge thereabout to form a molding material layer 95. Here, the conductive particles P contained in the molding material layer 95 are in a state dispersed in the molding material layer 95.

Both top force 80 and bottom force 85 in the mold respectively have molding surfaces composed of a plurality of ferromagnetic substance layers 81 or 86 formed in accordance with a pattern corresponding to a pattern of conductive parts of an anisotropically conductive elastomer sheet to be molded and non-magnetic substance layers 82 or 87 formed at other portions than the portions at which the ferromagnetic substance layers 81 or 86 have been respectively formed, and are arranged in such a manner that their corresponding ferromagnetic substance layers 81 and 86 oppose to each other.

A pair of, for example, electromagnets are then arranged on an upper surface of the top force 80 and a lower surface of the bottom force 85, and the electromagnets are operated, thereby applying a magnetic field having higher intensity at portions between ferromagnetic substance layers 81 of the top force 80 and their corresponding ferromagnetic substance layers 86 of the bottom force 85, i.e., portions to become conductive parts, than the other portions, to the molding material layer 95 in the thickness-wise direction of the molding material layer 95. As a result, the conductive particles P dispersed in the molding material layer 95 are gathered at the portions where the magnetic field having the higher intensity is applied in the molding material layer 95, i.e., the portions between the ferromagnetic substance layers 81 of the top force 80 and their corresponding ferromagnetic substance layers 86 of the bottom force 85, and further oriented so as to align in the thickness-wise direction of the molding material layer. In this state, the molding material layer 95 is subjected to a curing treatment, whereby an anisotropically conductive elastomer sheet composed of a plurality of conductive parts, in which the conductive particles P are contained in a state oriented so as to align in the thickness-wise direction, and an insulating part for mutually insulating these conductive parts is molded in a state that its peripheral edge has been supported by the opening edge about the frame plate, thereby producing an anisotropically conductive connector.

According to such an anisotropically conductive connector, it is hard to be deformed and easy to handle because the anisotropically conductive elastomer sheet is supported by the metal-made frame plate, and a positioning mark (for example, a hole) is formed in the frame plate in advance, whereby the positioning and the holding and fixing to an integrated circuit device can be easily conducted upon an electrically connecting operation to the integrated circuit device. In addition, a material low in coefficient of thermal expansion is used as a material for forming the frame plate, whereby the thermal expansion of the anisotropically conductive sheet is restrained by the frame plate, so that positional deviation between the conductive parts of the uneven distribution type anisotropically conductive elastomer sheet and electrodes to be inspected of the integrated circuit device is prevented even when they are subjected to thermal hysteresis by temperature change. As a result, a good electrically connected state can be stably retained.

By the way, in a probe test conducted for integrated circuits formed on a wafer, a method that a wafer is divided into a plurality of areas, in each of which 16 or 32 integrated circuits among a great number of integrated circuits have been formed, a probe test is collectively performed on all the integrated circuits formed in an area, and the probe test is successively performed on the integrated circuits formed in other areas has heretofore been adopted.

In recent years, there has been a demand for collectively performing a probe test on, for example, 64 or 124 integrated circuits, or all integrated circuits among a great number of integrated circuits formed on a wafer for the purpose of improving inspection efficiency and reducing inspection cost.

In a burn-in test on the other hand, it takes a long time to individually conduct electrical inspection of a great number of integrated circuit devices because each integrated circuit device that is an object of inspection is fine, and its handling is inconvenient, whereby inspection cost becomes considerably high. From such reasons, there has been proposed a WLBI (Wafer Lebel Burn-in) test in which the burn-in test is collectively performed on a great number of integrated circuits formed on a wafer in the state of the wafer.

When a wafer that is an object of inspection is of large size of, for example, at least 8 inches in diameter, and the number of electrodes to be inspected formed thereon is, for example, at least 5,000, particularly at least 10,000, however, the following problems are involved when the above-described anisotropically conductive connector is applied as a probe member for the probe test or WLBI test, since a pitch between electrodes to be inspected in each integrated circuit is extremely small.

Namely, in order to inspect a wafer having a diameter of, for example, 8 inches (about 20 cm), it is necessary to use an anisotropically conductive elastomer sheet having a diameter of about 8 inches as an anisotropically conductive connector. However, such an anisotropically conductive elastomer sheet is large in the whole area, but each conductive part is fine, and the area proportion of the surfaces of the conductive parts to the whole surface of the anisotropically conductive elastomer sheet is low. It is therefore extremely difficult to surely produce such an anisotropically conductive elastomer sheet. Accordingly, yield is extremely lowered in the production of the anisotropically conductive elastomer sheet. As a result, the production cost of the anisotropically conductive elastomer sheet increases, and in turn, the inspection cost increases.

When the above-described anisotropically conductive connector is used as a prove member for the probe test, the following problems are involved.

Particles obtained by forming a coating layer formed of a high-conductive metal, for example, gold or the like on the surfaces of core particles composed of a ferromagnetic substance, for example, nickel or the like, are generally used as the conductive particles in the anisotropically conductive elastomer sheet.

In the probe test, the method that a wafer is divided into two or more areas, and the probe test is collectively performed on integrated circuits formed in each of the divided areas is used as described above. When the probe test is performed on integrated circuits formed at a high degree of integration on a wafer having a diameter of 8 inches or 12 inches, it is required to conduct a step of an inspection process in plural times as to one wafer. Accordingly, in order to conduct the probe test on a great number of wafers, the anisotropically conductive elastomer sheet used is required to have high durability in repeated use. However, when a conventional anisotropically conductive elastomer sheet is used repeatedly over many times, core particles in conductive particles are exposed to the surface, and the conductivity of the conductive particles is markedly deteriorated. As a result, it is difficult to retain the necessary conductivity.

When the above-described anisotropically conductive connector is used as a prove member for the WLBI test, the following problems are involved.

In the WLBI test, the anisotropically conductive elastomer sheet are, at the conductive parts thereof, held with pressure by electrodes to be inspected in a wafer that is an object of inspection and inspection electrodes of the circuit board for inspection, and exposed to an high-temperature environment for a long period of time in this state. However, when the anisotropically conductive elastomer sheet is used repeatedly under such severe conditions, the ferromagnetic substance making up the core particles in the conductive particles migrates into the high-conductive metal forming the coating layer, so that the conductivity of the conductive particles is markedly deteriorated. As a result, it is difficult to retain the necessary conductivity.

In addition, the anisotropically conductive elastomer sheet are, at the conductive parts thereof, held with pressure by the electrodes to be inspected in the wafer and the inspection electrodes of the circuit board for inspection, whereby a base material forming the conductive parts is compressed in the thickness-wise direction, and deformed so as to elongate in a plain direction. As a result, the conductive particles are moved to follow the deformation of the base material, so that the chain of the conductive particles becomes a curved state. Further, when the anisotropically conductive elastomer sheet is exposed to a high-temperature environment in this state, the base material forming the conductive part greatly expands. As a result, the conductive particles are moved to follow the expansion of the base material, and so the state of the chain of the conductive particles is changed. When the anisotropically conductive elastomer sheet is used repeatedly in such WLBI test, permanent set occurs on the base material forming the conductive parts, and the chain of the conductive particles is disordered by this permanent set. As a result, it is impossible to retain the necessary conductivity.

The coefficient of linear thermal expansion of a material making up the wafer, for example, silicon is about $3.3 \times 10^{-6}$/K. On the other hand, the coefficient of linear thermal expansion of a material making up the anisotropically conductive elastomer sheet, for example, silicone rubber is about $2.2 \times 10^{-4}$/K. Accordingly, when a wafer and an anisotropically conductive elastomer sheet each having a diameter of 20 cm at 25° C. are heated from 20° C. to 120° C., a change of the wafer in diameter is only 0.0066 cm in theory, but a change of the anisotropically conductive elastomer sheet in diameter amounts to 0.44 cm.

When a great difference is created between the wafer and the anisotropically conductive elastomer sheet in the absolute quantity of thermal expansion in a plane direction as described above, it is extremely difficult to prevent positional deviation between electrodes to be inspected in the wafer and the conductive parts in the anisotropically conductive elastomer sheet upon the WLBI test even when the peripheral edge of the anisotropically conductive elastomer sheet is fixed by a frame plate having an equivalent coefficient of linear thermal expansion to the coefficient of linear thermal expansion of the wafer.

As probe members for the WLBI test, are known those in which an anisotropically conductive elastomer sheet is fixed on to a circuit board for inspection composed of, for example, a ceramic having an equivalent coefficient of linear thermal expansion to the coefficient of linear thermal expansion of the wafer (see, for example, Japanese Patent Application Laid-Open Nos. 231019/1995 and 5666/1996, etc.). In such a probe member, as means for fixing the anisotropically conductive elastomer sheet to the circuit board for inspection, a means that peripheral portions of the anisotropically conductive elastomer sheet are mechanically fixed by, for example, screws or the like, a means that it is fixed with an adhesive or the like, and the like are considered.

However, in the means that the peripheral portions of the anisotropically conductive elastomer sheet are fixed by the screws or the like, it is extremely difficult to prevent positional deviation between the electrodes to be inspected in the wafer and the conductive parts in the anisotropically conductive elastomer sheet for the same reasons as the means of fixing to the frame plate as described above.

On the other hand, in the means of fixing with the adhesive, it is necessary to apply the adhesive only to the insulating part in the anisotropically conductive elastomer sheet in order to surely achieve electrical connection to the circuit board for inspection. Since the anisotropically conductive elastomer sheet used in the WLBI test is small in the arrangement pitch of the conductive parts, and a clearance between adjacent conductive parts is small, however, it is extremely difficult in fact to do so. In the means of fixing with the adhesive also, it is impossible to replace only the anisotropically conductive elastomer sheet with a new one when the anisotropically conductive elastomer sheet suffers from trouble, and so it is necessary to replace the whole probe member including the circuit board for inspection. As a result, increase in inspection cost is incurred.

DISCLOSURE OF THE INVENTION

The present invention has been made on the basis of the foregoing circumstances and has as its first object the provision of an anisotropically conductive connector suitable for use in conducting electrical inspection of a plurality of integrated circuits formed on a wafer in a state of the wafer, by which positioning, and holding and fixing to the wafer, which is an object of inspection, can be conducted with ease even when the wafer has a large area of, for example, 8 inches or greater in diameter, and the pitch of electrodes to be inspected in the integrated circuits formed is small, and moreover good conductivity is retained, durability over repeated use is high, and long service life is achieved even when it is used repeatedly over many times.

A second object of the present invention is to provide an anisotropically conductive connector that good conductivity is retained over a long period of time, thermal durability is high, and long service life is achieved even when it is used repeatedly in a test under a high-temperature environment, in addition to the above first object.

A third object of the present invention is to provide an anisotropically conductive connector that a good electrically connected state is stably retained even with environmental changes such as thermal hysteresis by temperature change, in addition to the above objects.

A fourth object of the present invention is to provide a conductive paste composition suitable for forming an anisotropically conductive film in the above-described anisotropically conductive connectors.

A fifth object of the present invention is to provide a probe member, by which positioning, and holding and fixing to a wafer, which is an object of inspection, can be conducted with ease even when the wafer has a large area of, for example, 8 inches or greater in diameter, and the pitch of electrodes to be inspected in the integrated circuits formed is small, and moreover good conductivity is retained over a long period of time, thermal durability is high, and long service life is achieved even when it is used repeatedly under a high-temperature environment.

A sixth object of the present invention is to provide a wafer inspection apparatus and a wafer inspection method for conducting electrical inspection of a plurality of integrated circuits formed on a wafer in a state of the wafer using the above probe member.

A seventh object of the present invention is to provide an anisotropically conductive connector and a probe member, which are high in durability in repeated use when a probe test is performed on integrated circuits formed at a high degree of integration on a wafer having a diameter of 8 inches or 12 inches.

A eighth object of the present invention is to provide an anisotropically conductive connector and a probe member, which are high in durability in repeated use when an electrical inspection is performed on integrated circuits having projected electrodes, and formed at a high degree of integration on a wafer having a large area.

According to the present invention, there is thus provided an anisotropically conductive connector suitable for use in conducting electrical inspection of each of a plurality of integrated circuits formed on a wafer in a state of the wafer, which comprises:

a frame plate, in which a plurality of anisotropically conductive film-arranging holes each extending in a thickness-wise direction of the frame plate have been formed correspondingly to electrode regions, in which electrodes to be inspected have been arranged, in all or part of the integrated circuits formed on the wafer, which is an object of inspection, and a plurality of elastic anisotropically conductive films arranged in the respective anisotropically conductive film-arranging holes in this frame plate and each supported by the peripheral edge about the anisotropically conductive film-arranging hole, wherein each of the elastic anisotropically conductive films is composed of a functional part having a plurality of conductive parts for connection formed of an elastic polymeric substance, containing conductive particles exhibiting magnetism at high density and extending in the thickness-wise direction of the film, and arranged correspondingly to the electrodes to be inspected in the integrated circuits formed on the wafer, which is the object of inspection and an insulating part mutually insulating these conductive parts for connection, and a part to be supported integrally formed at a peripheral edge of the functional part and fixed to the peripheral edge about the anisotropically conductive film-arranging hole in this frame plate, and wherein the conductive particles contained in the conductive part for connection in the elastic anisotropically conductive film are obtained by coating the surfaces of core particles exhibiting magnetism with a high-conductive metal, a proportion of the high-conductive metal to the core particles is at least 15% by mass, and the thickness t of the coating layer formed of the high-conductive metal, which is calculated out in accordance with the following equation (1), is at least 50 nm:

$$t = [1/(Sw \cdot \rho)] \times [N/(1-N)] \quad \text{Equation (1)}$$

wherein t is the thickness (m) of the coating layer formed of the high-conductive metal, Sw is a BET specific surface area ($m^2/kg$) of the core particles, $\rho$ is a specific gravity ($kg/m^3$) of the high-conductive metal, and N is a value of (mass of the high-conductive metal/total mass of the conductive particles).

In the anisotropically conductive connector according to the present invention, the conductive particles may preferably have an electric resistance value R of at most 0.3 Ω as determined by the following measuring method: Electric resistance value R: an electric resistance value determined after preparing a paste composition by kneading 0.6 g of the conductive particles and 0.8 g of liquid rubber, arranging this paste composition between a pair of electrodes each having a diameter of 1 mm and arranged so as to oppose to each other with a clearance of 0.5 mm, applying a magnetic field of 0.3 T between the pair of the electrodes, and leaving the paste composition to stand in this state until the electric resistance value between the pair of the electrodes becomes stable.

In the anisotropically conductive connector according to the present invention, the conductive particles may preferably have a BET specific surface area of 10 to 500 $m^2/kg$.

In the anisotropically conductive connector according to the present invention, the coefficient of linear thermal expansion of the frame plate may preferably be at most $3 \times 10^{-5}/K$.

The elastic polymeric substance forming the elastic anisotropically conductive films may preferably be a cured product of addition type liquid silicone rubber, whose compression set is at most 10% at 150° C. and whose durometer A hardness is 10 to 60. The durometer A hardness of the elastic polymeric substance may particularly preferably be 25 to 40.

The elastic polymeric substance forming the elastic anisotropically conductive films may preferably have tear strength of at least 8 kN/m.

According to the present invention, there is also provided a conductive paste composition comprising curable liquid silicone rubber and conductive particles obtained by coating the surfaces of core particles exhibiting magnetism with a high-conductive metal, wherein a proportion of the high-conductive metal to the core particles in the conductive particles is at least 15% by mass, and the thickness t of the coating layer formed of the high-conductive metal, which is calculated out in accordance with the above-described equation, is at least 50 nm.

Such a conductive paste composition is suitable as a conductive paste composition for forming the elastic anisotropically conductive films in the anisotropically conductive connector.

According to the present invention, there is further provided a probe member suitable for use in conducting electrical inspection of each of a plurality of integrated circuits formed on a wafer in a state of the wafer, which comprises:

a circuit board for inspection, on the surface of which inspection electrodes have been formed in accordance with a pattern corresponding to a pattern of electrodes to be inspected of the integrated circuits formed on the wafer, which is an object of inspection, and the above-described anisotropically conductive connector arranged on the surface of the circuit board for inspection.

In the probe member according to the present invention, it may be preferable that the coefficient of linear thermal expansion of the frame plate in the anisotropically conductive connector be at most $3 \times 10^{-5}/K$, and the coefficient of linear thermal expansion of a base material making up the circuit board for inspection be at most $3 \times 10^{-5}/K$.

In the probe member, a sheet-like connector composed of an insulating sheet and a plurality of electrode structures each extending through in a thickness-wise direction of the insulating sheet and arranged in accordance with a pattern corresponding to the pattern of the electrodes to be inspected may be arranged on the anisotropically conductive connector.

According to the present invention, there is still further provided a wafer inspection apparatus for conducting electrical inspection of each of a plurality of integrated circuits formed on a wafer in a state of the wafer, which comprises the probe member described above, wherein electrical connection to the integrated circuits formed on the wafer, which is an object of inspection, is achieved through the probe member.

According to the present invention, there is yet still further provided a wafer inspection method comprising electrically connecting each of a plurality of integrated circuits formed on a wafer to a tester through the probe member described above to perform electrical inspection of the integrated circuits formed on the wafer.

According to the anisotropically conductive connector of the present invention, in the frame plate, a plurality of the anisotropically conductive film-arranging holes are formed correspondingly to the electrode regions, in which electrodes to be inspected have been arranged, in all or part of the integrated circuits formed on the wafer, which is the object of inspection, and the elastic anisotropically conductive film is arranged in each of the anisotropically conductive film-arranging holes, so that it is hard to be deformed and easy to handle, and the positioning and the holding and fixing to the wafer can be easily conducted in an electrically connecting operation to the wafer.

Since the proportion of the high-conductive metal to the core particles in the conductive particles contained in the conductive parts for connection in the elastic anisotropically conductive film is at least 15% by mass, and the thickness t of the coating layer formed of the high-conductive metal is at least 50 nm, the core particles in the conductive particles are prevented from being exposed to the surface even when the anisotropically conductive connector is used repeatedly over many times. As a result, the necessary conductivity is surely retained.

Even when the material making up the core particles in the conductive particles migrates into the high-conductive metal when the anisotropically conductive connector is used repeatedly under a high-temperature environment, it is prevented to markedly deteriorate the conductivity of the conductive particles because the high-conductive metal exists in a high proportion on the surfaces of the conductive particles.

The cured product of addition type liquid silicone rubber, whose compression set is at most 10% at 150° C. and whose durometer A hardness is 10 to 60, is used as the elastic polymeric substance forming the elastic anisotropically conductive films, whereby it is inhibited to cause permanent set on the conductive parts for connection even when the anisotropically conductive connector is used repeatedly over many times, thereby inhibiting the chain of the conductive particles in the conductive part for connection from being disordered. As a result, the necessary conductivity is more surely retained.

That having a durometer A hardness of 25 to 40 is used as the elastic polymeric substance forming the elastic anisotropically conductive films, whereby it is inhibited to cause permanent set on the conductive parts for connection even when the anisotropically conductive connector is used repeatedly in a test under a high-temperature environment, thereby inhibiting the chain of the conductive particles in the conductive part for connection from being disordered. As a result, the necessary conductivity is surely retained over a long period of time.

Since the elastic anisotropically conductive film arranged in each of the anisotropically conductive film-arranging holes in the frame plate may be small in area, the individual elastic anisotropically conductive films are easy to be formed. In addition, since the elastic anisotropically conductive film small in area is little in the absolute quantity of thermal expansion in a plane direction of the elastic anisotropically conductive film even when it is subjected to thermal hysteresis, the thermal expansion of the elastic anisotropically conductive film in the plane direction is surely restrained by the frame plate by using a material having a low coefficient of linear thermal expansion as that for forming the frame plate. Accordingly, a good electrically connected state can be stably retained even when the WLBI test is performed on a large-area wafer.

DESCRIPTION OF CHARACTERS

1 Probe member, 2 Anisotropically conductive connector,
3 Pressurizing plate, 4 Wafer mounting table,
5 Heater, 6 Wafer, 7 Electrodes to be inspected,
10 Frame plate,
11 Anisotropically conductive film-arranging holes,
15 Air circulating holes, 16 Positioning holes,
20 Elastic anisotropically conductive films,
20A Molding material layers, 21 Functional parts,
22 Conductive parts for connection,
23 Insulating part, 24 Projected parts,
25 Parts to be supported,
26 Conductive parts for non-connection,
27 Projected parts,
30 Circuit board for inspection,
31 Inspection electrodes,
41 Insulating sheet, 40 Sheet-like connector,
42 Electrode structures, 43 Front-surface electrode parts,
44 Back-surface electrode parts, 45 Short circuit parts,
50 Chamber, 51 Evacuation pipe, 55 O-rings,
60 Mold, 61 Top force, 62 Base plate,
63 Ferromagnetic substance layers,
64 Non-magnetic substance layers, 64a Recessed parts,
65 Bottom force, 66 Base plate,
67 Ferromagnetic substance layers,
68 Non-magnetic substance layers, 68a Recessed parts,
69a, 69b Spacers, 71 Cell, 72 Side wall material,
73 Lid material, 73H Through-hole,
74 Magnet, 75 Electrode part,
76 Electric resistance meter,
80 Top force, 81 Ferromagnetic substance layers,
82 Non-magnetic substance layers,
85 Bottom force, 86 Ferromagnetic substance layers,
87 Non-magnetic substance layers,
90 Frame plate, 91 Opening, 95 Molding material layer
P Conductive particles.

BEST MODE FOR CARRYING OUT THE INVENTION

The embodiments of the present invention will hereinafter be described in details.

[Anisotropically Conductive Connector]

Figure 1:
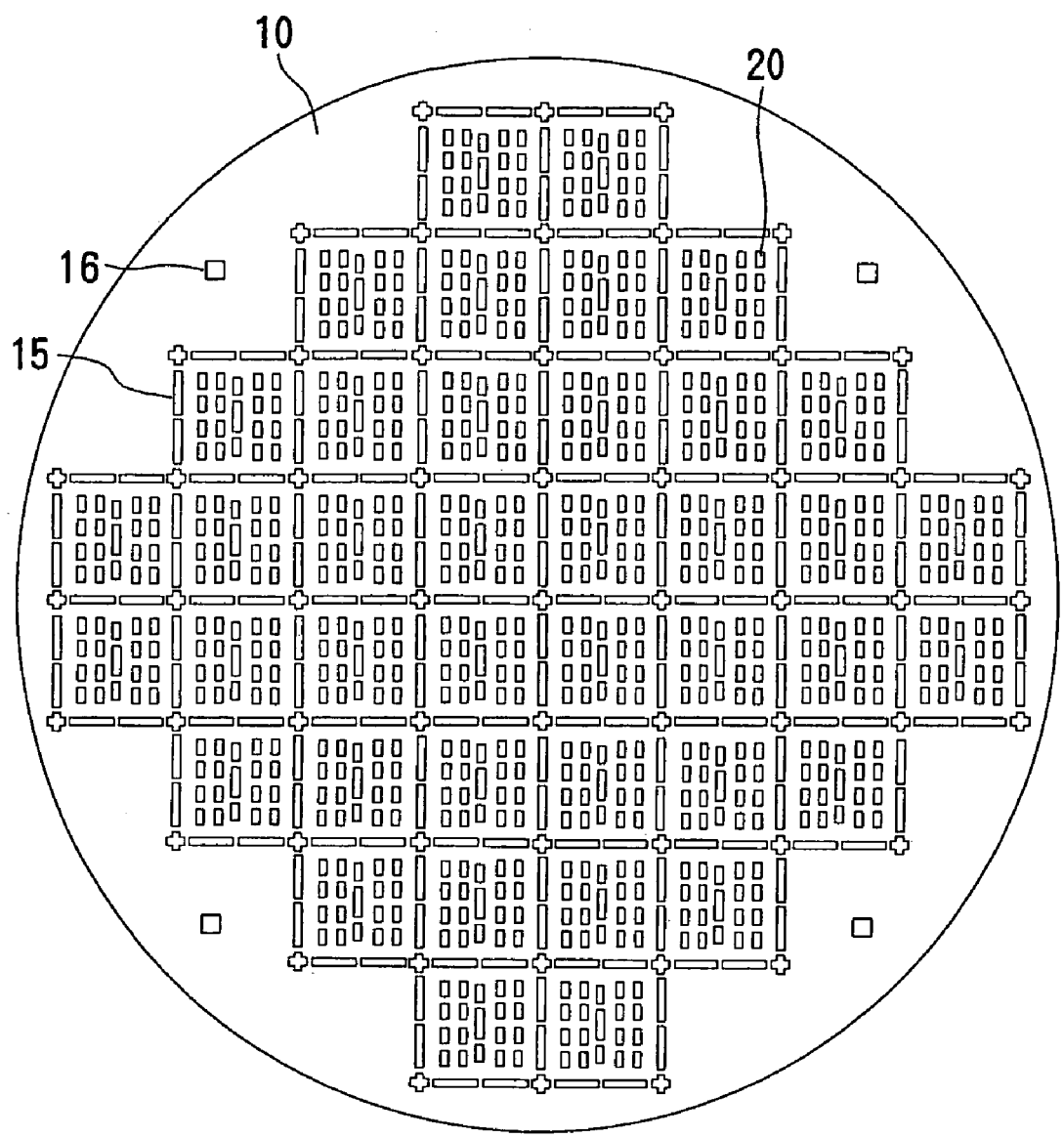
FIG. 1 is a plan view illustrating an exemplary anisotropically conductive connector according to the present invention.
Figure 2:
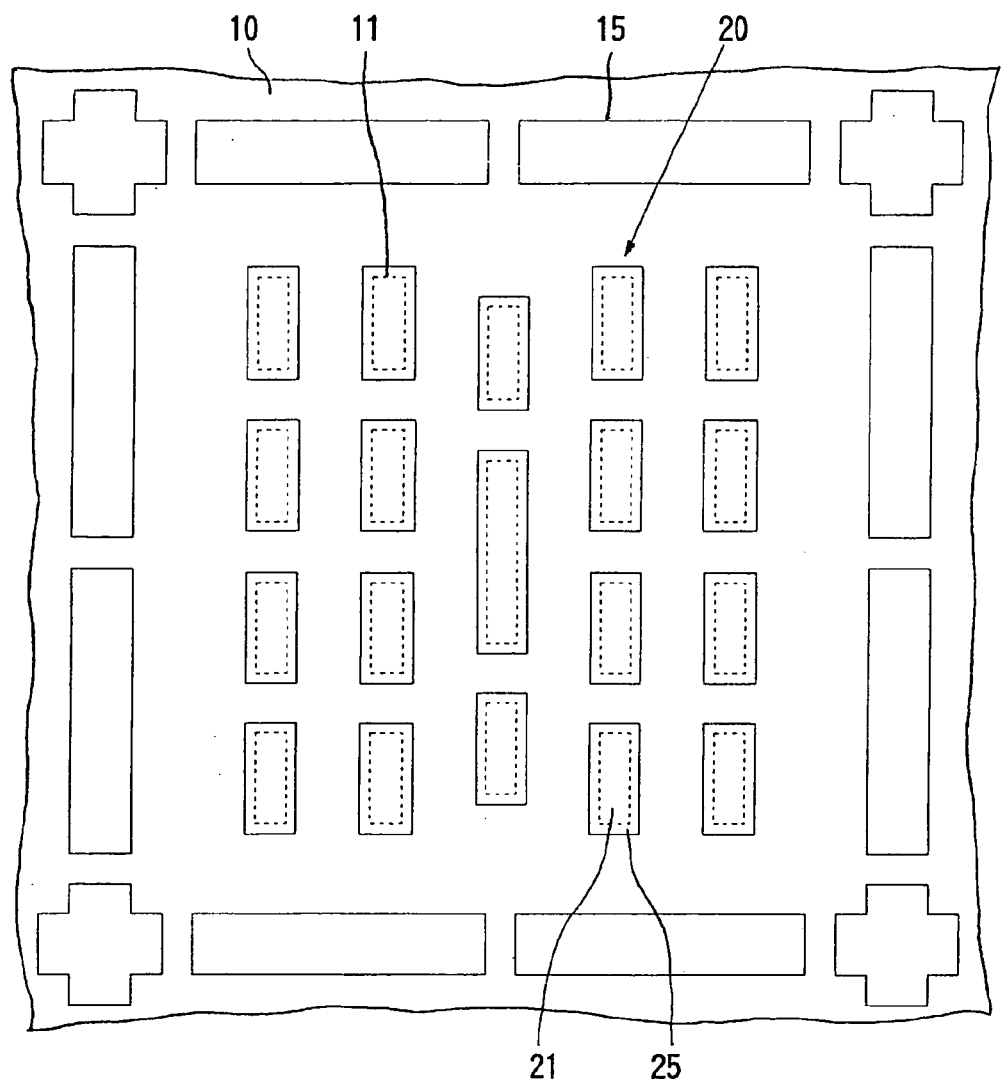
FIG. 2 is a plan view illustrating, on an enlarged scale, a part of the anisotropically conductive connector shown in FIG. 1.
Figure 3:
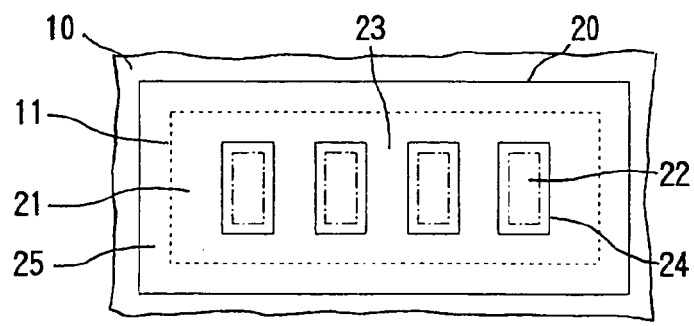
FIG. 3 is a plan view illustrating, on an enlarged scale, an elastic anisotropically conductive film in the anisotropically conductive connector shown in FIG. 1.
Figure 4:
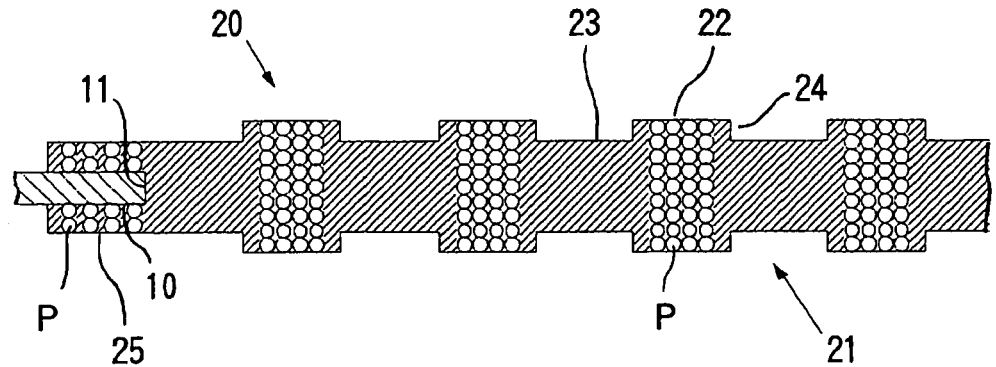
FIG. 4 is a cross-sectional view illustrating, on an enlarged scale, the elastic anisotropically conductive film in the anisotropically conductive connector shown in FIG. 1.

FIG. 1 is a plan view illustrating an exemplary anisotropically conductive connector according to the present invention, FIG. 2 is a plan view illustrating, on an enlarged scale, a part of the anisotropically conductive connector shown in FIG. 1, FIG. 3 is a plan view illustrating, on an enlarged scale, an elastic anisotropically conductive film in the anisotropically conductive connector shown in FIG. 1, and FIG. 4 is a cross-sectional view illustrating, on an enlarged scale, the elastic anisotropically conductive film in the anisotropically conductive connector shown in FIG. 1.

The anisotropically conductive connector shown in FIG. 1 is that used in conducting electrical inspection of each of, for example, a plurality of integrated circuits formed on a wafer in a state of the wafer and has a frame plate 10 in which a plurality of anisotropically conductive film-arranging holes 11 (indicated by broken lines) each extending through in the thickness-wise direction of the frame plate have been formed as illustrated in FIG. 2. The anisotropically conductive film-arranging holes 11 in this frame plate 10 are formed in accordance with electrode regions, in which electrodes to be inspected have been formed, in all the integrated circuits formed on the wafer that is an object of inspection. Elastic anisotropically conductive films 20 having conductivity in the thickness-wise direction are arranged in the respective anisotropically conductive film-arranging holes 11 in the frame plate 10 in a state they are each supported by the peripheral edge about the anisotropically conductive film-arranging hole 11 in the frame plate 10 and in a state independent of adjacent anisotropically conductive films 20. In the frame plate 10 of this embodiment are formed air circulating holes 15 for circulating air between the anisotropically conductive connector and a member adjacent thereto when a pressurizing means of a pressure reducing system is used in a wafer inspection apparatus, which will be described subsequently. In addition, positioning holes 16 for positioning to the wafer, which is the object of inspection, and a circuit board for inspection are formed.

Each of the elastic anisotropically conductive films 20 is formed by an elastic polymeric substance and, as illustrated in FIG. 3, has a functional part 21 composed of a plurality of conductive parts 22 for connection each extending in the thickness-wise direction (direction perpendicular to the paper in FIG. 3) of the film and an insulating part 23 formed around the respective conductive parts 22 for connection and mutually insulating these conductive parts 22 for connection. The functional part 21 is arranged so as to be located in the anisotropically conductive film-arranging hole 11 in the frame plate 10. The conductive parts 22 for connection in the functional part 21 are arranged in accordance with a pattern corresponding to a pattern of the electrodes to be inspected in the integrated circuit formed on the wafer, which is the object of inspection, and electrically connected to the electrodes to be inspected in the inspection of the wafer.

At a peripheral edge of the functional part 21, a part 25 to be supported, which has been fixed to and supported by the periphery about the anisotropically conductive film-arranging hole 11 in the frame plate 10, is formed integrally and continuously with the functional part 21. More specifically, the part 25 to be supported in this embodiment is shaped in a forked form and fixed and supported in a closely contacted state so as to grasp the periphery about the anisotropically conductive film-arranging hole 11 in the frame plate 10.

In the conductive parts 22 for connection in the functional part 21 of the elastic anisotropically conductive film 20, conductive particles P exhibiting magnetism are contained at a high density in a state oriented so as to align in the thickness-wise direction as illustrated in FIG. 4. On the other hand, the insulating part 23 does not contain the conductive particles P at all or scarcely contain them. In this embodiment, the part 25 to be supported in the elastic anisotropically conductive film 20 contains the conductive particles P.

In the embodiment illustrated, projected parts 24 protruding from other surfaces than portions, at which the conductive parts 22 for connection and peripheries thereof are located, are formed at those portions on both sides of the functional part 21 in the elastic anisotropically conductive film 20.

The thickness of the frame plate 10 varies according to the material thereof, but is preferably 25 to 600 μm, more preferably 40 to 400 μm.

If this thickness is smaller than 25 μm, the strength required upon use of the resulting anisotropically conductive connector is not achieved, and the anisotropically conductive connector tends to be low in the durability. In addition, such stiffness as the form of the frame plate is retained is not achieved, and the handling property of the anisotropically conductive connector becomes low. If the thickness exceeds 600 μm on the other hand, the elastic anisotropically conductive films 20 formed in the anisotropically conductive film-arranging holes 11 become too great in thickness, and it may be difficult in some cases to achieve good conductivity in the conductive parts 22 for connection and insulating property between adjacent conductive parts 22 for connection.

The form and size in a plane direction of the anisotropically conductive film-arranging holes 11 in the frame plate 10 are designed according to the size, pitch and pattern of electrodes to be inspected in a wafer that is an object of inspection.

No particular limitation is imposed on a material for forming the frame plate 10 so far as it has such stiffness as the resulting frame plate 10 is hard to be deformed, and the form thereof is stably retained. For example, various kinds of materials such as metallic materials, ceramic materials and resin materials may be used. When the frame plate 10 is formed by, for example, a metallic material, an insulating film may be formed on the surface of the frame plate 10.

Specific examples of the metallic material for forming the frame plate 10 include metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals.

Specific examples of the resin material forming the frame plate 10 include liquid crystal polymers and polyimide resins.

The frame plate 10 may preferably exhibit magnetism at least at the peripheral portion about the anisotropically conductive film-arranging holes 11 thereof, i.e., a portion supporting the elastic anisotropically conductive film 20 in that the conductive particles P can be caused to be contained with ease in the part 25 to be supported in the elastic anisotropically conductive film 20 by a process which will be described subsequently. Specifically, this portion may preferably have a saturation magnetization of at least 0.1 Wb/m$^2$. In particular, the whole frame plate 10 may preferably be formed by a magnetic substance in that the frame plate 10 is easy to be produced.

Specific examples of the magnetic substance forming such a frame plate 10 include iron, nickel, cobalt, alloys of these magnetic metals, and alloys or alloy steels of these magnetic metals with any other metal.

When the anisotropically conductive connector is used in the WLBI test, it is preferable to use a material having a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K as a material for forming the frame plate 10.

Specific examples of such a material include invar alloys such as invar, Elinvar alloys such as Elinvar, and alloys or alloy steels of magnetic metals, such as superinvar, covar and 42 alloy.

The overall thickness (thickness of the conductive part 22 for connection in the illustrated embodiment) of the elastic anisotropically conductive film 20 is preferably 50 to 2,000 μm, more preferably 70 to 1,000 μm, particularly preferably 80 to 500 μm. When this thickness is 50 μm or greater, an elastic anisotropically conductive film 20 having sufficient strength is provided with certainty. When this thickness is 2,000 μm or smaller on the other hand, conductive parts 22 for connection having necessary conductive properties are provided with certainty.

The projected height of each projected part 24 is preferably at least 10% in total of the thickness in the projected part 24, more preferably at least 20%. Projected parts 24 having such a projected height are formed, whereby the conductive parts 22 for connection are sufficiently compressed by small pressurizing force, so that good conductivity is surely achieved.

The projected height of the projected part 24 is preferably at most 100%, more preferably at most 70% of the shortest width or diameter of the projected part 24. Projected parts 24 having such a projected height are formed, whereby the projected parts are not buckled when they are pressurized, so that the prescribed conductivity is surely achieved.

The thickness (thickness of one of the forked portions in the illustrated embodiment) of the part 25 to be supported is preferably 5 to 250 μm, more preferably 10 to 150 μm, particularly preferably 15 to 100 μm.

It is not essential to form the part 25 to be supported in the forked form, and it may be fixed to only one surface of the frame plate 10.

The elastic polymeric substance forming the elastic anisotropically conductive films 20 is preferably a heat-resistant polymeric substance having a crosslinked structure. Various materials may be used as curable polymeric substance-forming materials usable for obtaining such a crosslinked polymeric substance. However, liquid silicone rubber is preferred.

The liquid silicone rubber may be any of addition type and condensation type. However, the addition type liquid silicone rubber is preferred. This addition type liquid silicone rubber is that cured by a reaction of a vinyl group with an Si—H bond and includes a one-pack type (one-component type) composed of polysiloxane having both vinyl group and Si—H bond and a two-pack type (two-component type) composed of polysiloxane having a vinyl group and polysiloxane having an Si—H bond. In the present invention, addition type liquid silicone rubber of the two-pack type is preferably used.

As the addition type liquid silicone rubber, is used that having a viscosity of preferably 100 to 1,250 Pa·s, more preferably 150 to 800 Pa·s, particularly preferably 250 to 500 Pa·s at 23° C. If this viscosity is lower than 100 Pa·s, precipitation of the conductive particles in such addition type liquid silicone rubber is easy to occur in a molding material for obtaining the elastic anisotropically conductive films 20, which will be described subsequently, so that good storage stability is not obtained. In addition, the conductive particles are not oriented so as to align in the thickness-wise direction of the molding material layer when a parallel magnetic field is applied to the molding material layer, so that it may be difficult in some cases to form chains of the conductive particles in an even state. If this viscosity exceeds 1,250 Pa·s on the other hand, the viscosity of the resulting molding material becomes too high, so that it may be difficult in some cases to form the molding material layer in the mold. In addition, the conductive particles are not sufficiently moved even when a parallel magnetic field is applied to the molding material layer. Therefore, it may be difficult in some cases to orient the conductive particles so as to align in the thickness-wise direction.

The viscosity of such addition type liquid silicone rubber can be measured by means of a Brookfield type viscometer.

When the elastic anisotropically conductive films 20 are formed by a cured product (hereinafter referred to as "cured silicone rubber") of the liquid silicone rubber, the cured silicone rubber preferably has a compression set of at most 10%, more preferably at most 8%, still more preferably at most 6% at 150° C. If the compression set exceeds 10%, the conductive parts 22 for connection tend to cause permanent set when the resulting anisotropically conductive connector is used repeatedly over many times or used repeatedly under a high-temperature environment, whereby chains of the conductive particles P in the conductive part 22 for connection are disordered. As a result, it is difficult to retain the necessary conductivity.

In the present invention, the compression set of the cured silicone rubber can be measured by a method in accordance with JIS K 6249.

The cured silicone rubber forming the elastic anisotropically conductive films 20 preferably has a durometer A hardness of 10 to 60, more preferably 15 to 60, particularly preferably 20 to 60 at 23° C. If the durometer A hardness is lower than 10, the insulating part 23 mutually insulating the conductive parts 22 for connection is easily over-distorted when pressurized, and it may be difficult in some cases to retain the necessary insulating property between the conductive parts 22 for connection. If the durometer A hardness exceeds 60 on the other hand, pressurizing force of a considerably heavy load is required for giving proper distortion to the conductive parts 22 for connection, so that, for example, a wafer, which is an object of inspection, tends to cause great deformation or breakage.

Further, if that having a durometer A hardness outside the above range is used as the cured silicone rubber, the conductive parts 22 for connection tend to cause permanent set when the resulting anisotropically conductive connector is used repeatedly over many times, whereby chains of the conductive particles in the conductive part 22 for connection are disordered. As a result, it is difficult to retain the necessary conductivity.

When the anisotropically conductive connector is used in a test under a high-temperature environment, for example, a WLBI test, the cured silicone rubber for forming the elastic anisotropically conductive films 20 preferably has a durometer A hardness of 25 to 40 at 23° C.

If that having a durometer A hardness outside the above range is used as the cured silicone rubber, the conductive parts 22 for connection tend to cause permanent set when the resulting anisotropically conductive connector is used repeatedly in a test under a high-temperature environment, whereby chains of the conductive particles in the conductive part 22 for connection are disordered. As a result, it is difficult to retain the necessary conductivity.

In the present invention, the durometer A hardness of the cured silicone rubber can be measured by a method in accordance with JIS K 6249.

Further, the cured silicone rubber for forming the elastic anisotropically conductive films 20 preferably has tear strength of at least 8 kN/m, more preferably at least 10 kN/m, still more preferably at least 15 kN/m, particularly preferably at least 20 kN/m at 23° C. If the tear strength is lower than 8 kN/m, the resulting elastic anisotropically conductive films 20 tend to deteriorate durability when they are distorted in excess.

In the present invention, the tear strength of the cured silicone rubber can be measured by a method in accordance with JIS K 6249.

As the addition type liquid silicone rubber having such properties, may be used that marketed as liquid silicone rubber "KE2000" series or "KE1950" series from Shin-Etsu Chemical Co., Ltd.

In the present invention, a proper curing catalyst may be used for curing the addition type liquid silicone rubber. As such a curing catalyst, may be used a platinum-containing catalyst. Specific examples thereof include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite and platinum, acetyl acetate platinum chelates, and cyclic diene-platinum complexes.

The amount of the curing catalyst used is suitably selected in view of the kind of the curing catalyst and other curing treatment conditions. However, it is generally 3 to 15 parts by weight per 100 parts by weight of the addition type liquid silicone rubber.

In order to improve the thixotropic property of the addition type liquid silicone rubber, adjust the viscosity, improve the dispersion stability of the conductive particles or provide a base material having high strength, a general inorganic filler such as silica powder, colloidal silica, aerogel silica or alumina may be contained in the addition type liquid silicone rubber as needed.

No particular limitation is imposed on the amount of such an inorganic filler used. However, the use in a too large amount is not preferred because the orientation of the conductive particles P by a magnetic field cannot be sufficiently achieved.

As the conductive particles P contained in the conductive parts 22 for connection and the parts 25 to be supported in each of the elastic anisotropically conductive films 20, may preferably be used particles obtained by coating the surfaces of core particles (hereinafter also referred to as "magnetic core particles") exhibiting magnetism with a high-conductive metal.

The magnetic core particles for obtaining the conductive particles P preferably have a number average particle diameter of 3 to 40 µm.

The number average particle diameter of the magnetic core particles means a value measured by a laser diffraction scattering method.

When the number average particle diameter is 3 µm or greater, conductive parts 22 for connection, which are easy to be deformed under pressure, low in resistance value and high in connection reliability can be easily obtained. When the number average particle diameter is 40 µm or smaller on the other hand, fine conductive parts 22 for connection can be easily formed, and the resultant conductive parts 22 for connection tend to have stable conductivity.

Further, the magnetic core particles preferably have a BET specific surface area of 10 to 500 $m^2/kg$, more preferably 20 to 500 $m^2/kg$, particularly preferably 50 to 400 $m^2/kg$.

When the BET specific surface area is 10 $m^2/kg$ or greater, plating can be surely conducted on such magnetic core particles in a required amount because the magnetic core particles have a sufficiently wide area capable of being plated. Accordingly, conductive particles P high in conductivity can be obtained, and stable and high conductivity is achieved because a contact area between the conductive particles P is sufficiently wide. When the BET specific surface area is 500 m²/kg or smaller on the other hand, such magnetic core particles do not become brittle, so that they do not break when physical stress is applied, and stable and high conductivity is retained.

Further, the magnetic core particles preferably have a coefficient of variation of particle diameter of at most 50%, more preferably at most 40%, still more preferably at most 30%, particularly preferably at most 20%.

In the present invention, the coefficient of variation of particle diameter is a value determined in accordance with the expression: $(\sigma/Dn) \times 100$, wherein $\sigma$ is a standard deviation value of the particle diameter, and $Dn$ is a number average particle diameter of the particles.

When the coefficient of variation of particle diameter is 50% or lower, conductive parts 22 for connection, which are narrow in scatter of conductivity, can be formed because the uniformity of particle diameter is high.

As a material for forming the magnetic core particles, may be used iron, nickel, cobalt, a material obtained by coating such a metal with copper or a resin, or the like. Those having a saturation magnetization of at least 0.1 Wb/m² may be preferably used. The saturation magnetization thereof is more preferably at least 0.3 Wb/m², particularly preferably at least 0.5 Wb/m². Specific examples of the material include iron, nickel, cobalt and alloys thereof.

When this saturation magnetization is at least 0.1 Wb/m², the conductive particles P can be easily moved in the molding material layers for forming the elastic anisotropically conductive films 20 by a process, which will be described subsequently, whereby the conductive particles P can be surely moved to portions to become conductive parts for connection in the respective molding material layers to form chains of the conductive particles P.

The conductive particles P used for obtaining the conductive parts 22 for connection are those obtained by coating surfaces of the magnetic core particles with a high-conductive metal.

The term "high-conductive metal" as used herein means a metal having an electric conductivity of at least $5 \times 10^6$ $\Omega^{-1} m^{-1}$ at 0° C.

As such a high-conductive metal, may be used gold, silver, rhodium, platinum, chromium or the like. Among these, gold is preferably used in that it is chemically stable and has a high electric conductivity.

In the conductive particles P, a proportion [(mass of high-conductive metal/mass of core particles)×100] of the high-conductive metal to the core particles is at least 15% by mass, preferably 25 to 35% by mass.

If the proportion of the high-conductive metal is lower than 15% by mass, the conductivity of such conductive particles P is markedly deteriorated when the resulting anisotropically conductive connector is used repeatedly under a high-temperature environment. As a result, the necessary conductivity cannot be retained.

In the conductive particles P, the thickness t of the coating layer formed of the high-conductive metal, which is calculated out in accordance with the following equation (1), is at least 50 nm, preferably 100 to 200 nm:

$$t = [1/(Sw \cdot \rho)] \times [N/(1-N)] \qquad \text{Equation (1)}$$

wherein t is the thickness (m) of the coating layer formed of the high-conductive metal, Sw is a BET specific surface area (m²/kg) of the core particles, $\rho$ is a specific gravity (kg/m³) of the high-conductive metal, and N is a value of (weight of the high-conductive metal/total weight of the conductive particles).

The above-described equation is derived in the following manner.

(i) Supposing that the weight of the magnetic core particles is Mp (kg), the surface area S (m²) of the magnetic core particles is determined by:

$$S = Sw \cdot Mp \qquad \text{Equation (2)}$$

(ii) Supposing that the weight of the coating layer formed of the high-conductive metal is m (kg), the volume (V) of the coating layer is determined by:

$$V = m/\rho \qquad \text{Equation (3)}$$

(iii) Assuming that the thickness of the coating layer is uniform over all the surfaces of the conductive particles, $t = V/S$. When the equations (2) and (3) are substituted into this equation, the thickness t of the coating layer is determined by:

$$t = (m/\rho)/(Sw \cdot Mp) = m/(Sw \cdot \rho \cdot Mp) \qquad \text{Equation (4)}$$

(iv) Since N is a ratio of the mass of the coating layer to the total mass of the conductive particles, the value of N is determined by:

$$N = m/(Mp+m) \qquad \text{Equation (5)}$$

(v) A numerator and a denominator in the right side of the equation (5) are divided by Mp to give $N = (m/Mp)/(1+m/Mp)$. Multiply both sides by $(1+m/Mp)$, and the product is $N(1+m/Mp) = m/Mp$, and in its turn, $N + N(m/Mp) = m/Mp$ When $N(m/Mp)$ is shifted to the right side, $N = m/Mp - N(m/Mp) = (m/Mp)(1-N)$ is given. Divide both sides by $(1-N)$, and $N/(1-N) = m/Mp$ is given.

Accordingly, the weight Mp of the magnetic core particles is determined by:

$$Mp = m/[N/(1-N)] = m(1-N)/N \qquad \text{Equation (6)}$$

(vi) The equation (6) is substituted into the equation (4) to derive $t = 1/[Sw \cdot \rho \cdot (1-N)/N] = [1/(Sw \cdot \rho)] \times [N/(1-N)]$.

When this thickness t of the coating layer is at least 50 nm, the conductivity of such conductive particles P is not markedly lowered because the high-conductive metal exists in a high proportion on the surfaces of the conductive particles P even when the ferromagnetic substance forming the magnetic core particles migrates into the high-conductive metal forming the coating layer in the case where the resulting anisotropically conductive connector is used repeatedly under a high-temperature environment. Thus, the prescribed conductivity is retained.

The BET specific surface area of the conductive particles P is preferably 10 to 500 m²/kg.

When this BET specific surface area is 10 m²/kg or greater, the surface area of the coating layer becomes sufficiently great, so that the coating layer great in the total weight of the high-conductive metal can be formed. Accordingly, particles high in conductivity can be obtained. In addition, stable and high conductivity can be achieved because a contact area among the conductive particles P is sufficiently wide. When this BET specific surface area is 500 m²/kg or smaller on the other hand, such conductive particles do not become brittle, and thus they do not break when physical stress is applied thereto, and the stable and high conductivity is retained.

The number average particle diameter of the conductive particles P is preferably 3 to 40 µm, more preferably 6 to 25 µm.

When such conductive particles P are used, the resulting elastic anisotropically conductive films 20 become easy to be deformed under pressure. In addition, sufficient electrical connection is achieved between the conductive particles P in the conductive parts 22 for connection in the elastic anisotropically conductive films 20.

No particular limitation is imposed on the form of the conductive particles P. However, they are preferably in the form of a sphere or star, or a mass of secondary particles obtained by agglomerating these particles in that these particles can be easily dispersed in the polymeric substance-forming material.

The conductive particles P preferably have an electric resistance value R, which will be described subsequently, of at most 0.3 Ω, more preferably at most 0.1 Ω.

Electric Resistance Value R

The electric resistance value is a value determined after preparing a paste composition by kneading 0.6 g of the conductive particles and 0.8 g of liquid rubber, arranging this paste composition between a pair of electrodes arranged so as to oppose to each other with a clearance of 0.5 mm and each having a diameter of 1 mm, applying a magnetic field of 0.3 T between the pair of the electrodes, and leaving the electrodes to stand in this state until the electric resistance value between the pair of the electrodes becomes stable.

Specifically, the electric resistance value R is measured in the following manner.

Figure 5:
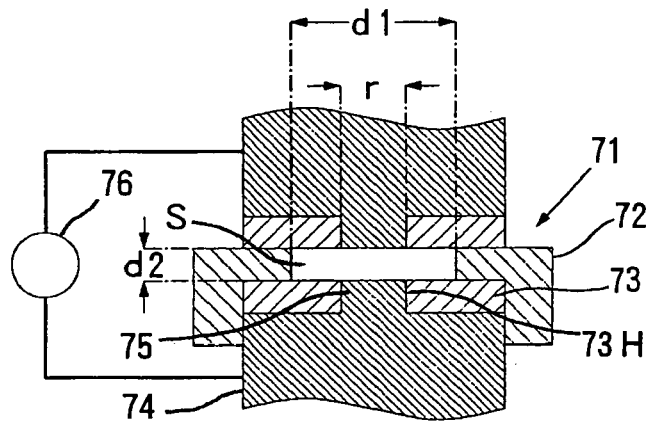
FIG. 5 is a cross-sectional view illustrating the construction of an apparatus for measuring an electric resistance value R.

FIG. 5 illustrates an apparatus for measuring an electric resistance value R. Reference numeral 71 indicates a ceramic cell in which a sample chamber S is formed, and the cell is constructed by a cylindrical side wall material 72 and a pair of lid members 73 each having a through-hole 73H at its center. Reference numeral 74 designates a pair of conductive magnets each having an electrode part 75, which is in the form protruding from the surface thereof, and fitted to the through-hole 73H in the lid member 73. Each magnet is fixed to the lid member 73 in a state that the electrode part 75 has been fitted into the through-hole 73H in the lid member 73. Reference numeral 76 indicates an electric resistance meter connected to each of the pair of the magnets 74. The sample chamber S of the cell 71 is in the form of a disk having a diameter d1 of 3 mm and a thickness d2 of 0.5 mm, and the inner diameter of the through-hole 73H in the lid member 73, i.e., the diameter r of the electrode part 75 of the magnet 74 is 1 mm.

The paste composition described above is filled into the sample chamber S of the cell 71, and an electric resistance value between the electrodes 75 of the magnets 74 is measured by the electric resistance meter 76 while applying a parallel magnetic field of 0.3 T between the electrodes 75 of the magnets 74 in the thickness-wise direction of the sample chamber S. As a result, the conductive particles dispersed in the paste composition are gathered between the electrodes 75 of the magnets 74 by the effect of the parallel magnetic field and oriented so as to align in the thickness-wise direction. With the movement of the conductive particles, the electric resistance value between the electrodes 75 of the magnets 74 lowers and then becomes a stable state, thereby measuring an electric resistance value at this time. The time from the time the parallel magnetic field has been applied to the paste composition up to the time the electric resistance value between the electrodes 75 of the magnets 74 has reached the stable state varies according to the kind of the conductive particles. However, an electric resistance value after 500 seconds have elapsed from the application of the parallel magnetic field to the paste composition is generally measured as the electric resistance value R.

When the electric resistance value R is at most 0.3 Ω, conductive parts 22 for connection having high conductivity can be surely obtained.

The content of water in the conductive particles P is preferably at most 5% by mass, more preferably at most 3% by mass, still more preferably at most 2% by mass, particularly preferably at most 1% by mass. By satisfying such conditions, bubbling can be prevented or inhibited upon the curing treatment in the preparation of the molding material or the formation of the elastic anisotropically conductive films 20.

The conductive particles P may be those obtained by treating surfaces thereof with a coupling agent such as a silane coupling agent. By treating the surfaces of the conductive particles P with the coupling agent, the adhesion property of the conductive particles P to the elastic polymeric substance is enhanced. As a result, the resulting elastic anisotropically conductive films 20 become high in durability upon repeated use.

The amount of the coupling agent used is suitably selected within limits not affecting the conductivity of the conductive particles P. However, it is preferably such an amount that a coating rate (proportion of an area coated with the coupling agent to the surface area of the conductive particles) of the coupling agent on the surfaces of the conductive particles P amounts to at least 5%, more preferably 7 to 100%, still more preferably 10 to 100%, particularly preferably 20 to 100%.

Such conductive particles P may be obtained in accordance with, for example, the following process.

Particles are first formed from a ferromagnetic material in accordance with a method known per se in the art, or commercially available particles of a ferromagnetic substance are provided. The particles are subjected to a classifying treatment to prepare magnetic core particles having a necessary particle diameter.

In the present invention, the classification treatment of the particles can be conducted by means of, for example, a classifier such as an air classifier or sonic classifier.

Specific conditions for the classification treatment are suitably preset according to the intended number average particle diameter of the magnetic core particles, the kind of the classifier, and the like.

Surfaces of the magnetic core particles are then treated with an acid and further washed with, for example, purified water, thereby removing impurities such as dirt, foreign matter and oxidized films present on the surfaces of the magnetic core particles. Thereafter, the surfaces of the magnetic core particles are coated with a high-conductive metal, thereby obtaining conductive particles.

As the acid used for treating the surfaces of the magnetic core particles, may be mentioned hydrochloric acid or the like.

As a method for coating the surfaces of the magnetic core particles with the high-conductive metal, may be used electroless plating, displacement plating or the like. However, the method is not limited to these methods.

A process for producing the conductive particles by the electroless plating or displacement plating will be described. The magnetic core particles subjected to the acid treatment and washing treatment are first added to a plating solution to prepare a slurry, and electroless plating or displacement plating on the magnetic core particles is conducted while stirring the slurry. The particles in the slurry are then separated from the plating solution. Thereafter, the particles separated are subjected to a washing treatment with, for example, purified water, thereby obtaining conductive particles with the surfaces of the magnetic core particles coated with the high-conductive metal.

Alternatively, primer plating may be conducted on the surfaces of the magnetic core particles to form a primer plating layer, and a plating layer formed of the high-conductive metal may be then formed on the surface of the primer plating layer. No particular limitation is imposed on the process for forming the primer plating layer and the plating layer formed thereon. However, it is preferable to form the primer plating layer on the surfaces of the magnetic core particles by the electroless plating and then form the plating layer formed of the high-conductive metal on the surface of the primer plating layer by the displacement plating.

No particular limitation is imposed on the plating solution used in the electroless plating or displacement plating, and various kinds of commercially available plating solutions may be used.

Since conductive particles having a great particle diameter may be produced due to aggregation of the magnetic core particles upon the coating of the surfaces of the particles with the high-conductive metal, the resultant conductive particles are preferably subjected to a classification treatment as needed. By the classification treatment, the conductive particles having the expected particle diameter can be surely obtained.

As examples of a classifier used for conducting the classification treatment of the conductive particles, may be mentioned those exemplified as the classifier used in the classification treatment for preparing the magnetic core particles.

The proportion of the conductive particles P contained in the conductive parts 22 for connection in the functional part 21 is preferably 10 to 60%, more preferably 15 to 50% in terms of volume fraction. If this proportion is lower than 10%, it may be impossible in some cases to obtain conductive parts 22 for connection sufficiently low in electric resistance value. If this proportion exceeds 60% on the other hand, the resulting conductive parts 22 for connection are liable to be brittle, so that elasticity required of the conductive parts 22 for connection may not be achieved in some cases.

The proportion of the conductive particles P contained in the parts 25 to be supported varies according to the content of the conductive particles in the molding material for forming the elastic anisotropically conductive films 20. However, it is preferably equivalent to or more than the proportion of the conductive particles contained in the molding material in that the conductive particles P are surely prevented from being contained in excess in the conductive parts 22 for connection located most outside among the conductive parts 22 for connection in the elastic anisotropically conductive film 20. It is also preferably at most 30% in terms of volume fraction in that parts 25 to be supported having sufficient strength are provided.

The anisotropically conductive connector described above may be produced, for example, in the following manner.

A frame plate 10 composed of a magnetic metal, in which anisotropically conductive film-arranging holes 11 have been formed correspondingly to electrode regions, in which electrodes to be inspected have been arranged, in all integrated circuits formed on a wafer that is an object of inspection, is first produced. As a method for forming the anisotropically conductive film-arranging holes 11 in the frame plate 10, may be used, for example, an etching method or the like.

Figure 6:
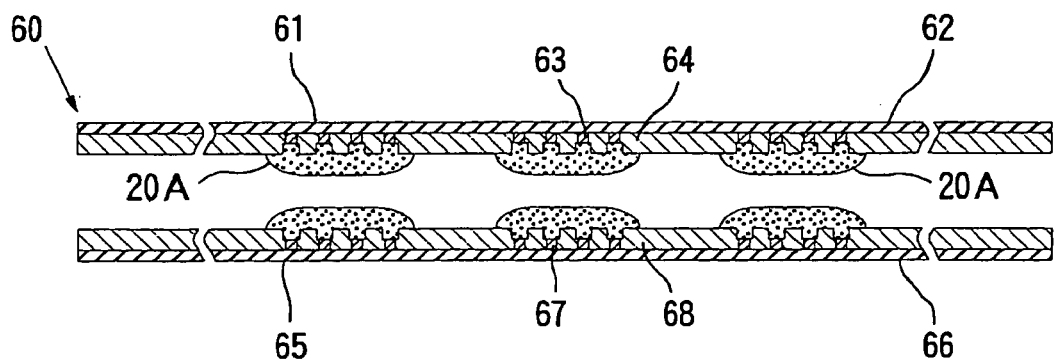
FIG. 6 is a cross-sectional view illustrating a state that a molding material has been applied to a mold for molding elastic anisotropically conductive films to form molding material layers.

A conductive paste composition with conductive particles exhibiting magnetism dispersed in a polymeric substance-forming material, which will become an elastic polymeric substance by being cured, preferably addition type liquid silicone rubber is then prepared. As illustrated in FIG. 6, a mold 60 for molding elastic anisotropically conductive films is provided, and the conductive paste composition as a molding material for elastic anisotropically conductive films is applied to the respective molding surfaces of a top force 61 and a bottom force 65 in the mold 60 in accordance with a necessary pattern, namely, an arrangement pattern of elastic anisotropically conductive films to be formed, thereby forming molding material layers 20A.

Here, the mold 60 will be described specifically. This mold 60 is so constructed that the top force 61 and the bottom force 65 making a pair therewith are arranged so as to be opposed to each other.

Figure 7:
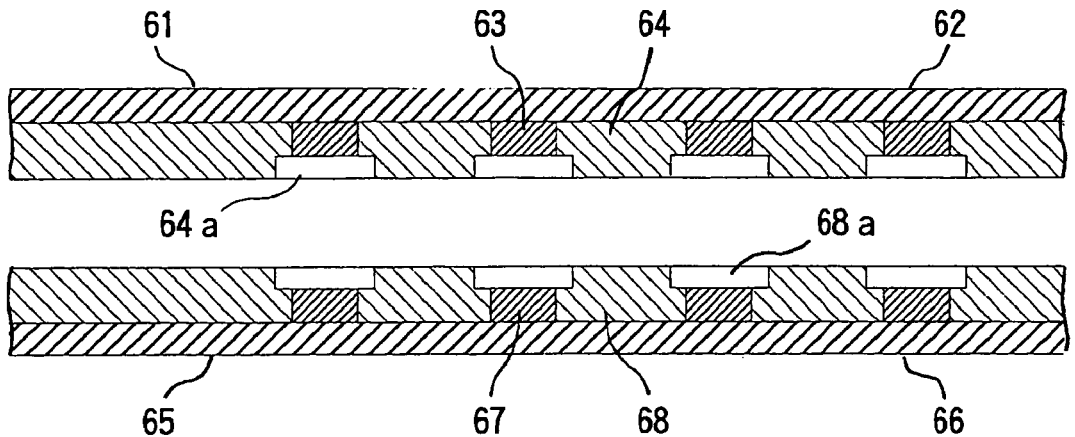
FIG. 7 is a cross-sectional view illustrating, on an enlarged scale, a part of the mold for molding elastic anisotropically conductive films.

In the top force 61, ferromagnetic substance layers 63 are formed in accordance with a pattern antipodal to an arrangement pattern of the conductive parts 22 for connection in each of the elastic anisotropically conductive films 20 to be molded on the lower surface of a base plate 62, and non-magnetic substance layers 64 are formed at other portions than the ferromagnetic substance layers 63 as illustrated, on an enlarged scale, in FIG. 7. The molding surface is formed by these ferromagnetic substance layers 63 and non-magnetic substance layers 64. Recessed parts 64a are formed in the molding surface of the top force 61 corresponding to the projected parts 24 in the elastic anisotropically conductive films 20 to be molded.

In the bottom force 65 on the other hand, ferromagnetic substance layers 67 are formed in accordance with the same pattern as the arrangement pattern of the conductive parts 22 for connection in the elastic anisotropically conductive films 20 to be molded on the upper surface of a base plate 66, and non-magnetic substance layers 68 are formed at other portions than the ferromagnetic substance layers 67. The molding surface is formed by these ferromagnetic substance layers 67 and non-magnetic substance layers 68. Recessed parts 68a are formed in the molding surface of the bottom force 65 corresponding to the projected parts 24 in the elastic anisotropically conductive films 20 to be molded.

The respective base plates 62 and 66 in the top force 61 and bottom force 65 are preferably formed by a ferromagnetic substance. Specific examples of such a ferromagnetic substance include ferromagnetic metals such as iron, iron-nickel alloys, iron-cobalt alloys, nickel and cobalt. The base plates 62, 66 preferably have a thickness of 0.1 to 50 mm, and are preferably smooth at surfaces thereof and subjected to a chemical degreasing treatment or mechanical polishing treatment.

As a material for forming the ferromagnetic substance layers 63, 67 in both top force 61 and bottom force 65, may be used a ferromagnetic metal such as iron, iron-nickel alloy, iron-cobalt alloy, nickel or cobalt. The ferromagnetic substance layers 63, 67 preferably have a thickness of at least 10 μm. When this thickness is at least 10 μm, a magnetic field having a sufficient intensity distribution can be applied to the molding material layers 20A. As a result, the conductive particles can be gathered at a high density at portions to become conductive parts 22 for connection in the molding material layers 20A, and so conductive parts 22 for connection having good conductivity can be provided.

As a material for forming the non-magnetic substance layers 64, 68 in both top force 61 and bottom force 65, may be used a non-magnetic metal such as copper, a polymeric substance having heat resistance, or the like. However, a polymeric substance cured by radiation may preferably be used in that the non-magnetic substance layers 64, 68 can be easily formed by a technique of photolithography. As a material thereof, may be used, for example, a photoresist such as an acrylic type dry film resist, epoxy type liquid resist or polyimide type liquid resist.

As a method for coating the molding surfaces of the top force 61 and bottom force 65 with the molding material, may preferably be used a screen printing method. According to such a method, the molding material can be easily applied according to a necessary pattern, and a proper amount of the molding material can be applied.

Figure 8:
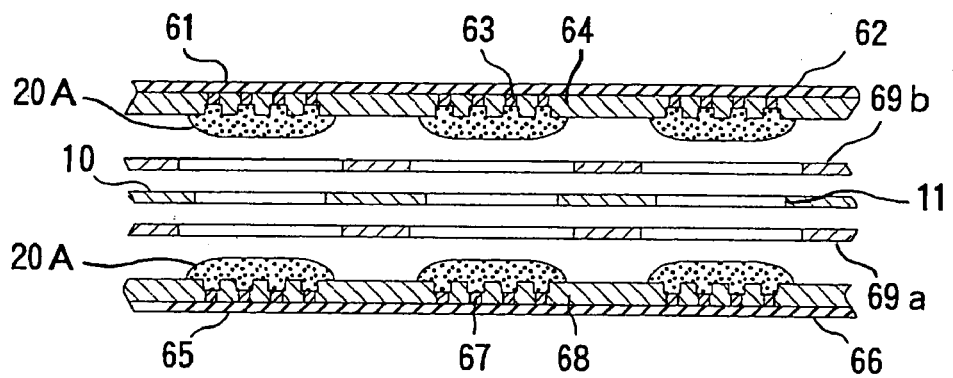
FIG. 8 is a cross-sectional view illustrating a state that a frame plate has been arranged through spacers between a top force and a bottom force in the mold shown in FIG. 6.
Figure 9:
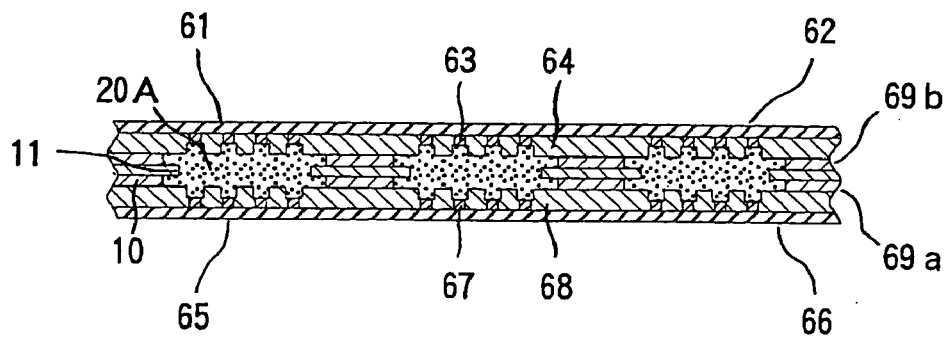
FIG. 9 is a cross-sectional view illustrating a state that molding material layers of the intended form have been formed between the top force and the bottom force in the mold.
Figure 10:
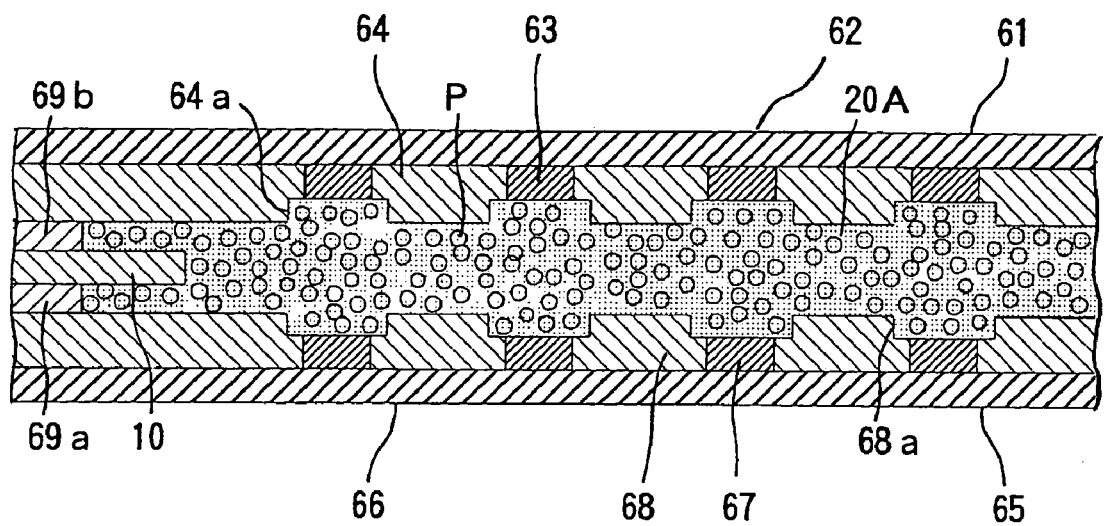
FIG. 10 is a cross-sectional view illustrating, on an enlarged scale, the molding material layer shown in FIG. 9.

As illustrated in FIG. 8, the frame plate 10 is then arranged in alignment on the molding surface of the bottom force 65, on which the molding material layers 20A have been formed, through a spacer 69a, and on the frame plate 10, the top force 61, on which the molding material layers 20A have been formed, is arranged in alignment through a spacer 69b. These top and bottom forces are superimposed on each other, whereby molding material layers 20A of the intended form (form of the elastic anisotropically conductive films 20 to be formed) are formed between the top force 61 and the bottom force 65 as illustrated in FIG. 9. In each of these molding material layers 20A, the conductive particles P are contained in a state dispersed throughout in the molding material layer 20A as illustrated in FIG. 10.

As described above, the spacers 69a and 69b are arranged between the frame plate 10, and the bottom force 65 and the top force 61, respectively, whereby the elastic anisotropically conductive films of the intended form can be formed, and adjacent elastic anisotropically conductive films are prevented from being connected to each other, so that a great number of anisotropically conductive films independent of one another can be formed with certainty.

Figure 11:
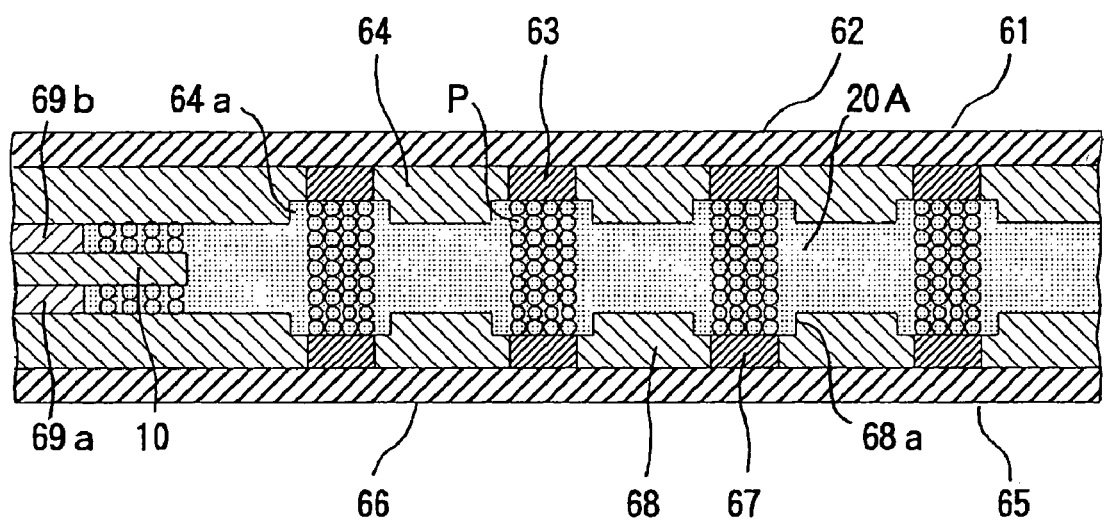
FIG. 11 is a cross-sectional view illustrating a state that a magnetic field having a strength distribution has been applied to the molding material layer shown in FIG. 10 in a thickness-wise direction thereof.

A pair of, for example, electromagnets are then arranged on the upper surface of the base plate 62 in the top force 61 and the lower surface of the base plate 66 in the bottom force 65, and the electromagnets are operated, whereby a magnetic field having higher intensity at portions between the ferromagnetic substance layers 63 of the top force 61 and their corresponding ferromagnetic substance layers 67 of the bottom force 65 than surrounding regions thereof is formed because the top force 61 and the bottom force 65 have the ferromagnetic substance layers 63 and 67, respectively. As a result, in the molding material layers 20A, the conductive particles P dispersed in the molding material layers 20A are gathered at portions to become the conductive parts 22 for connection, which are located between the ferromagnetic substance layers 63 of the top force 61 and their corresponding ferromagnetic substance layers 67 of the bottom force 65, and oriented so as to align in the thickness-wise direction of the molding material layers as illustrated in FIG. 11. In the above-described process, the frame plate 10 is composed of the magnetic metal, so that a magnetic field having higher intensity at portions between the frame plate 10, and the respective top force 61 and the bottom force 65 than vicinities thereof is formed. As a result, the conductive particles P existing above and below the frame plate 10 in the molding material layers 20A are not gathered between the ferromagnetic substance layers 63 of the top force 61 and the ferromagnetic substance layers 67 of the bottom force 65, but remain retained above and below the frame plate 10.

In this state, the molding material layers 20A are subjected to a curing treatment, whereby the elastic anisotropically conductive films 20 each composed of a functional part 21, in which a plurality of conductive parts 22 for connection containing the conductive particles P in the elastic polymeric substance in a state oriented so as to align in the thickness-wise direction are arranged in a state mutually insulated by an insulating part 23 composed of the elastic polymeric substance, in which the conductive particles P are not present at all or scarcely present, and a part 25 to be supported, which is continuously and integrally formed at a peripheral edge of the functional part 21 and in which the conductive particles P are contained in the elastic polymeric substance, are formed in a state that the part 25 to be supported has been fixed to the periphery about each anisotropically conductive film-arranging hole 11 of the frame plate 10, thereby producing an anisotropically conductive connector.

In the above-described process, the intensity of the external magnetic field applied to the portions to become the conductive parts 22 for connection and the portion to become the parts 25 to be supported in the molding material layers 20A is preferably an intensity that it amounts to 0.1 to 2.5 T on the average.

The curing treatment of the molding material layers 20A is suitably selected according to the material used. However, the treatment is generally conducted by a heat treatment. When the curing treatment of the molding material layers 20A is conducted by heating, it is only necessary to provide a heater in an electromagnet. Specific heating temperature and heating time are suitably selected in view of the kinds of the polymeric substance-forming material forming the molding material layer 20A, and the like, the time required for movement of the conductive particles P, and the like.

According to the anisotropically conductive connector described above, it is hard to be deformed and easy to handle because, in the elastic anisotripically conductive films 20, the parts 25 to be supported is formed at the peripheral edge of the functional part 21 having the conductive parts 22 for connection, and this part 25 to be supported is fixed to the periphery about the anisotropically conductive film-arranging hole 11 in the frame plate 10, whereby the positioning and the holding and fixing to a wafer, which is an object of inspection, can be easily conducted in an electrically connecting operation to the wafer.

Since the proportion of the high-conductive metal to the core particles in the conductive particles P contained in the conductive parts 22 for connection in the elastic anisotropically conductive film 20 is at least 15% by mass, and the thickness t of the coating layer formed of the high-conductive metal is at least 50 nm, the core particles in the conductive particles P are prevented from being exposed to the surface even when the anisotropically conductive connector is used repeatedly over many times. As a result, the necessary conductivity can be surely retained.

Even when the material making up the core particles in the conductive particles P migrates into the high-conductive metal when the anisotropically conductive connector is used repeatedly under a high-temperature environment, it can be prevented to markedly deteriorate the conductivity of the conductive particles because the high-conductive metal exists in a high proportion on the surfaces of the conductive particles.

The cured product of the addition type liquid silicone rubber, whose compression set is at most 10% at 150° C. and whose durometer A hardness is 10 to 60, is used as the elastic polymeric substance forming the elastic anisotropically conductive films 20, whereby it is inhibited to cause permanent set on the conductive parts 22 for connection even when the anisotropically conductive connector is used repeatedly over many times, thereby inhibiting the chain of the conductive particles in the conductive part 22 for connection from being disordered. As a result, the necessary conductivity can be more surely retained.

That having a durometer A hardness of 25 to 40 is used as the elastic polymeric substance forming the elastic anisotropically conductive films 20, whereby it is inhibited to cause permanent set on the conductive parts 22 for connection even when the anisotropically conductive connector is used repeatedly under a high-temperature environment in a test, for example, a WLBI test, thereby inhibiting the chain of the conductive particles in the conductive part 22 for connection from being disordered. As a result, the necessary conductivity can be surely retained over a long period of time.

Since the respective anisotropically conductive film-arranging holes 11 in the frame plate 10 are formed correspondingly to the electrode regions, in which electrode to be inspected have been arranged, of all integrated circuits formed on a wafer, which is an object of inspection, and the elastic anisotropically conductive film 20 arranged in each of the anisotropically conductive film-arranging holes 11 may be small in area, the individual elastic anisotropically conductive films 20 are easy to be formed. In addition, since the elastic anisotropically conductive film 20 small in area is little in the absolute quantity of thermal expansion in a plane direction of the elastic anisotropically conductive film 20 even when it is subjected to thermal hysteresis, the thermal expansion of the elastic anisotropically conductive film 20 in the plane direction is surely restrained by the frame plate by using a material having a low coefficient of linear thermal expansion as that for forming the frame plate 10. Accordingly, a good electrically connected state can be stably retained even when the WLBI test is performed on a large-area wafer.

Since the anisotropically conductive connector is obtained by subjecting the molding material layers 20A to the curing treatment in a state that the conductive particles P have been retained in the portions to become the parts 25 to be supported in the molding material layers 20A by, for example, applying a magnetic field to those portions in the formation of the elastic anisotropically conductive films 20, the conductive particles P existing in the portions to become the parts 25 to be supported in the molding material layers 20A, i.e., portions located above and below the peripheries about the anisotropically conductive film-arranging holes 11 in the frame plate 10 are not gathered at the portions to become the conductive parts 22 for connection. As a result, the conductive particles P are prevented from being contained in excess in the conductive parts 22 for connection, which are located most outside among the conductive parts 22 for connection in the resulting elastic anisotropically conductive films 20. Accordingly, there is no need of reducing the content of the conductive particles P in the molding material layers 20A, so that good conductivity is achieved with certainty in all the conductive parts 22 for connection in the elastic anisotropically conductive films 20, and moreover insulating property between adjacent conductive parts 22 for connection can be achieved with certainty.

Since the positioning holes 16 are formed in the frame plate 10, positioning to the wafer, which is the object of inspection, or the circuit board for inspection can be easily conducted.

Since the air circulating holes 15 are formed in the frame plate 10, air existing between the anisotropically conductive connector and the circuit board for inspection is discharged through the air circulating holes 15 in the frame plate 10 at the time the pressure within a chamber is reduced when that by the pressure reducing system is utilized as the means for pressing the probe member in a wafer inspection apparatus, which will be described subsequently, whereby the anisotropically conductive connector can be surely brought into close contact with the circuit board for inspection, so that the necessary electrical connection can be achieved with certainty.

[Wafer Inspection Apparatus]

Figure 12:
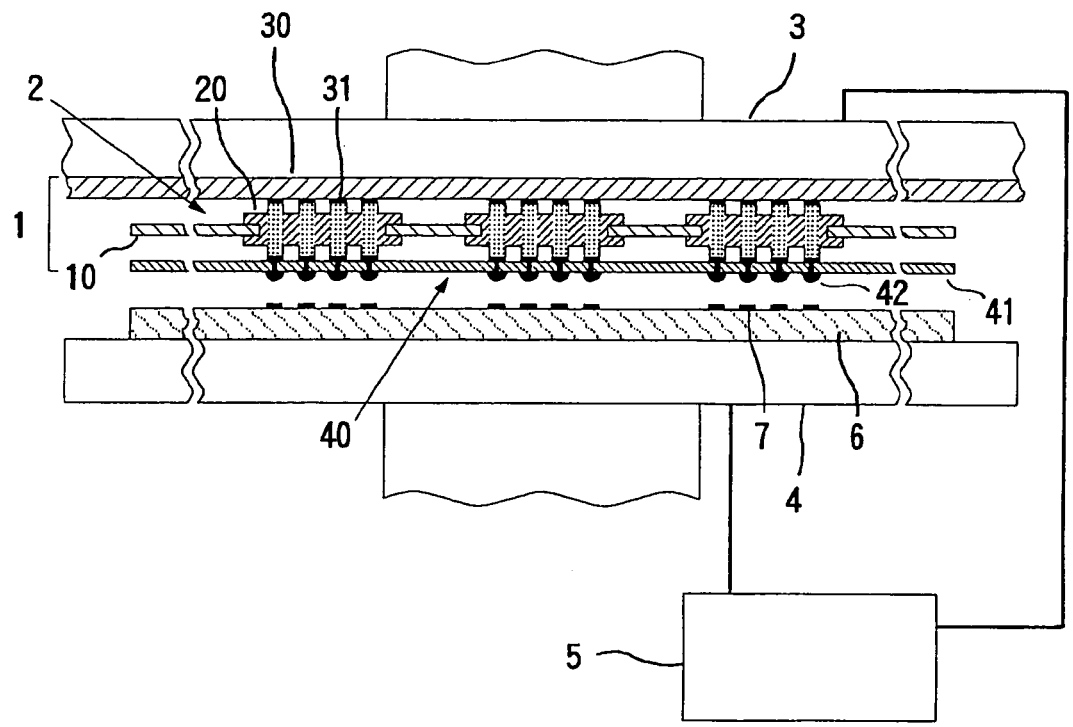
FIG. 12 is a cross-sectional view illustrating the construction of an exemplary wafer inspection apparatus using the anisotropically conductive connector according to the present invention.

FIG. 12 is a cross-sectional view schematically illustrating the construction of an exemplary wafer inspection apparatus making use of the anisotropically conductive connector according to the present invention. This wafer inspection apparatus serves to perform electrical inspection of each of a plurality of integrated circuits formed on a wafer in a state of the wafer.

Figure 13:
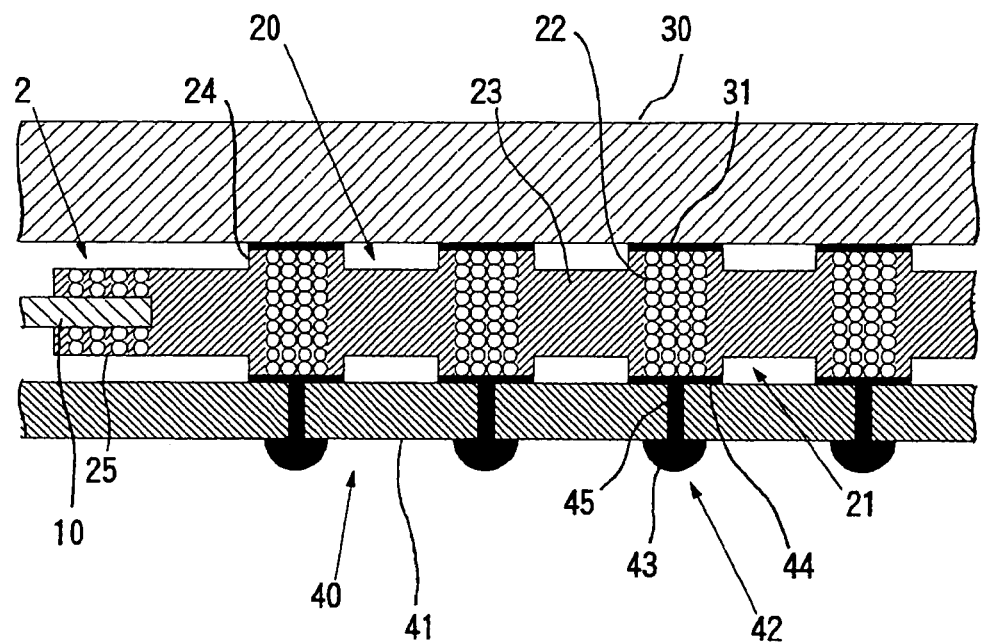
FIG. 13 is a cross-sectional view illustrating the construction of a principal part of an exemplary probe member according to the present invention.

The wafer inspection apparatus shown in FIG. 12 has a probe member 1 for conducting electrical connection of each of electrodes 7 to be inspected of a wafer 6, which is an object of inspection, to a tester. As also illustrated on an enlarged scale in FIG. 13, the probe member 1 has a circuit board 30 for inspection, on the front surface (lower surface in FIG. 12) of which a plurality of inspection electrodes 31 have been formed in accordance with a pattern corresponding to a pattern of the electrodes 7 to be inspected of the wafer 6 that is the object of inspection. On the front surface of the circuit board 30 for inspection is provided the anisotropically conductive connector 2 of the construction illustrated in FIGS. 1 to 4 in such a manner that the conductive parts 22 for connection in the elastic anisotropically conductive films 20 of the connector are opposed to and brought into contact with the inspection electrodes 31 of the circuit board 30 for inspection, respectively. On the front surface (lower surface in FIG. 12) of the anisotropically conductive connector 2 is provided a sheet-like connector 40, in which a plurality of electrode structures 42 have been arranged in an insulating sheet 41 in accordance with the pattern corresponding to the pattern of the electrodes 7 to be inspected of the wafer 6 that is the object of inspection, in such a manner that the electrode structures 42 are opposed to and brought into contact with the conductive parts 22 for connection in the elastic anisotropically conductive films 20 of the anisotropically conductive connector 2, respectively.

On the back surface (upper surface in the figure) of the circuit board 30 for inspection in the probe member 1 is provided a pressurizing plate 3 for pressurizing the probe member 1 downward. A wafer mounting table 4, on which the wafer 6 that is the object of inspection is mounted, is provided below the probe member 1. A heater 5 is connected to each of the pressurizing plate 3 and the wafer mounting table 4.

As a base material for making up the circuit board 30 for inspection, may be used any of conventionally known various base materials. Specific examples thereof include composite resin materials such as glass fiber-reinforced epoxy resins, glass fiber-reinforced phenol resins, glass fiber-reinforced polyimide resins and glass fiber-reinforced bismaleimidotriazine resins, and ceramic materials such as glass, silicon dioxide and alumina.

When a wafer inspection apparatus for performing the WLBI test is constructed, a material having a coefficient of linear thermal expansion of at most $3\times10^{-5}$/K, more preferably $1\times10^{-7}$ to $1\times10^{-5}$/K, particularly preferably $1\times10^{-6}$ to $6\times10^{-6}$/K is preferably used.

Specific examples of such a base material include Pyrex (registered trademark) glass, quartz glass, alumina, beryllia, silicon carbide, aluminum nitride and boron nitride.

The sheet-like connector 40 in the probe member 1 will be described specifically. This sheet-like connector 40 has a flexible insulating sheet 41, and in this insulating sheet 41, a plurality of electrode structures 42 extending in the thickness-wise direction of the insulating sheet 41 and composed of a metal are arranged in a state separated from each other in a plane direction of the insulating sheet 41 in accordance with the pattern corresponding to the pattern of the electrodes 7 to be inspected of the wafer 6 that is the object of inspection.

Each of the electrode structures 42 is formed by integrally connecting a projected front-surface electrode part 43 exposed to the front surface (lower surface in the figure) of the insulating sheet 41 and a plate-like back-surface electrode part 44 exposed to the back surface of the insulating sheet 41 to each other by a short circuit part 45 extending through in the thickness-wise direction of the insulating sheet 41.

No particular limitation is imposed on the insulating sheet 41 so far as it has insulating property and is flexible. For example, a resin sheet formed of a polyamide resin, liquid crystal polymer, polyester, fluororesin or the like, or a sheet obtained by impregnating a cloth woven by fibers with any of the above-described resins may be used.

No particular limitation is also imposed on the thickness of the insulating sheet 41 so far as such an insulating sheet 41 is flexible. However, it is preferably 10 to 50 μm, more preferably 10 to 2.5 μm.

As a metal for forming the electrode structures 42, may be used nickel, copper, gold, silver, palladium, iron or the like. The electrode structures 42 may be any of those formed of a single metal, those formed of an alloy of at least two metals and those obtained by laminating at least two metals as a whole.

On the surfaces of the front-surface electrode part 43 and back-surface electrode part 44 in the electrode structure 42, a film of a metal, chemically stable and having high conductivity, such as gold, silver or palladium is preferably formed in that oxidation of the electrode parts is prevented, and electrode parts small in contact resistance are obtained.

The projected height of the front-surface electrode part 43 in the electrode structure 42 is preferably 15 to 50 μm, more preferably 15 to 30 μm in that stable electrical connection to the electrode 7 to be inspected of the wafer 6 can be achieved. The diameter of the front-surface electrode part 43 is preset according to the size and pitch of the electrodes to be inspected of the wafer 6 and is, for example, 30 to 80 μm, preferably 30 to 50 μm.

The diameter of the back-surface electrode part 44 in the electrode structure 42 may be greater than the diameter of the short circuit part 45 and smaller than the arrangement pitch of the electrode structures 42 and is preferably great as much as possible, whereby stable electrical connection to the conductive part 22 for connection in the elastic anisotropically conductive film 20 of the anisotropically conductive connector 2 can also be achieved with certainty. The thickness of the back-surface electrode part 44 is preferably 20 to 50 μm, more preferably 35 to 50 μm in that the strength is sufficiently high and excellent repetitive durability is achieved.

The diameter of the short circuit part 45 in the electrode structure 42 is preferably 30 to 80 μm, more preferably 30 to 50 μm in that sufficiently high strength is achieved.

The sheet-like connector 40 can be produced, for example, in the following manner.

More specifically, a laminate material obtained by laminating a metal layer on an insulating sheet 41 is provided, and a plurality of through-holes extending through in the thickness-wise direction of the insulating sheet 41 are formed in the insulating sheet 41 of the laminate material in accordance with a pattern corresponding to a pattern of electrode structures 42 to be formed by laser machining, dry etch machining or the like. This laminate material is then subjected to photolithography and plating treatment, whereby short circuit parts 45 integrally connected to the metal layer are formed in the through-holes in the insulating sheet 41, and at the same time, projected front-surface electrode parts 43 integrally connected to the respective short circuit parts 45 are formed on the front surface of the insulating sheet 41. Thereafter, the metal layer of the laminate material is subjected to a photo-etching treatment to remove a part thereof, thereby forming back-surface electrode parts 44 to form the electrode structures 42, whereby the sheet-like connector 40 is provided.

In such an electrical inspection apparatus, a wafer 6, which is an object of inspection, is mounted on the wafer mounting table 4, and the probe member 1 is then pressurized downward by the pressurizing plate 3, whereby the respective front-surface electrode parts 43 in the electrode structures 42 of the sheet-like connector 40 thereof are brought into contact with their corresponding electrodes 7 to be inspected of the wafer 6, and moreover the respective electrodes 7 to be inspected of the wafer 6 are pressurized by the front-surface electrodes parts 43. In this state, each of the conductive parts 22 for connection in the elastic anisotropically conductive films 20 of the anisotropically conductive connector 2 are respectively held and pressurized by the inspection electrodes 31 of the circuit board 30 for inspection and the front-surface electrode parts 43 of the electrode structures 42 of the sheet-like connector 40 and compressed in the thickness-wise direction of the elastic anisotropically conductive films 20, whereby conductive paths are formed in the respective conductive parts 22 for connection in the thickness-wise direction thereof. As a result, electrical connection between the electrodes 7 to be inspected of the wafer 6 and the inspection electrodes 31 of the circuit board 30 for inspection is achieved. Thereafter, the wafer 6 is heated to a prescribed temperature through the wafer mounting table 4 and the pressurizing plate 3 by the heater 5. In this state, necessary electrical inspection is performed on each of a plurality of integrated circuits in the wafer 6.

According to such a wafer inspection apparatus, electrical connection to the electrodes 7 to be inspected of the wafer 6, which is the object of inspection, is achieved through the probe member 1 having the above-described anisotropically conductive connector 2. Therefore, positioning, and holding and fixing to the wafer can be conducted with ease even when the pitch of the electrodes 7 to be inspected is small, and moreover the necessary electrical inspection can be stably performed over a long period of time even when the apparatus is used repeatedly over many times or used repeatedly in a test, for example, a WLBI test under a high-temperature environment.

Since each of the elastic anisotropically conductive films 20 in the anisotropically conductive connector 2 is small in its own area, and the absolute quantity of thermal expansion in a plane direction of the elastic anisotropically conductive film 20 is little even when it is subjected to thermal hysteresis, the thermal expansion of the elastic anisotropically conductive film 20 in the plane direction thereof is surely restrained by the frame plate by using a material having a low coefficient of linear thermal expansion as that for forming the frame plate 10. Accordingly, a good electrically connected state can be stably retained even when the WLBI test is performed on a large-area wafer.

Figure 14:
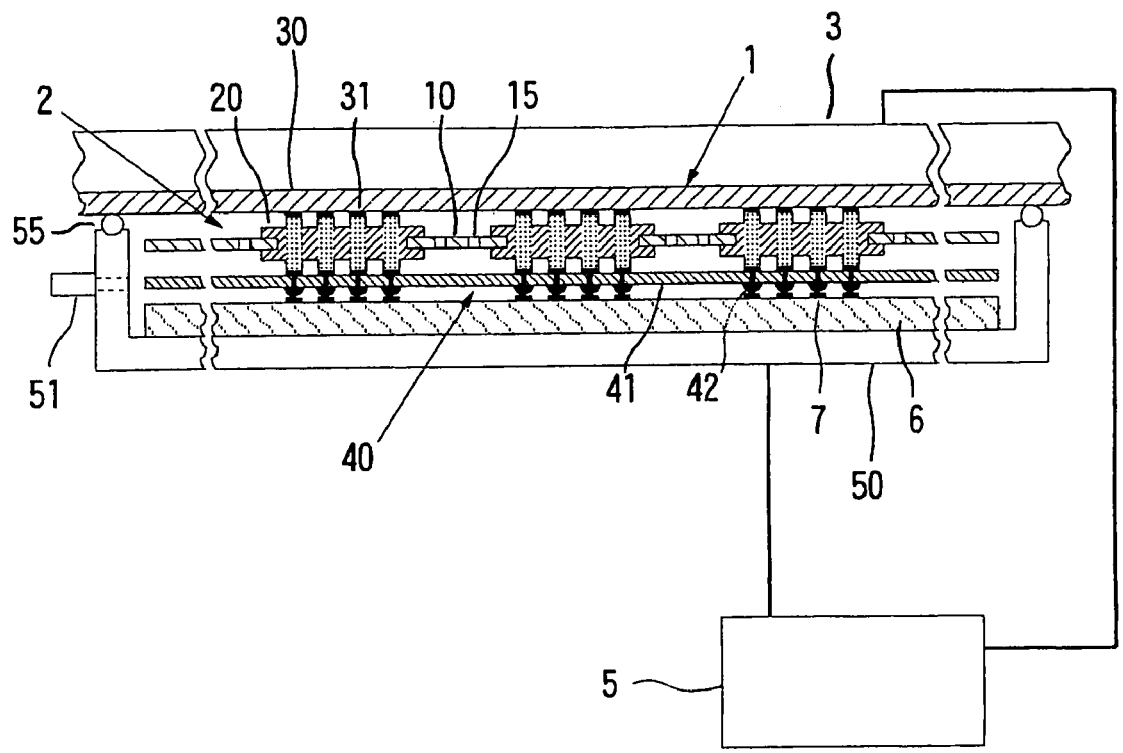
FIG. 14 is a cross-sectional view illustrating the construction of another exemplary wafer inspection apparatus using the anisotropically conductive connector according to the present invention.

FIG. 14 is a cross-sectional view schematically illustrating the construction of another exemplary wafer inspection apparatus making use of the anisotropically conductive connector according to the present invention.

This wafer inspection apparatus has a box-type chamber 50 opened at the top thereof, in which a wafer 6 that is an object of inspection is received. An evacuation pipe 51 for evacuating air within the chamber 50 is provided in a sidewall of this chamber 50, and an evacuator (not illustrated) such as, for example, a vacuum pump, is connected to the evacuation pipe 51.

A probe member 1 of the same construction as the probe member 1 in the wafer inspection apparatus shown in FIG. 12 is arranged on the chamber 50 so as to air-tightly close the opening of the chamber 50. More specifically, an elastic O-ring 55 is arranged in close contact on an upper end surface of the sidewall in the chamber 50, and the probe member 1 is arranged in a state that the anisotropically conductive connector 2 and sheet-like connector 40 thereof have been housed in the chamber 50, and the periphery of the circuit board 30 for inspection thereof has been brought into close contact with the O-ring. Further, the circuit board 30 for inspection is held in a state pressurized downward by a pressurizing plate 3 provided on the back surface (upper surface in the figure) thereof.

A heater 5 is connected to the chamber 50 and the pressurizing plate 3.

In such a wafer inspection apparatus, the evacuator connected to the evacuation pipe 51 of the chamber 50 is driven, whereby the pressure within the chamber 50 is reduced to, for example, 1,000 Pa or lower. As a result, the probe member 1 is pressurized downward by the atmospheric pressure, whereby the O-ring 55 is elastically deformed, and so the probe member 1 is moved downward. As a result, electrodes 7 to be inspected of the wafer 6 are respectively pressurized by their corresponding front-surface electrode parts 43 in electrode structures 42 of the sheet-like connector 40. In this state, the conductive parts 22 for connection in the elastic anisotropically conductive films 20 of the anisotropically conductive connector 2 are respectively held and pressurized by the inspection electrodes 31 of the circuit board 30 for inspection and the front-surface electrode parts 43 in the electrode structures 42 of the sheet-like connector 40 and compressed in the thickness-wise direction of the elastic anisotropically conductive films 20, whereby conductive paths are formed in the respective conductive parts 22 for connection in the thickness-wise direction thereof. As a result, electrical connection between the electrodes 7 to be inspected of the wafer 6 and the inspection electrodes 31 of the circuit board 30 for inspection is achieved. Thereafter, the wafer 6 is heated to a prescribed temperature through the chamber 50 and the pressurizing plate 3 by the heater 5. In this state, necessary electrical inspection is performed on each of a plurality of integrated circuits in the wafer 6.

According to such a wafer inspection apparatus, the same effects as those about the wafer inspection apparatus shown in FIG. 12 are brought about. In addition, the whole inspection apparatus can be miniaturized because any large-sized pressurizing mechanism is not required, and moreover the whole wafer 6, which is the object of inspection, can be pressed by even force even when the wafer 6 has a large area of, for example, 8 inches or greater in diameter. In addition, since the air circulating holes 15 are formed in the frame plate 10 in the anisotropically conductive connector 2, air existing between the anisotropically conductive connector 2 and the circuit board 30 for inspection is discharged through the air circulating holes 15 of the frame plate 10 in the anisotropically conductive connector 2 at the time the pressure within the chamber 50 is reduced, whereby the anisotropically conductive connector 2 can be surely brought into close contact with the circuit board 30 for inspection, so that the necessary electrical connection can be achieved with certainty.

OTHER EMBODIMENTS

The present invention is not limited to the above-described embodiments, and such various changes or modifications as described below may be added thereto.

(1) In the anisotropically conductive connector, conductive parts for non-connection that are not to be electrically connected to any electrode to be inspected in a wafer may be formed in the elastic anisotropically conductive films 20 in addition to the conductive parts 22 for connection. An anisotropically conductive connector having elastic anisotropically conductive films, in which the conductive parts for non-connection have been formed, will hereinafter be described.

Figure 15:
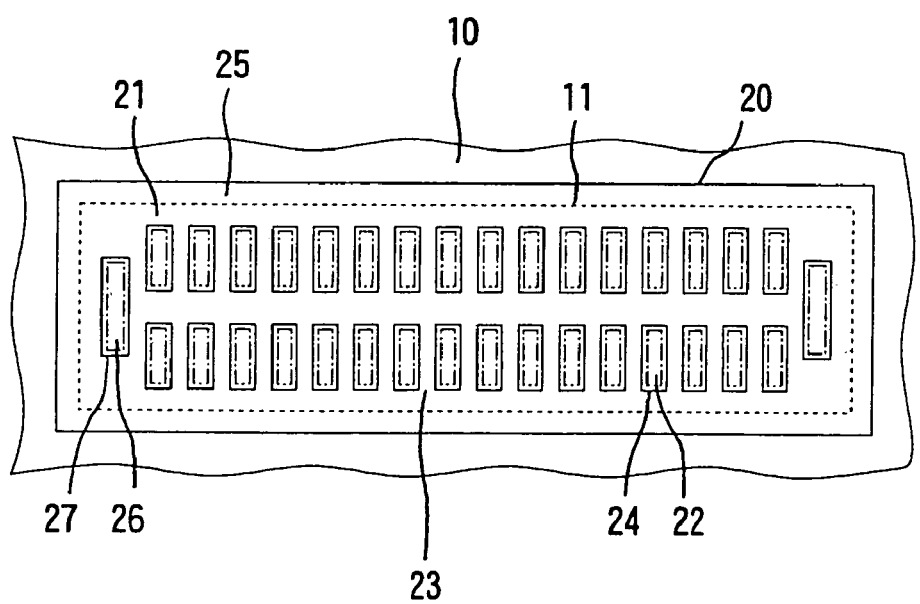
FIG. 15 is a plan view illustrating, on an enlarged scale, an elastic anisotropically conductive film in an anisotropically conductive connector according to another embodiment of the present invention.

FIG. 15 is a plan view illustrating, on an enlarged scale, an elastic anisotropically conductive film in an anisotropically conductive connector according to another embodiment of the present invention. In the elastic anisotropically conductive film 20 of this anisotropically conductive connector, a plurality of conductive parts 22 for connection that are electrically connected to electrodes to be inspected in a wafer, which is an object of inspection, and extend in the thickness-wise direction (direction perpendicular to the paper in FIG. 15) of the film are arranged in the functional part 21 thereof, so as to align in 2 rows in accordance with a pattern corresponding to a pattern of the electrodes to be inspected. These conductive parts 22 for connection respectively contain conductive particles exhibiting magnetism at a high density in a state oriented so as to align in the thickness-wise direction and are mutually insulated by an insulating part 23, in which the conductive particles are not contained at all or scarcely contained.

Conductive parts 26 for non-connection that are not to be electrically connected to any electrode to be inspected in the wafer, which is the object of inspection, and extend in the thickness-wise direction are formed between the conductive parts 22 for connection located most outside in a direction that the conductive parts 22 for connection are arranged and the frame plate 10. The conductive parts 26 for non-connection contain the conductive particles exhibiting magnetism at a high density in a state oriented so as to align in the thickness-wise direction and are mutually insulated from the conductive parts 22 for connection by an insulating part 23, in which the conductive particles are not contained at all or scarcely contained.

In the embodiment illustrated, projected parts 24 and projected parts 27 protruding from other surfaces than portions, at which the conductive parts 22 for connection and peripheries thereof are located, and portions, at which the conductive parts 26 for non-connection and peripheries thereof are located, are formed at those portions on both sides of the functional part 21 in the elastic anisotropically conductive film 20.

At the peripheral edge of the functional part 21, a part 25 to be supported that is fixed to and supported by the peripheral edge about the anisotropically conductive film-arranging hole 11 in the frame plate 10 is integrally and continuously formed with the functional part 21, and the conductive particles are contained in this part 25 to be supported.

Other constitutions are basically the same as those in the anisotropically conductive connector shown in FIGS. 1 to 4.

Figure 16:
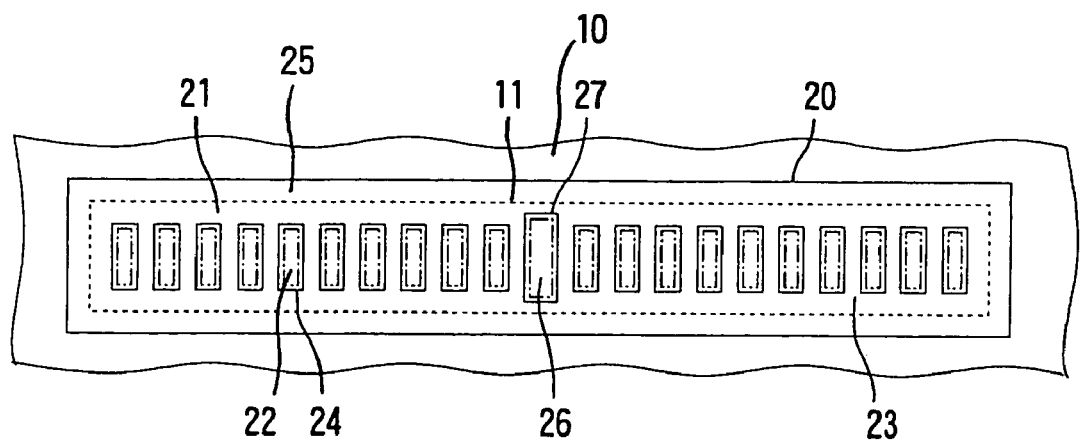
FIG. 16 is a plan view illustrating, on an enlarged scale, an elastic anisotropically conductive film in an anisotropically conductive connector according to a further embodiment of the present invention.

FIG. 16 is a plan view illustrating, on an enlarged scale, an elastic anisotropically conductive film in an anisotropically conductive connector according to a further embodiment of the present invention. In the elastic anisotropically conductive film 20 of this anisotropically conductive connector, a plurality of conductive parts 22 for connection that are electrically connected to electrodes to be inspected in a wafer, which is an object of inspection, and extend in the thickness-wise direction (direction perpendicular to the paper in FIG. 16) of the film are arranged so as to align in accordance with a pattern corresponding to a pattern of the electrodes to be inspected. These conductive parts 22 for connection respectively contain conductive particles exhibiting magnetism at a high density in a state oriented so as to align in the thickness-wise direction and are mutually insulated by an insulating part 23, in which the conductive particles are not contained at all or scarcely contained.

Among these conductive parts 22 for connection, 2 conductive parts 22 for connection, which are located at the center and adjoin each other, are arranged at a clearance greater than a clearance between other adjacent conductive parts 22 for connection. A conductive part 26 for non-connection that is not to be electrically connected to any electrode to be inspected in the wafer, which is the object for inspection, and extends in the thickness-wise direction is formed between the 2 conductive parts 22 for connection, which are located at the center and adjoin each other. This conductive part 26 for non-connection contains the conductive particles exhibiting magnetism at a high density in a state oriented so as to align in the thickness-wise direction and is mutually insulated from the conductive parts 22 for connection by an insulating part 23, in which the conductive particles are not contained at all or scarcely contained.

In the embodiment illustrated, projected parts 24 and projected parts 27 protruding from other surfaces than portions, at which the conductive parts 22 for connection and peripheries thereof are located, and a portion, at which the conductive part 26 for non-connection and a periphery thereof are located, are formed at those portions on both sides of the functional part 21 in the elastic anisotropically conductive film 20.

At the peripheral edge of the functional part 21, a part 25 to be supported that is fixed to and supported by the peripheral edge about the anisotropically conductive film-arranging hole 11 in the frame plate 10 is integrally and continuously formed with the functional part 21, and the conductive particles are contained in this part 25 to be supported.

Other specific constitutions are basically the same as those in the anisotropically conductive connector shown in FIGS. 1 to 4.

The anisotropically conductive connector shown in FIG. 15 and the anisotropically conductive connector shown in FIG. 16 can be produced in a similar manner to the process for producing the anisotropically conductive connector shown in FIGS. 1 to 4 by using a mold composed of a top force and a bottom force, on which ferromagnetic substance layers have been respectively formed in accordance with a pattern corresponding to an arrangement pattern of the conductive parts 22 for connection and conductive parts 26 for non-connection in the elastic anisotropically conductive films 20 to be formed, and non-magnetic substance layers have been formed at portions other than the ferromagnetic substance layers, in place of the mold shown in FIG. 7.

More specifically, according to such a mold, a pair of, for example, electromagnets are arranged on an upper surface of a base plate in the top force and a lower surface of a base plate in the bottom force, and the electromagnets are operated, whereby in molding material layers formed between the top force and the bottom force, conductive particles dispersed in portions to become the functional parts 21 in the molding material layers are gathered at portions to become the conductive parts 22 for connection and the portions to become the conductive parts 26 for non-connection, and oriented so as to align in the thickness-wise direction of the molding material layers. On the other hand, the conductive particles located above and below the frame plate 10 in the molding material layers remain retained above and below the frame plate 10.

In this state, the molding material layers are subjected to a curing treatment, whereby the elastic anisotropically conductive films 20 each composed of the functional part 21, in which a plurality of the conductive parts 22 for connection and conductive parts 26 for non-connection containing the conductive particles in the elastic polymeric substance in a state oriented so as to align in the thickness-wise direction are arranged in a state mutually insulated by the insulating part 23 composed of the elastic polymeric substance, in which the conductive particles are not present at all or scarcely present, and the part 25 to be supported, which is continuously and integrally formed at a peripheral edge of the functional part 21 and in which the conductive particles are contained in the elastic polymeric substance, are formed in a state that the part 25 to be supported has been fixed to the periphery about each anisotropically conductive film-arranging hole 11 of the frame plate 10, thereby producing the anisotropically conductive connector.

The conductive parts 26 for non-connection in the anisotropically conductive connector shown in FIG. 15 are each obtained by applying a magnetic field to portions to become the conductive parts 26 for non-connection in the molding material layer upon the formation of the elastic anisotropically conductive film 20 to gather the conductive particles existing between the portions to become the conductive parts 22 for connection, located most outside in the molding material layer, and the frame plate 10 at the portions to become the conductive parts for non-connection, and subjecting the molding material layer to a curing treatment in this state. Thus, upon the formation of the elastic anisotropically conductive film 20, the conductive particles are prevented from being gathered in excess in the portions to become the conductive parts 22 for connection, which are located most outside in the molding material layer. Accordingly, even when the respective elastic anisotropically conductive films 20 to be formed have comparatively many conductive parts 22 for connection, it is surely prevented to contain an excessive amount of the conductive particles in the conductive parts 22 for connection located most outside in the elastic anisotropically conductive film 20.

The conductive parts 26 for non-connection in the anisotropically conductive connector shown in FIG. 16 are each obtained by, upon the formation of the elastic anisotropically conductive film 20, applying a magnetic field to the portion to become the conductive part 26 for non-connection in the molding material layer to gather the conductive particles existing between the 2 adjacent portions to become the conductive parts 22 for connection arranged at a greater clearance in the molding material layer, at the portion to become the conductive part 26 for non-connection, and subjecting the molding material layer to a curing treatment in this state. Thus, upon the formation of the elastic anisotropically conductive film 20, the conductive particles are prevented from being gathered in excess at the 2 adjacent portions to become the conductive parts 22 for connection arranged at a greater clearance in the molding material layer. Accordingly, even when the respective elastic anisotropically conductive films 20 to be formed have at least 2 conductive parts 22 for connection arranged at a greater clearance, it is surely prevented to contain an excessive amount of the conductive particles in these conductive parts 22 for connection.

(2) In the anisotropically conductive connector, the projected parts 24 in the elastic anisotropically conductive films 20 are not essential, and one or both surfaces may be flat, or a recessed portion may be formed.

(3) A metal layer may be formed on the surfaces of the conductive parts 22 for connection in the elastic anisotropically conductive films 20.

(4) When a non-magnetic substance is used as a base material of the frame plate 10 in the production of the anisotropically conductive connector, a means of plating peripheries about the anisotropically conductive film-arranging holes 11 in the frame plate 10 with a magnetic substance or coating them with a magnetic paint to apply a magnetic field thereto, or a means of forming ferromagnetic substance layers in the mold 60 corresponding to the parts 25 to be supported of the elastic anisotropically conductive films 20 to apply a magnetic field thereto may be utilized as a means for applying the magnetic field to portions to become the parts 25 to be supported in the molding material layers 20A.

(5) The use of the spacer is not essential in the formation of the molding material layers, and spaces for forming the elastic anisotropically conductive films may be surely retained between each of the top force and bottom force, and the frame plate by any other means.

(6) In the probe member, the sheet-like connector 40 is not essential, and the elastic anisotropically conductive films 20 in the anisotropically conductive connector 2 may be brought into contact with a wafer, which is an object of inspection, to achieve electrical connection.

(7) In the anisotropically conductive connector according to the present invention, the anisotropically conductive film-arranging holes in the frame plate thereof may be formed correspondingly to electrode regions, in which electrodes to be inspected have been arranged, in part of integrated circuits formed on a wafer, which is an object of inspection, and the elastic anisotropically conductive film may be arranged in each of these anisotropically conductive film-arranging holes.

According to such an anisotropically conductive connector, a wafer can be divided into two or more areas to collectively perform the probe test on integrated circuits formed in each of the divided areas.

More specifically, it is not essential to collectively perform inspection on all the integrated circuits formed on the wafer in the wafer inspection process using the anisotropically conductive connector according to the present invention or the probe member according to the present invention.

In the burn-in test, inspection time required of each of integrated circuits is as long as several hours, and so high time efficiency can be achieved when the inspection is conducted collectively on all integrated circuits formed on a wafer. In the probe test on the other hand, inspection time required of each of integrated circuits is as short as several minutes, and so sufficiently high time efficiency can be achieved even when a wafer is divided into 2 or more areas, and the probe test is conducted collectively on integrated circuits formed in each of the divided areas.

As described above, according to the method that electrical inspection is conducted every area divided as to integrated circuits formed on a wafer, when the electrical inspection is conducted as to integrated circuits formed at a high degree of integration on a wafer having a diameter of 8 inches or 12 inches, the numbers of inspection electrodes and wires of the circuit board for inspection used can be reduced compared with the method that the inspection is conducted collectively on all the integrated circuits, whereby the production cost of the inspection apparatus can be reduced.

Since the anisotropically conductive connector according to the present invention or the probe member according to the present invention is high in durability in repeated use, the frequency to replace the anisotropically conductive connector suffers from trouble with a new one becomes low when it is used in the method that the electrical inspection is conducted every area divided as to integrated circuits formed on the wafer, so that inspection cost can be reduced.

(8) The anisotropically conductive connector according to the present invention or the probe member according to the present invention may also be used in inspection of a wafer, on which integrated circuits having projected electrodes (bumps) formed of gold, solder or the like have been formed, in addition to the inspection of a wafer, on which integrated circuits having flat electrodes formed of aluminum have been formed.

Since the electrode formed of gold, solder or the like is hard to form an oxidized film on its surface compared with the electrode composed of aluminum, there is no need of pressurizing such an electrode under a load required for breaking through the oxidized film in the inspection of the wafer, on which the integrated circuit having such projected electrodes have been formed, so that the inspection can be performed in a state that the conductive parts for connection of an anisotropically conductive connector have been brought into direct contact with the electrodes to be inspected without using any sheet-like connector.

When inspection of a wafer is conducted in a state that conductive parts for connection of an anisotropically conductive connector have been brought into direct contact with the projected electrodes, which are electrodes to be inspected, the conductive parts for connection undergo abrasion or permanent compressive deformation by being pressurized by the projected electrodes when the anisotropically conductive connector is used repeatedly. As a result, increase in electric resistance and connection failure to the electrodes to be inspected occur in the conductive parts for connection, so that it has been necessary to replace the anisotropically conductive connector by a new one at a high frequency.

According to the anisotropically conductive connector according to the present invention or the probe member according to the present invention, however, the necessary conductivity is retained over a long period of time even when the wafer, which is an object of inspection, is a wafer having a diameter of 8 inches or 12 inches, on which integrated circuits have been formed at a high degree of integration, since the anisotropically conductive connector or probe member is high in durability in repeated use, whereby the frequency to replace the anisotropically conductive connector with a new one becomes low, and so the inspection cost can be reduced.

The present invention will hereinafter be described specifically by the following examples. However, the present invention is not limited to these examples.

[Preparation of Magnetic Core Particles [A]]

Commercially available nickel particles (product of Westaim Co., "FC1000") were used to prepare Magnetic Core Particles [A] in the following manner.

An air classifier "Turboclassifier TC-15N" (manufactured by Nissei Engineering Co., Ltd.) was used to subject 2 kg of the nickel particles to a classification treatment under conditions of a specific gravity of 8.9, an air flow of 2.5 m$^3$/min, a rotor speed of 1,600 rpm, a classification point of 25 μm and a feed rate of nickel particles of 16 g/min, 1.8 kg of nickel particles were collected, and 1.8 kg of these nickel particles were subjected to another classification treatment under conditions of a specific gravity of 8.9, an air flow of 2.5 m$^3$/min, a rotor speed of 3,000 rpm, a classification point of 10 μm and a feed rate of nickel particles of 14 g/min, thereby collecting 1.5 kg of nickel particles.

A sonic sifter "SW-20AT Model" (manufactured by Tsutsui Rikagaku Kiki Co., Ltd.) was then used to subject 120 g of the nickel particles classified by the air classifier to a further classification treatment. Specifically, 4 sieves each having a diameter of 200 mm and respectively having opening diameters of 25 μm, 20 μm, 16 μm and 8 μm were superimposed on one another in this order from above. Each of the sieves was charged with 10 g of ceramic balls having a diameter of 2 mm, and 20 g of the nickel particles were placed on the uppermost sieve (opening diameter: 25 μm) to subject them to a classification treatment under conditions of 55 Hz for 12 minutes and 125 Hz for 15 minutes, thereby collecting nickel particles captured on the lowest sieve (opening diameter: 8 μm). This process was conducted repeatedly 25 times in total, thereby preparing 110 g of Magnetic Core Particles [A].

Magnetic Core Particles [A] thus obtained had a number average particle diameter of 10 μm, a coefficient of variation of the particle diameter of 10%, a BET specific surface area of 0.2×10$^3$ m$^2$/kg and a saturation magnetization of 0.6 Wb/m$^2$.

[Preparation of Magnetic Core Particles [B] to Magnetic Core Particles [I]]

The following Magnetic Core Particles [B] to Magnetic Core Particles [I] were prepared in the same manner as in the preparation of Magnetic Core Particles [A] except that the conditions of the air classifier and the sonic sifter were changed.

Magnetic Core Particles [B]:

Magnetic core particles composed of nickel and having a number average particle diameter of 12 μm, a coefficient of variation of the particle diameter of 40%, a BET specific surface area of 0.1×10$^3$ m$^2$/kg and a saturation magnetization of 0.6 Wb/m$^2$.

Magnetic Core Particles [C]:

Magnetic core particles composed of nickel and having a number average particle diameter of 10 μm, a coefficient of variation of the particle diameter of 10%, a BET specific surface area of 0.038×10$^3$ m$^2$/kg and a saturation magnetization of 0.6 Wb/m$^2$.

Magnetic Core Particles [D]:

Magnetic core particles composed of nickel and having a number average particle diameter of 10 μm, a coefficient of variation of the particle diameter of 15%, a BET specific surface area of 0.15×10$^3$ m$^2$/kg and a saturation magnetization of 0.6 Wb/m$^2$.

Magnetic Core Particles [E]:

Magnetic core particles composed of nickel and having a number average particle diameter of 8 μm, a coefficient of variation of the particle diameter of 32%, a BET specific surface area of 0.05×10$^3$ m$^2$/kg and a saturation magnetization of 0.6 Wb/m$^2$.

Magnetic Core Particles [F] (For Comparison):

Magnetic core particles composed of nickel and having a number average particle diameter of 6 μm, a coefficient of variation of the particle diameter of 40%, a BET specific surface area of 0.8×10$^3$ m$^2$/kg and a saturation magnetization of 0.6 Wb/m$^2$.

Magnetic Core Particles [G]:

Magnetic core particles composed of nickel and having a number average particle diameter of 10 μm, a coefficient of variation of the particle diameter of 20%, a BET specific surface area of 0.008×10$^3$ m$^2$/kg and a saturation magnetization of 0.6 Wb/m$^2$.

Magnetic Core Particles [H] (For Comparison):

Magnetic core particles composed of nickel and having a number average particle diameter of 8 μm, a coefficient of variation of the particle diameter of 25%, a BET specific surface area of 0.02×10$^3$ m$^2$/kg, a sulfur element content of 0.1% by mass, an oxygen element content of 0.6% by mass, a carbon element content of 0.12% by mass and a saturation magnetization of 0.6 Wb/m$^2$.

Magnetic Core Particles [I]:

Magnetic core particles composed of nickel and having a number average particle diameter of 45 μm, a coefficient of variation of the particle diameter of 33%, a BET specific surface area of 0.8×10$^3$ m$^2$/kg and a saturation magnetization of 0.6 Wb/m$^2$.

[Preparation of Conductive Particles [a]]

Into a treating vessel of a powder plating apparatus, were poured 100 g of Magnetic Core Particles [A], and 2 L of 0.32N hydrochloric acid were added. The resultant mixture was stirred to obtain a slurry containing Magnetic Core Particles [A]. This slurry was stirred at ordinary temperature for 30 minutes, thereby conducting an acid treatment for Magnetic Core Particles [A]. Thereafter, the slurry thus treated was left at rest for 1 minute to precipitate Magnetic Core Particles [A], and a supernatant was removed.

To Magnetic Core Particles [A] subjected to the acid treatment, were added 2 L of purified water, and the mixture was stirred at ordinary temperature for 2 minutes. The mixture was then left at rest for 1 minute to precipitate Magnetic Core Particles [A], and a supernatant was removed. This process was conducted repeatedly further twice, thereby conducting a washing treatment for Magnetic Core Particles [A].

To Magnetic Core Particles [A] subjected to the acid treatment and washing treatment, were added 2 L of a plating solution containing gold in a proportion of 20 g/L. The temperature of the treating vessel was raised to 90° C. and the content were stirred, thereby preparing a slurry. While stirring the slurry in this state, Magnetic Core Particles [A] were subjected to displacement plating with gold. Thereafter, the slurry was left at rest while allowing it to cool, thereby precipitating particles, and a supernatant was removed to prepare Conductive Particles [a] for the present invention.

To Conductive Particles [a] thus obtained, were added 2 L of purified water, and the mixture was stirred at ordinary temperature for 2 minutes. Thereafter, the mixture was left at rest for 1 minute to precipitate Conductive Particles [a], and a supernatant was removed. This process was conducted repeatedly further twice, and 2 L of purified water heated to 90° C. were added to the particles, and the mixture was stirred. The resultant slurry was filtered through filter paper to collect Conductive Particles [a]. Conductive Particles [a] thus obtained were dried in a dryer preset at 90° C.

Conductive Particles [a] thus obtained had a number average particle diameter of 12 μm, a BET specific surface area of $0.15 \times 10^3$ m$^2$/kg, a thickness t of the coating layer of 111 nm, a value N of (mass of gold forming the coating layer)/(total mass of Conductive Particles [a]) of 0.3 and an electric resistance value R of 0.025 Ω.

[Preparation of Conductive Particles [a1]]

Comparative Conductive Particles [a1] were prepared in the same manner as in the preparation of Conductive Particles [a] except that the content of gold in the plating solution of gold was changed to 5 g/L.

Conductive Particles [a1] thus obtained had a number average particle diameter of 12 μm, a BET specific surface area of $0.17 \times 10^3$ m$^2$/kg, a thickness t of the coating layer of 35 nm, a value N of (mass of gold forming the coating layer)/(total mass of Conductive Particles [a1]) of 0.12 and an electric resistance value R of 0.13 Ω.

[Preparation of Conductive Particles [b]]

Conductive Particles [b] were prepared in the same manner as in the preparation of Conductive Particles [a] except that Magnetic Core Particles [B] were used in place of Magnetic Core Particles [A].

Conductive Particles [b] thus obtained had a number average particle diameter of 13 μm, a BET specific surface area of $0.08 \times 10^3$ m$^2$/kg, a thickness t of the coating layer of 129 nm, a value N of (mass of gold forming the coating layer)/(total mass of Conductive Particles [b]) of 0.2 and an electric resistance value R of 0.1 Ω.

[Preparation of Conductive Particles [c] and Conductive Particles [c1]]

The following Conductive Particles [c] and [c1] were prepared in the same manner as in the preparation of Conductive Particles [a] except that Magnetic Core Particles [C] were used in place of Magnetic Core Particles [A], and the content of gold in the plating solution of gold was changed.

Conductive Particles [c] (for Invention):

Conductive particles having a number average particle diameter of 14 μm, a BET specific surface area of $0.015 \times 10^3$ m$^2$/kg, a thickness t of the coating layer of 299 nm, a value N of (mass of gold forming the coating layer)/(total mass of Conductive Particles [c]) of 0.18 and an electric resistance value R of 0.12 Ω.

Conductive Particles [c1] (for Comparison):

Conductive particles having a number average particle diameter of 11 μm, a BET specific surface area of $0.035 \times 10^3$ m$^2$/kg, a thickness t of the coating layer of 103 nm, a value N of (mass of gold forming the coating layer)/(total mass of Conductive Particles [c1]) of 0.07 and an electric resistance value R of 0.14 Ω.

[Preparation of Conductive Particles [d] and Conductive Particles [d1]]

The following Conductive Particles [d] and [d1] were prepared in the same manner as in the preparation of Conductive Particles [a] except that Magnetic Core Particles [D] were used in place of Magnetic Core Particles [A], and the content of gold in the plating solution of gold was changed.

Conductive Particles [d] (for Invention):

Conductive particles having a number average particle diameter of 12 μm, a BET specific surface area of $0.12 \times 10^3$ m$^2$/kg, a thickness t of the coating layer of 134 nm, a value N of (mass of gold forming the coating layer)/(total mass of Conductive Particles [d]) of 0.28 and an electric resistance value R of 0.015 Ω.

Conductive Particles [d1] (for Comparison):

Conductive particles having a number average particle diameter of 14 μm, a BET specific surface area of $0.14 \times 10^3$ m$^2$/kg, a thickness t of the coating layer of 43 nm, a value N of (mass of gold forming the coating layer)/(total mass of Conductive Particles [d1]) of 0.11 and an electric resistance value R of 0.1 Ω.

[Preparation of Conductive Particles [e1]]

The following Conductive Particles [e1] were prepared in the same manner as in the preparation of Conductive Particles [a] except that Magnetic Core Particles [E] were used in place of Magnetic Core Particles [A], and the content of gold in the plating solution of gold was changed.

Conductive Particles [e1] (for Comparison):

Conductive particles having a number average particle diameter of 10 μm, a BET specific surface area of $0.03 \times 10^3$ m$^2$/kg, a thickness t of the coating layer of 54 nm, a value N of (mass of gold forming the coating layer)/(total mass of Conductive Particles [e1]) of 0.05 and an electric resistance value R of 0.15 Ω.

[Preparation of Conductive Particles [f1]]

The following Conductive Particles [f1] were prepared in the same manner as in the preparation of Conductive Particles [a] except that Magnetic Core Particles [F] were used in place of Magnetic Core Particles [A], and the content of gold in the plating solution of gold was changed.

Conductive Particles [f1] (for Comparison):

Conductive particles having a number average particle diameter of 7 μm, a BET specific surface area of $0.7 \times 10^3$ m$^2$/kg, a thickness t of the coating layer of 35 nm, a value N of (mass of gold forming the coating layer)/(total mass of Conductive Particles [f1]) of 0.35 and an electric resistance value R of 0.33 Ω.

[Preparation of Conductive Particles [g1]]

The following Conductive Particles [g1] were prepared in the same manner as in the preparation of Conductive Particles [a] except that Magnetic Core Particles [G] were used in place of Magnetic Core Particles [A], and the content of gold in the plating solution of gold was changed.

Conductive Particles [g1] (for Comparison):

Conductive particles having a number average particle diameter of 11 μm, a BET specific surface area of $0.006 \times 10^3$ m²/kg, a thickness t of the coating layer of 54 nm, a value N of (mass of gold forming the coating layer)/(total mass of Conductive Particles [g1]) of 0.01 and an electric resistance value R of 0.18 Ω.

[Preparation of Conductive Particles [h1]]

The following Conductive Particles [h1] were prepared in the same manner as in the preparation of Conductive Particles [a] except that Magnetic Core Particles [H] were used in place of Magnetic Core Particles [A], and the content of gold in the plating solution of gold was changed.

Conductive Particles [h1] (for Comparison):

Conductive particles having a number average particle diameter of 10 μm, a BET specific surface area of $0.01 \times 10^3$ m²/kg, a thickness t of the coating layer of 23 nm, a value N of (mass of gold forming the coating layer)/(total mass of Conductive Particles [h1]) of 0.01 and an electric resistance value R of 0.08 Ω.

[Preparation of Conductive Particles [i1]]

The following Conductive Particles [i1] were prepared in the same manner as in the preparation of Conductive Particles [a] except that Magnetic Core Particles [I] were used in place of Magnetic Core Particles [A], and the content of gold in the plating solution of gold was changed.

Conductive Particles [i1] (for Comparison):

Conductive particles having a number average particle diameter of 46 μm, a BET specific surface area of $0.56 \times 10^3$ m²/kg, a thickness t of the coating layer of 9.7 nm, a value N of (mass of gold forming the coating layer)/(total mass of Conductive Particles [i1]) of 0.13 and an electric resistance value R of 0.07 Ω.

The properties of the conductive particles prepared and the properties of the magnetic core particles used in the preparation of the conductive particles are shown collectively in the following Table 1.

TABLE 1

| Conductive particles | Kind | Properties of magnetic core particles used | | | | Properties of conductive particles | | | | |
|---|---|---|---|---|---|---|---|---|---|---|
| | | Number average particle diameter (μm) | Coefficient of variation of particle diameter (%) | BET specific surface area (m²/kg) | Saturation magnetization (wb/m²) | Number average particle diameter (μm) | BET specific surface area (m²/kg) | Thickness of coating layer (nm) | Value N of (mass of gold)/ (total mass of conductive particles) | Electric resistance R (Ω) |
| For invention | | | | | | | | | | |
| [a] | [A] | 10 | 10 | $0.2 \times 10^3$ | 0.6 | 12 | $0.15 \times 10^3$ | 111 | 0.3 | 0.025 |
| [b] | [B] | 12 | 40 | $0.1 \times 10^3$ | 0.6 | 13 | $0.08 \times 10^3$ | 129 | 0.2 | 0.1 |
| [c] | [C] | 10 | 10 | $0.038 \times 10^3$ | 0.6 | 14 | $0.015 \times 10^3$ | 299 | 0.18 | 0.12 |
| [d] | [D] | 10 | 15 | $0.15 \times 10^3$ | 0.6 | 12 | $0.12 \times 10^3$ | 134 | 0.28 | 0.015 |
| For comparison | | | | | | | | | | |
| [a1] | [A] | 10 | 10 | $0.2 \times 10^3$ | 0.6 | 12 | $0.17 \times 10^3$ | 35 | 0.12 | 0.13 |
| [c1] | [C] | 10 | 10 | $0.038 \times 10^3$ | 0.6 | 12 | $0.035 \times 10^3$ | 103 | 0.07 | 0.14 |
| [d1] | [D] | 10 | 15 | $0.15 \times 10^3$ | 0.6 | 14 | $0.14 \times 10^3$ | 43 | 0.11 | 0.1 |
| [e1] | [E] | 8 | 32 | $0.05 \times 10^3$ | 0.6 | 10 | $0.03 \times 10^3$ | 54 | 0.05 | 0.15 |
| [f1] | [F] | 6 | 40 | $0.8 \times 10^3$ | 0.6 | 7 | $0.7 \times 10^3$ | 35 | 0.35 | 0.33 |
| [g1] | [G] | 10 | 20 | $0.008 \times 10^3$ | 0.6 | 11 | $0.006 \times 10^3$ | 54 | 0.01 | 0.18 |
| [h1] | [H] | 8 | 25 | $0.02 \times 10^3$ | 0.6 | 10 | $0.01 \times 10^3$ | 23 | 0.01 | 0.08 |
| [i1] | [I] | 45 | 33 | $0.8 \times 10^3$ | 0.6 | 46 | $0.56 \times 10^3$ | 9.7 | 0.13 | 0.07 |

[Polymeric Substance-Forming Material]

Addition type liquid silicone rubber of a two-pack type having its corresponding properties shown in the following Table 2 was provided as a polymeric substance-forming material, which will become an elastic polymeric substance by being cured.

TABLE 2

| | Viscosity (Pa·s) | | Cured product | | |
|---|---|---|---|---|---|
| | Solution (A) | Solution (B) | Compression set (%) | Durometer A hardness | Tear Strength (kN/m) |
| Silicone rubber (1) | 250 | 250 | 5 | 32 | 25 |
| Silicone rubber (2) | 500 | 500 | 6 | 42 | 30 |
| Silicone rubber (3) | 1000 | 1000 | 6 | 52 | 35 |

The properties of the addition type liquid silicone rubber shown in the above Table 2 were determined in the following manner.

(1) Viscosity of Addition Type Liquid Silicone Rubber:

A viscosity at 23±2° C. was measured by a Brookfield viscometer.

(2) Compression Set of Cured Silicone Rubber:

Solution A and Solution B in addition type liquid silicone rubber of the two-pack type were stirred and mixed in proportions that their amounts become equal. After this mixture was then poured into a mold and subjected to a defoaming treatment by pressure reduction, a curing treatment was conducted under conditions of 120° C. for 30 minutes, thereby producing a columnar body having a thickness of 12.7 mm and a diameter of 29 mm and composed of cured silicone rubber. The columnar body was post-cured under conditions of 200° C. for 4 hours. The columnar body thus obtained was used as a specimen to measure its compression set at 150±2° C. in accordance with JIS K 6249.

(3) Tear Strength of Cured Silicone Rubber:

A curing treatment and post-curing of addition type liquid silicone rubber were conducted under the same conditions as in the item (1), thereby producing a sheet having a thickness of 2.5 mm. A crescent type specimen was prepared by punching from this sheet to measure its tear strength at 23±2° C. in accordance with JIS K 6249.

(4) Durometer A Hardness:

Five sheets produced in the same manner as in the item (3) were stacked on one another, and the resultant laminate was used as a specimen to measure its durometer A hardness at 23±2° C. in accordance with JIS K 6249.

[Production of Wafer for Test]

Figure 17:
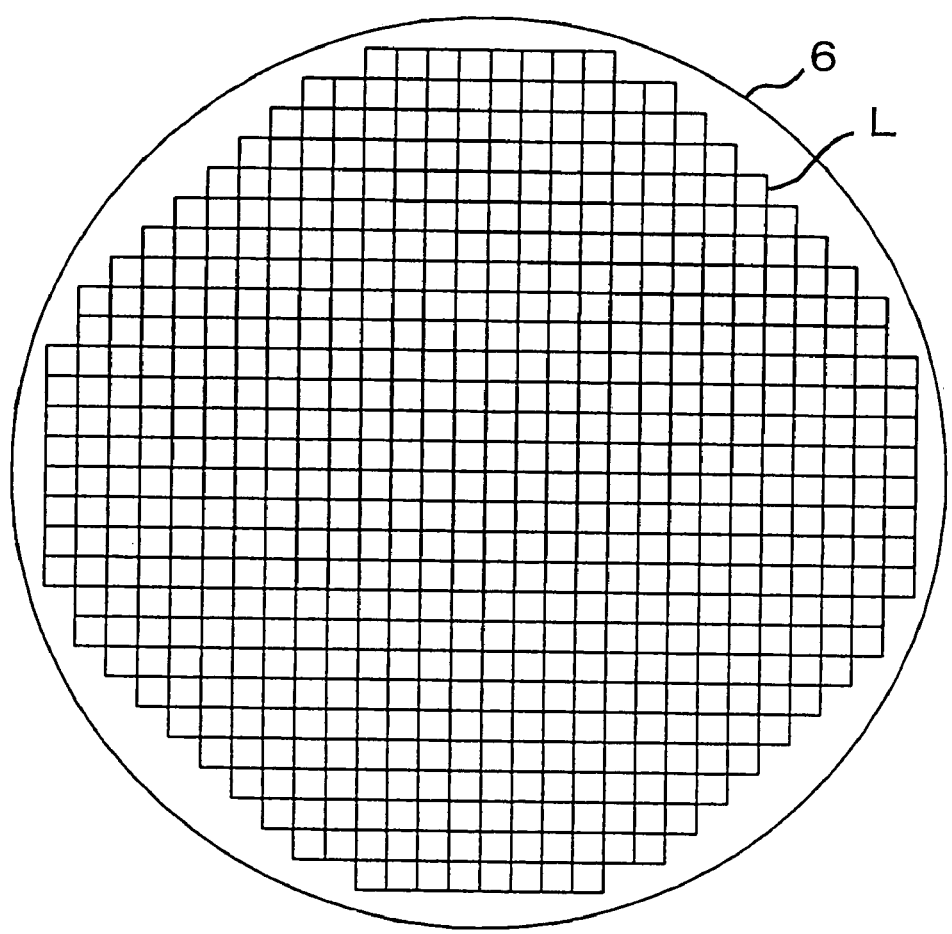
FIG. 17 is a top view of a wafer for test used in Examples.
Figure 18:
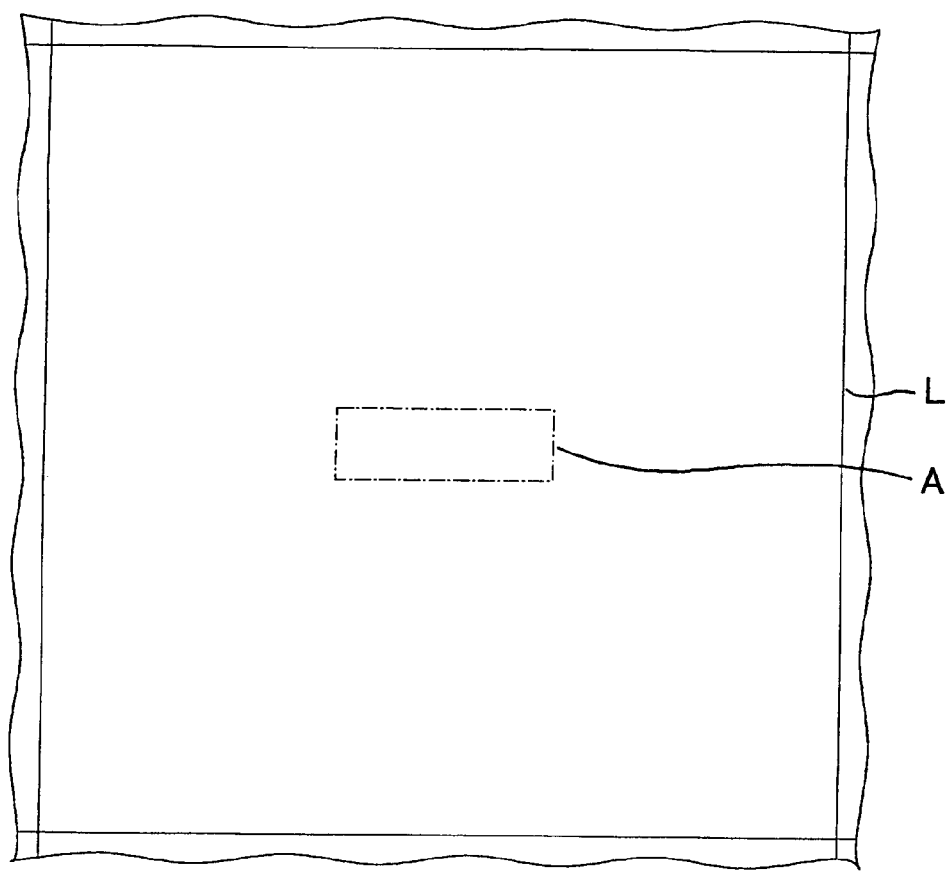
FIG. 18 illustrates a position of a region of electrodes to be inspected in an integrated circuit formed on the wafer for test shown in FIG. 17.
Figure 19:
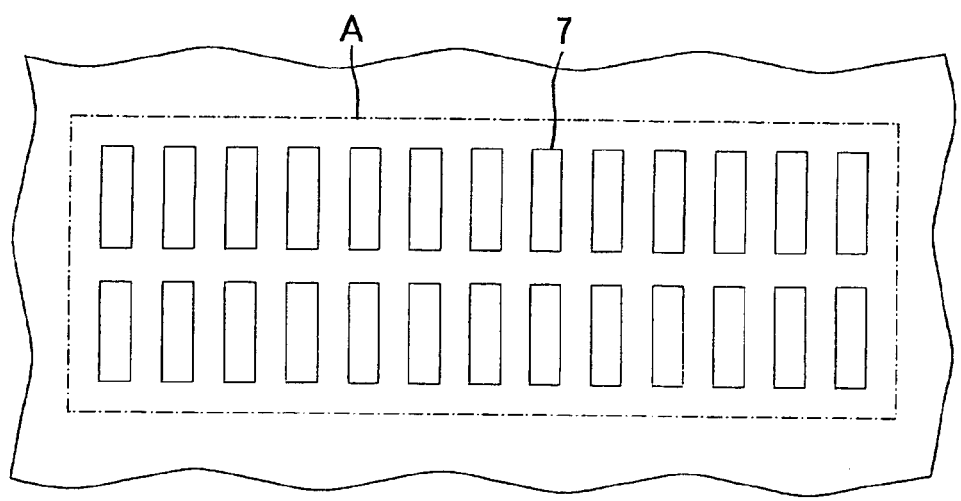
FIG. 19 illustrates the electrodes to be inspected in the integrated circuit formed on the wafer for test shown in FIG. 17.

As illustrated in FIG. 17, 596 square integrated circuits L in total, which each had dimensions of 6.5 mm×6.5 mm, were formed on a wafer 6 made of silicon (coefficient of linear thermal expansion: $3.3 \times 10^{-6}$/K) and having a diameter of 8 inches. Each of the integrated circuits L formed on the wafer 6 has a region A of electrodes to be inspected at its center as illustrated in FIG. 18. In the region A of the electrodes to be inspected, as illustrated in FIG. 19, 26 rectangular electrodes 7 to be inspected each having dimensions of 200 µm in a vertical direction (upper and lower direction in FIG. 19) and 80 µm in a lateral direction (left and right direction in FIG. 19) are arranged at a pitch of 120 µm in 2 lines (the number of electrodes 7 to be inspected in a line: 13) in the lateral direction. A clearance between electrodes 7 to be inspected adjacent in the vertical direction is 450 µm. Every two electrodes among the 26 electrodes 7 to be inspected are electrically connected to each other. The total number of the electrodes 7 to be inspected in the whole wafer is 15,496. This wafer will hereinafter be referred to as "Wafer W1 for test".

On the other hand, 225 square integrated circuits L in total, which each had dimensions of 6.5 mm×6.5 mm, were formed on a wafer made of silicon and having a diameter of 6 inches. Each of the integrated circuits formed on the wafer 6 has a region of electrodes to be inspected at its center. In the region of the electrodes to be inspected, 50 rectangular electrodes to be inspected each having dimensions of 100 µm in a vertical direction and 50 µm in a lateral direction are arranged at a pitch of 100 µm in 2 lines (the number of electrodes to be inspected in a line: 25) in the lateral direction. A clearance between electrodes to be inspected adjacent in the vertical direction is 350 µm. Every two electrodes among the 50 electrodes to be inspected are electrically connected to each other. The total number of the electrodes to be inspected in the whole wafer is 11,250. This wafer will hereinafter be referred to as "Wafer W2 for test".

EXAMPLE 1

Figure 20:
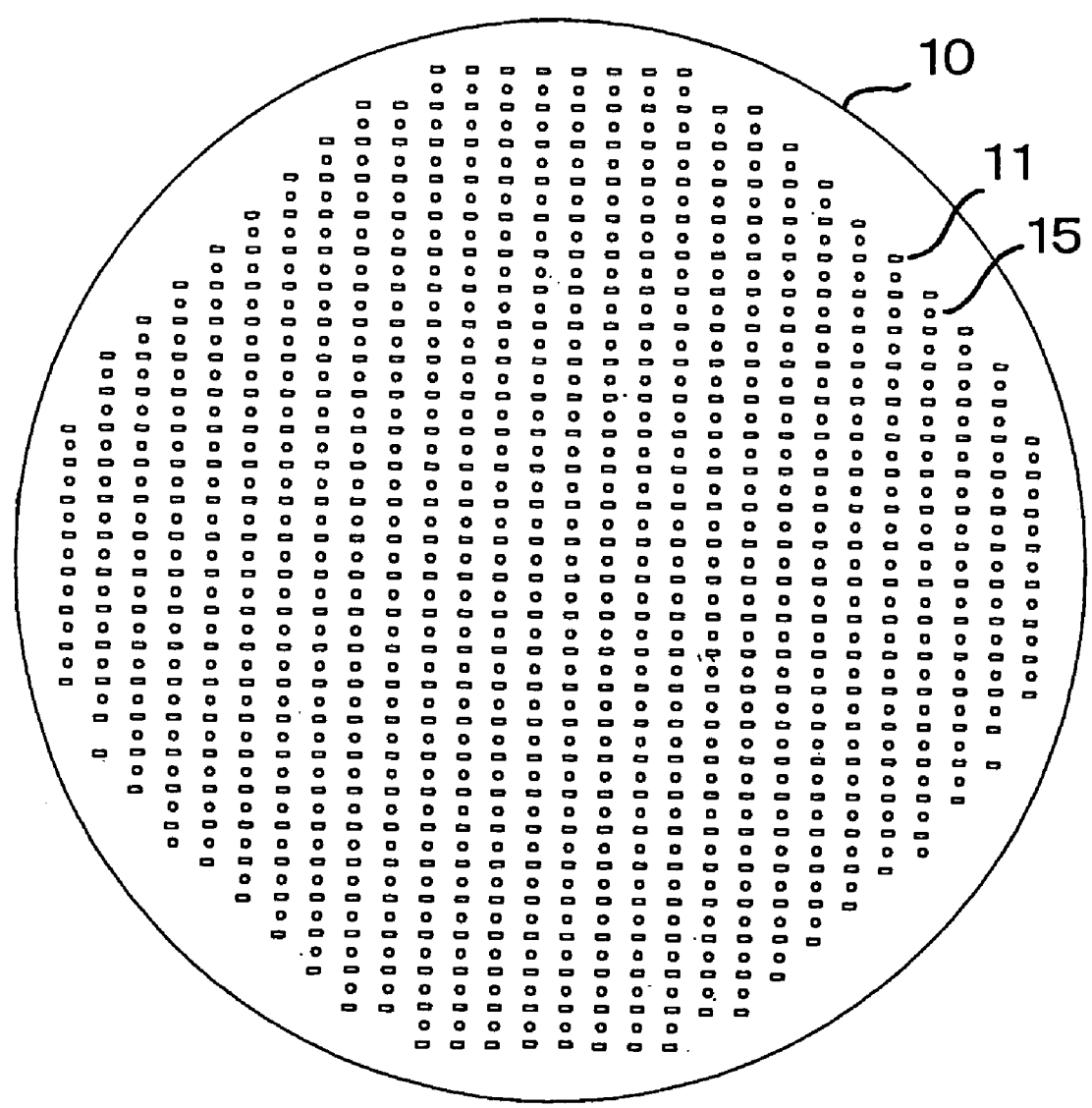
FIG. 20 is a top view of a frame plate produced in Example.
Figure 21:
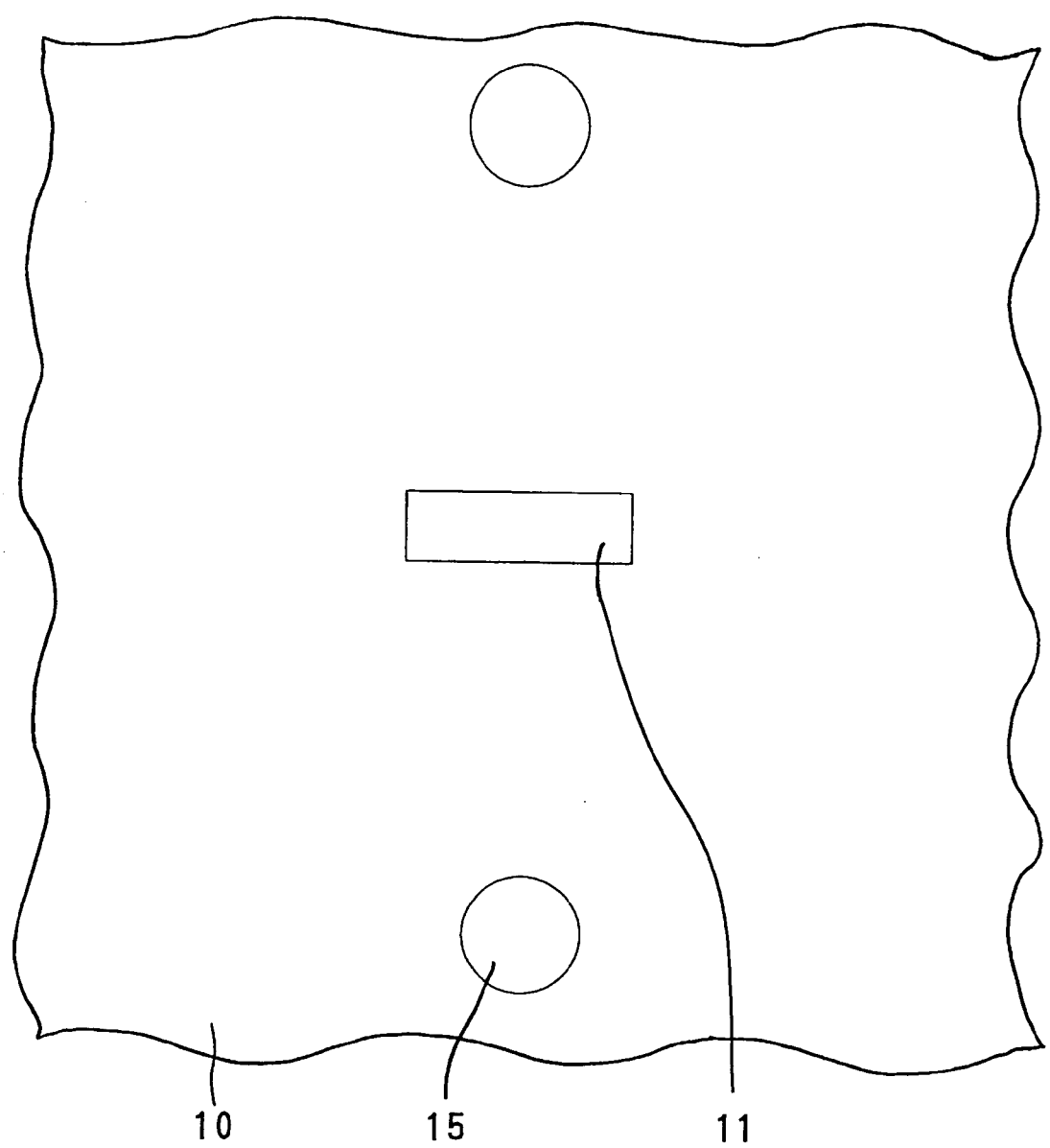
FIG. 21 illustrates, on an enlarged scale, a part of the frame plate shown in FIG. 20.

(1) Frame Plate:

A frame plate having a diameter of 8 inches and 596 anisotropically conductive film-arranging holes formed correspondingly to the respective regions of the electrodes to be inspected in Wafer W1 for test described above was produced under the following conditions in accordance with the construction shown in FIGS. 20 and 21.

A material of this frame plate 10 is covar (saturation magnetization: 1.4 Wb/m²; coefficient of linear thermal expansion: $5 \times 10^{-6}$/K), and the thickness thereof is 60 µm.

The anisotropically conductive film-arranging holes 11 each have dimensions of 1,800 µm in a lateral direction (left and right direction in FIGS. 20 and 21) and 600 µm in a vertical direction (upper and lower direction in FIGS. 20 and 21).

A circular air circulating hole 15 is formed at a central position between anisotropically conductive film-arranging holes 11 adjacent in the vertical direction, and the diameter thereof is 1,000 µm.

(2) Spacer:

Two spacers for molding elastic anisotropically conductive films, which respectively have a plurality of through-holes formed correspondingly to the regions of the electrodes to be inspected in Wafer W1 for test, were produced under the following conditions.

A material of these spacers is stainless steel (SUS304), and the thickness thereof is 20 µm.

The through-hole corresponding to each region of the electrodes to be inspected has dimensions of 2,500 µm in the lateral direction and 1,400 µm in the vertical direction.

Figure 22:
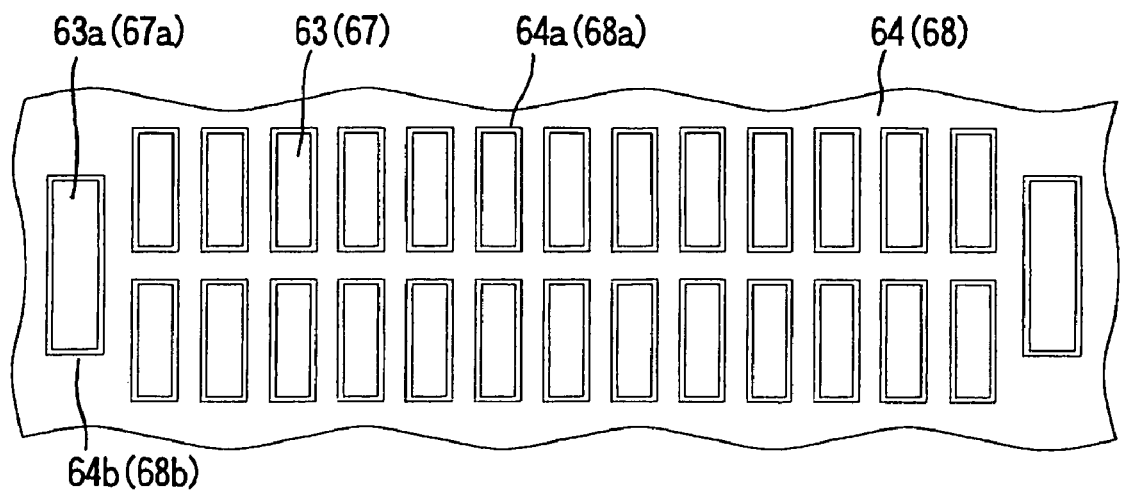
FIG. 22 illustrates a molding surface of a mold produced in Example on an enlarged scale.
Figure 23:
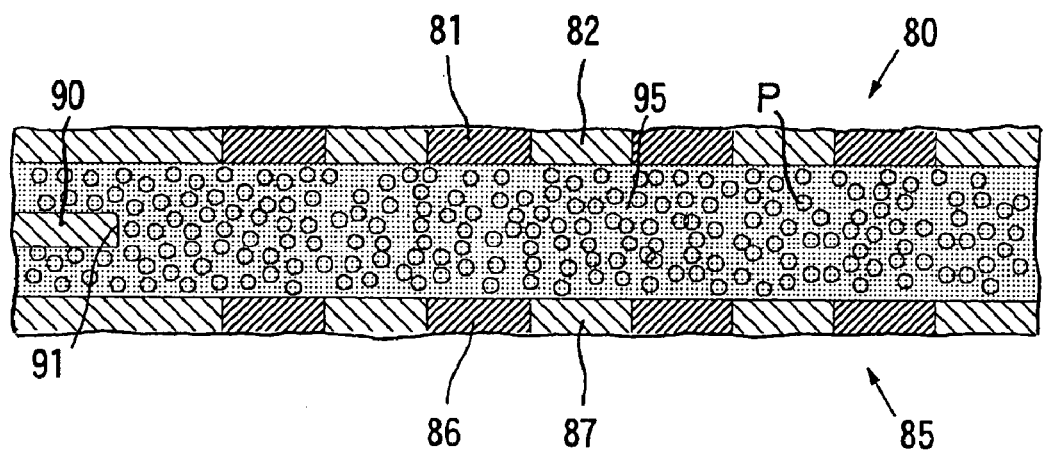
FIG. 23 is a cross-sectional view illustrating a state that a frame plate has been arranged within a mold in a process for producing a conventional anisotropically conductive connector, and moreover a molding material layer has been formed.

(3) Mold:

A mold for molding elastic anisotropically conductive films was produced under the following conditions in accordance with the construction shown in FIGS. 7 and 22.

A top force 61 and a bottom force 65 in this mold respectively have base plates 62 and 66 made of iron and each having a thickness of 6 mm. On the base plate 62, 66, ferromagnetic substance layers 63 (67) for forming conductive parts for connection and ferromagnetic substance layers 63a (67a) for forming conductive parts for non-connection, which are made of nickel, are arranged in accordance with a pattern corresponding to a pattern of the electrodes to be inspected in Wafer W1 for test. More specifically, the dimensions of each of the ferromagnetic substance layers 63 (67) for forming conductive parts for connection are 60 µm (lateral direction)×200 µm (vertical direction)×100 µm (thickness), and 26 ferromagnetic substance layers 63 (67) are arranged at a pitch of 120 µm in 2 lines (the number of ferromagnetic substance layers 63 (67) in a line: 13; clearance between ferromagnetic substance layers 63 (67) adjacent in the vertical direction: 450 µm) in the lateral direction. The ferromagnetic substance layers 63a (67a) for forming conductive parts for non-connection are arranged outside the ferromagnetic substance layers 63 (67) located most outside in a direction that the ferromagnetic substance layers 63 (67) are arranged. The dimensions of each of the ferromagnetic substance layers 63a (67a) are 80 µm (lateral direction)×300 µm (vertical direction)×100 µm (thickness).

Corresponding to the regions of the electrodes to be inspected in Wafer W1 for test, are formed 596 regions in total, in each of which 26 ferromagnetic substance layers 63 (67) for forming conductive parts for connection and 2 ferromagnetic substance layers 63a (67a) for forming conductive parts for non-connection have been formed. In the whole base plate, are formed 15,496 ferromagnetic substance layers 63 (67) for forming conductive parts for connection and 1,192 ferromagnetic substance layers 63a (67a) for forming conductive parts for non-connection.

Non-magnetic substance layers 64 (68) are formed by subjecting dry film resists to a curing treatment. The dimensions of each of recessed parts 64a (68a), at which the ferromagnetic substance layer 63 (67) for forming the conductive part for connection is located, are 70 µm (lateral direction)×210 µm (vertical direction)×25 µm (depth), the dimensions of each of recessed parts 64b (68b), at which the ferromagnetic substance layer 63a (67a) for forming the conductive part for non-connection is located, are 90 µm (lateral direction)×260 µm (vertical direction)×25 µm (depth), and the thickness of other portions than the recessed parts is 125 µm (the thickness of the recessed parts: 100 µm).

(4) Elastic Anisotropically Conductive Film:

The above-described frame plate, spacers and mold were used to form elastic anisotropically conductive films in the frame plate in the following manner.

To 100 parts by weight of Silicone Rubber (1) were added and mixed 30 parts by weight of Conductive Particles [a]. Thereafter, the resultant mixture was subjected to a defoaming treatment by pressure reduction, thereby preparing a conductive paste composition. This conductive paste composition will be referred to as "Paste (1-a)".

Paste (1-a) prepared as a molding material for elastic anisotropically conductive films was applied to the surfaces of the top force and bottom force of the mold by screen printing, thereby forming molding material layers in accordance with a pattern of the elastic anisotropically conductive films to be formed, and the frame plate was superimposed in alignment on the molding surface of the bottom force through the spacer on the side of the bottom force. Further, the top force was superimposed in alignment on the frame plate through the spacer on the side of the top force.

The molding material layers formed between the top force and the bottom force were subjected to a curing treatment under conditions of 100° C. for 1 hour while applying a magnetic field of 2 T to portions located between the corresponding ferromagnetic substance layers in the thickness-wise direction by electromagnets, thereby forming an elastic anisotropically conductive film in each of the anisotropically conductive film-arranging holes of the frame plate, thus producing an anisotropically conductive connector. This anisotropically conductive connector will hereinafter be referred to as "Anisotropically Conductive Connector C1".

The elastic anisotropically conductive films thus obtained will be described specifically. Each of the elastic anisotropically conductive films has dimensions of 2,500 µm in the lateral direction and 1,400 µm in the vertical direction. In a functional part in each of the elastic anisotropically conductive films, 26 conductive parts for connection are arranged at a pitch of 120 µm in 2 lines (the number of conductive parts for connection in a line: 13; clearance between conductive parts for connection adjacent in the vertical direction: 450 µm). The dimensions of each of the conductive parts for connection are 60 µm in the lateral direction, 200 µm in the vertical direction and 150 µm in thickness. The thickness of the insulating part in the functional part is 100 µm. Conductive parts for non-connection are arranged between the conductive parts for connection located most outside in the lateral direction and the frame plate. The dimensions of each of the conductive parts for non-connection are 80 µm in the lateral direction, 300 µm in the vertical direction and 150 µm in thickness. The thickness (thickness of one of the forked portions) of the part to be supported in each of the elastic anisotropically conductive films is 20 µm.

The content of the conductive particles in the conductive parts for connection in each of the elastic anisotropically conductive films of Anisotropically Conductive Connector C1 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

(5) Circuit Board for Inspection:

Alumina ceramic (coefficient of linear thermal expansion: $4.8 \times 10^{-6}$/K) was used as a base material to produce a circuit board for inspection, in which inspection electrodes had been formed in accordance with a pattern corresponding to the pattern of the electrodes to be inspected in Wafer W1 for test. This circuit board for inspection is rectangular with dimensions of 30 cm×30 cm as a whole. The inspection electrodes thereof each have dimensions of 60 µm in the lateral direction and 200 µm in the vertical direction. This circuit board for inspection will hereinafter be referred to as "Inspection Circuit Board T1".

(6) Sheet-Like Connector:

A laminate material obtained by laminating a copper layer having a thickness of 15 µm on one surface of an insulating sheet formed of polyimide and having a thickness of 20 µm was provided, and 15,496 through-holes each extending through in the thickness-wise direction of the insulating sheet and having a diameter of 30 µm were formed in the insulating sheet of the laminate material in accordance with a pattern corresponding to the pattern of electrodes to be inspected in Wafer W1 for test by subjecting the insulating sheet to laser machining. This laminate material was then subjected to photolithography and plating treatment with nickel, whereby short circuit parts integrally connected to the copper layer were formed in the through-holes in the insulating sheet, and at the same time, projected front-surface electrode parts integrally connected to the respective short circuit parts were formed on the front surface of the insulating sheet. The diameter of each of the front-surface electrode parts was 40 µm, and the height from the surface of the insulating sheet was 20 µm. Thereafter, the copper layer of the laminate material was subjected to a photo-etching treatment to remove a part thereof, thereby forming rectangular back-surface electrode parts each having dimensions of 70 µm×210 µm. Further, the front-surface electrode parts and back-surface electrode parts were subjected to a plating treatment with gold, thereby forming electrode structures, thus producing a sheet-like connector. This sheet-like connector will hereinafter be referred to as "Sheet-like Connector M1".

(7) Test 1:

Wafer W1 for test was arranged on a test table equipped with an electric heater, and Anisotropically Conductive Connector C1 was arranged on this Wafer W1 for test in alignment in such a manner that the conductive parts for connection thereof are located on the respective electrodes to be inspected of Wafer W1 for test. Inspection Circuit Board T1 was then arranged on this Anisotropically Conductive Connector C1 in alignment in such a manner that the inspection electrodes thereof are located on the respective conductive parts for connection of Anisotropically Conductive Connector C1. Further, Inspection Circuit Board T1 was pressurized downward under a load of 32 kg (load applied to every conductive part for connection: about 2 g on the average). An electric resistance between 2 inspection electrodes electrically connected to each other through Anisotropically Conductive Connector C1 and Wafer W1 for test among the 15,496 inspection electrodes in Inspection Circuit Board T1 was successively measured at room temperature (25° C.) to record a half of the electric resistance value measured as an electric resistance (hereinafter referred to as "conduction resistance") of the conductive part for connection in Anisotropically Conductive Connector C1, thereby counting the number of conductive parts for connection that the conduction resistance was 1 Ω or higher. The above-described process is referred to as "Process (1)".

After a load for pressurizing Inspection Circuit Board T1 was then changed to 126 kg (load applied to every conductive part for connection: about 8 g on the average), the test table was heated to 125° C. After the temperature of the test table became stable, the conduction resistance of the conductive parts for connection in Anisotropically Conductive Connector C1 was measured in the same manner as in Process (1) to count the number of conductive parts for connection that the conduction resistance was 1 Ω or higher. Thereafter, the test table was left to stand for 1 hour in this state. The above-described process is referred to as "Process (2)".

After the test table was cooled to room temperature, the pressure against the circuit board for inspection was released. The above-described process is referred to as "Process (3)".

The above-described Processes (1), (2) and (3) were regarded as a cycle, and the cycle was continuously repeated 500 times in total.

In the above-described test, those that the conduction resistance of the conductive parts for connection is 1 Ω or higher are difficult to be actually used in electrical inspection of integrated circuits formed on a wafer.

The results are shown in the following Table 3.

(8) Test 2:

A conduction resistance of the conductive parts for connection was measured in the same manner as in Test 1 except that Sheet-like Connector M1 was arranged on Wafer W1 for test arranged on the test table in alignment in such a manner that the front-surface electrode parts thereof are located on the electrodes to be inspected of Wafer W1 for test, Anisotropically Conductive Connector C1 was arranged on Sheet-like Connector M1 in alignment in such a manner that the conductive parts for connection thereof are located on the back-surface electrode parts in Sheet-like Connector M1, and Inspection Circuit Board T1 was pressurized downward under a load of 63 kg (load applied to every conductive part for connection: about 4 g on the average), thereby the number of conductive parts for connection that the conduction resistance was 1 Ω or higher was counted.

The results are shown in the following Table 4.

EXAMPLE 2

A conductive paste composition was prepared in the same manner as in Example 1 except that Conductive Particles [b] were used in place of Conductive Particles [a]. This conductive paste composition will be referred to as "Paste (1-b)".

An anisotropically conductive connector was produced in the same manner as in Example 1 except that Paste (1-b) was used in place of Paste (1-a). This anisotropically conductive connector will hereinafter be referred to as "Anisotropically Conductive Connector C2".

The content of the conductive particles in the conductive parts for connection in each of the elastic anisotropically conductive films of Anisotropically Conductive Connector C2 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C2 was used in place of Anisotropically Conductive Connector C1. The results are shown in the following Tables 3 and 4.

EXAMPLE 3

A conductive paste composition was prepared in the same manner as in Example 1 except that Conductive Particles [c] were used in place of Conductive Particles [a]. This conductive paste composition will be referred to as "Paste (1-c)".

An anisotropically conductive connector was produced in the same manner as in Example 1 except that Paste (1-c) was used in place of Paste (1-a). This anisotropically conductive connector will hereinafter be referred to as "Anisotropically Conductive Connector C3".

The content of the conductive particles in the conductive parts for connection in each of the elastic anisotropically conductive films of Anisotropically Conductive Connector C3 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C3 was used in place of Anisotropically Conductive Connector C1. The results are shown in the following Tables 3 and 4.

EXAMPLE 4

A conductive paste composition was prepared in the same manner as in Example 1 except that Conductive Particles [d] were used in place of Conductive Particles [a]. This conductive paste composition will be referred to as "Paste (1-d)".

An anisotropically conductive connector was produced in the same manner as in Example 1 except that Paste (1-d) was used in place of Paste (1-a). This anisotropically conductive connector will hereinafter be referred to as "Anisotropically Conductive Connector C4".

The content of the conductive particles in the conductive parts for connection in each of the elastic anisotropically conductive films of Anisotropically Conductive Connector C4 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C4 was used in place of Anisotropically Conductive Connector C1. The results are shown in the following Tables 3 and 4.

COMPARATIVE EXAMPLE 1

A conductive paste composition was prepared in the same manner as in Example 1 except that Conductive Particles [a1] were used in place of Conductive Particles [a]. This conductive paste composition will be referred to as "Paste (1-a1)".

An anisotropically conductive connector was produced in the same manner as in Example 1 except that Paste (1-a1) was used in place of Paste (1-a). This anisotropically conductive connector will hereinafter be referred to as "Anisotropically Conductive Connector C11".

The content of the conductive particles in the conductive parts for connection in each of the elastic anisotropically conductive films of Anisotropically Conductive Connector C11 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C11 was used in place of Anisotropically Conductive Connector C1. The results are shown in the following Tables 3 and 4.

COMPARATIVE EXAMPLE 2

A conductive paste composition was prepared in the same manner as in Example 1 except that Conductive Particles [c1] were used in place of Conductive Particles [a]. This conductive paste composition will be referred to as "Paste (1-c1)".

An anisotropically conductive connector was produced in the same manner as in Example 1 except that Paste (1-c1) was used in place of Paste (1-a). This anisotropically conductive connector will hereinafter be referred to as "Anisotropically Conductive Connector C12".

The content of the conductive particles in the conductive parts for connection in each of the elastic anisotropically conductive films of Anisotropically Conductive Connector C12 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C12 was used in place of Anisotropically Conductive Connector C1. The results are shown in the following Tables 3 and 4.

COMPARATIVE EXAMPLE 3

A conductive paste composition was prepared in the same manner as in Example 1 except that Conductive Particles [d1] were used in place of Conductive Particles [a]. This conductive paste composition will be referred to as "Paste (1-d1)".

An anisotropically conductive connector was produced in the same manner as in Example 1 except that Paste (1-d1) was used in place of Paste (1-a). This anisotropically conductive connector will hereinafter be referred to as "Anisotropically Conductive Connector C13".

The content of the conductive particles in the conductive parts for connection in each of the elastic anisotropically conductive films of Anisotropically Conductive Connector C13 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C13 was used in place of Anisotropically Conductive Connector C1. The results are shown in the following Tables 3 and 4.

COMPARATIVE EXAMPLE 4

A conductive paste composition was prepared in the same manner as in Example 1 except that Conductive Particles [e1] were used in place of Conductive Particles [a]. This conductive paste composition will be referred to as "Paste (1-e1)".

An anisotropically conductive connector was produced in the same manner as in Example 1 except that Paste (1-e1) was used in place of Paste (1-a). This anisotropically conductive connector will hereinafter be referred to as "Anisotropically Conductive Connector C14".

The content of the conductive particles in the conductive parts for connection in each of the elastic anisotropically conductive films of Anisotropically Conductive Connector C14 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C14 was used in place of Anisotropically Conductive Connector C1. The results are shown in the following Tables 3 and 4.

COMPARATIVE EXAMPLE 5

A conductive paste composition was prepared in the same manner as in Example 1 except that Conductive Particles [f1] were used in place of Conductive Particles [a]. This conductive paste composition will be referred to as "Paste (1-f1)".

An anisotropically conductive connector was produced in the same manner as in Example 1 except that Paste (1-f1) was used in place of Paste (1-a). This anisotropically conductive connector will hereinafter be referred to as "Anisotropically Conductive Connector C15".

The content of the conductive particles in the conductive parts for connection in each of the elastic anisotropically conductive films of Anisotropically Conductive Connector C15 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C15 was used in place of Anisotropically Conductive Connector C1. The results are shown in the following Tables 3 and 4.

COMPARATIVE EXAMPLE 6

A conductive paste composition was prepared in the same manner as in Example 1 except that Conductive Particles [g1] were used in place of Conductive Particles [a]. This conductive paste composition will be referred to as "Paste (1-g1)".

An anisotropically conductive connector was produced in the same manner as in Example 1 except that Paste (1-g1) was used in place of Paste (1-a). This anisotropically conductive connector will hereinafter be referred to as "Anisotropically Conductive Connector C16".

The content of the conductive particles in the conductive parts for connection in each of the elastic anisotropically conductive films of Anisotropically Conductive Connector C16 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C16 was used in place of Anisotropically Conductive Connector C1. The results are shown in the following Tables 3 and 4.

COMPARATIVE EXAMPLE 7

A conductive paste composition was prepared in the same manner as in Example 1 except that Conductive Particles [h1] were used in place of Conductive Particles [a]. This conductive paste composition will be referred to as "Paste (1-h1)".

An anisotropically conductive connector was produced in the same manner as in Example 1 except that Paste (1-h1) was used in place of Paste (1-a). This anisotropically conductive connector will hereinafter be referred to as "Anisotropically Conductive Connector C17".

The content of the conductive particles in the conductive parts for connection in each of the elastic anisotropically conductive films of Anisotropically Conductive Connector C17 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C17 was used in place of Anisotropically Conductive Connector C1. The results are shown in the following Tables 3 and 4.

COMPARATIVE EXAMPLE 8

A conductive paste composition was prepared in the same manner as in Example 1 except that Conductive Particles [i1] were used in place of Conductive Particles [a]. This conductive paste composition will be referred to as "Paste (1-i1)".

An anisotropically conductive connector was produced in the same manner as in Example 1 except that Paste (1-i1) was used in place of Paste (1-a). This anisotropically conductive connector will hereinafter be referred to as "Anisotropically Conductive Connector C18".

The content of the conductive particles in the conductive parts for connection in each of the elastic anisotropically conductive films of Anisotropically Conductive Connector C18 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 1 and Test 2 were conducted in the same manner as in Example 1 except that Anisotropically Conductive Connector C18 was used in place of Anisotropically Conductive Connector C1. The results are shown in the following Tables 3 and 4.

TABLE 3

| | Number of cycles | 1 | 20 | 50 | 100 | 200 | 300 | 400 | 500 |
|---|---|---|---|---|---|---|---|---|---|
| | | \multicolumn{8}{c}{Number of conductive parts for connection that conduction resistance was 1 Ω or higher (count)} | | | | | | | |
| Example 1 | Room temperature, 32 kg | 0 | 0 | 0 | 0 | 0 | 0 | 0 | 0 |
| | 125° C., 126 kg | 0 | 0 | 0 | 0 | 0 | 0 | 0 | 0 |
| Example 2 | Room temperature, 32 kg | 0 | 0 | 0 | 0 | 34 | 96 | 218 | 602 |
| | 125° C., 126 kg | 0 | 0 | 0 | 0 | 8 | 26 | 76 | 188 |
| Example 3 | Room temperature, 32 kg | 0 | 0 | 0 | 0 | 0 | 70 | 248 | 1036 |
| | 125° C., 126 kg | 0 | 0 | 0 | 0 | 0 | 24 | 84 | 372 |
| Example 4 | Room temperature, 32 kg | 0 | 0 | 0 | 0 | 0 | 0 | 0 | 0 |
| | 125° C., 126 kg | 0 | 0 | 0 | 0 | 0 | 0 | 0 | 0 |
| Comparative Example 1 | Room temperature, 32 kg | 0 | 0 | 242 | 698 | 404 | 1328 | 2918 | — |
| | 125° C., 126 kg | 0 | 0 | 36 | 74 | 234 | 538 | 982 | 1538 |
| Comparative Example 2 | Room temperature, 32 kg | 0 | 0 | 74 | 88 | 382 | 1004 | 2104 | — |
| | 125° C., 126 kg | 0 | 0 | 42 | 54 | 198 | 418 | 842 | 1378 |
| Comparative Example 3 | Room temperature, 32 kg | 0 | 0 | 0 | 28 | 78 | 104 | 732 | 1538 |
| | 125° C., 126 kg | 0 | 0 | 0 | 16 | 42 | 372 | 544 | 1172 |
| Comparative Example 4 | Room temperature, 32 kg | 0 | 0 | 0 | 0 | 108 | 318 | 1298 | 4984 |
| | 125° C., 126 kg | 0 | 0 | 0 | 0 | 36 | 104 | 458 | 1634 |
| Comparative Example 5 | Room temperature, 32 kg | 0 | 0 | 0 | 0 | 258 | 1014 | 3270 | — |
| | 125° C., 126 kg | 0 | 0 | 0 | 0 | 88 | 346 | 1032 | 3078 |
| Comparative Example 6 | Room temperature, 32 kg | 0 | 0 | 48 | 116 | 458 | 1824 | — | — |
| | 125° C., 126 kg | 0 | 0 | 18 | 42 | 158 | 574 | 2014 | — |
| Comparative Example 7 | Room temperature, 32 kg | 0 | 598 | 2612 | 7054 | — | — | — | — |
| | 125° C., 126 kg | 0 | 198 | 894 | 2364 | — | — | — | — |
| Comparative Example 8 | Room temperature, 32 kg | 0 | 0 | 24 | 42 | 138 | 504 | 1218 | 2514 |
| | 125° C., 126 kg | 0 | 0 | 16 | 24 | 72 | 372 | 694 | 1238 |

TABLE 4

| | Number of cycles | 1 | 20 | 50 | 100 | 200 | 300 | 400 | 500 |
|---|---|---|---|---|---|---|---|---|---|
| | | \multicolumn{8}{c}{Number of conductive parts for connection that conduction resistance was 1 Ω or higher (count)} | | | | | | | |
| Example 1 | Room temperature, 63 kg | 0 | 0 | 0 | 0 | 0 | 0 | 0 | 0 |
| | 125° C., 126 kg | 0 | 0 | 0 | 0 | 0 | 0 | 0 | 0 |
| Example 2 | Room temperature, 63 kg | 0 | 0 | 0 | 0 | 16 | 48 | 150 | 374 |
| | 125° C., 126 kg | 0 | 0 | 0 | 0 | 10 | 24 | 80 | 202 |
| Example 3 | Room temperature, 63 kg | 0 | 0 | 0 | 0 | 0 | 50 | 164 | 754 |
| | 125° C., 126 kg | 0 | 0 | 0 | 0 | 0 | 22 | 90 | 362 |
| Example 4 | Room temperature, 63 kg | 0 | 0 | 0 | 0 | 0 | 0 | 0 | 0 |
| | 125° C., 126 kg | 0 | 0 | 0 | 0 | 0 | 0 | 0 | 0 |
| Comparative example 1 | Room temperature, 63 kg | 0 | 0 | 78 | 92 | 132 | 194 | 294 | 532 |
| | 125° C., 126 kg | 0 | 0 | 52 | 68 | 102 | 172 | 262 | 414 |
| Comparative example 2 | Room temperature, 63 kg | 0 | 0 | 44 | 92 | 344 | 806 | 2514 | — |
| | 125° C., 126 kg | 0 | 0 | 32 | 54 | 232 | 442 | 1318 | 2594 |
| Comparative example 3 | Room temperature, 63 kg | 0 | 0 | 0 | 14 | 58 | 154 | 376 | 1214 |
| | 125° C., 126 kg | 0 | 0 | 0 | 10 | 44 | 102 | 302 | 710 |
| Comparative example 4 | Room temperature, 63 kg | 0 | 0 | 0 | 0 | 58 | 216 | 924 | 3174 |
| | 125° C., 126 kg | 0 | 0 | 0 | 0 | 34 | 102 | 454 | 1596 |
| Comparative example 5 | Room temperature, 63 kg | 0 | 0 | 0 | 0 | 166 | 702 | 2066 | — |
| | 125° C., 126 kg | 0 | 0 | 0 | 0 | 82 | 352 | 1016 | 3014 |

TABLE 4-continued

| | | Number of conductive parts for connection that conduction resistance was 1 Ω or higher (count) | | | | | | | |
|---|---|---|---|---|---|---|---|---|---|
| Number of cycles | | 1 | 20 | 50 | 100 | 200 | 300 | 400 | 500 |
| Comparative example 6 | Room temperature, 63 kg | 0 | 0 | 36 | 84 | 314 | 1154 | 4058 | — |
| | 125° C., 126 kg | 0 | 0 | 18 | 44 | 162 | 568 | 2002 | — |
| Comparative example 7 | Room temperature, 63 kg | 0 | 146 | 596 | 1046 | 4564 | — | — | — |
| | 125° C., 126 kg | 0 | 204 | 904 | 2402 | — | — | — | — |
| Comparative example 8 | Room temperature, 63 kg | 0 | 0 | 26 | 48 | 106 | 242 | 518 | 1936 |
| | 125° C., 126 kg | 0 | 0 | 12 | 31 | 82 | 196 | 426 | 1518 |

As apparent from the results shown in Tables 3 and 4, it was confirmed that according to Anisotropically Conductive Connector C1 to Anisotropically Conductive Connector C4 of Example 1 to Example 4, good conductivity is achieved in the conductive parts for connection in the elastic anisotropically conductive films even when the pitch of the conductive parts for connection is small, a good electrically connected state is stably retained even by environmental changes such as thermal hysteresis by temperature change, and good conductivity is retained over a long period of time even when used repeatedly under a high-temperature environment.

EXAMPLE 5

(1) Frame Plate:

A frame plate having a diameter of 6 inches and 225 anisotropically conductive film-arranging holes formed correspondingly to the respective regions of the electrodes to be inspected in Wafer W2 for test described above was produced under the following conditions.

A material of this frame plate is covar (saturation magnetization: 1.4 Wb/m$^2$; coefficient of linear thermal expansion: 5×10$^{-6}$/K), and the thickness thereof is 80 μm.

The anisotropically conductive film-arranging holes each have dimensions of 2,740 μm in a lateral direction and 600 μm in a vertical direction.

A circular air circulating hole is formed at a central position between anisotropically conductive film-arranging holes adjacent in the vertical direction, and the diameter thereof is 1,000 μm.

(2) Spacer:

Two spacers for molding elastic anisotropically conductive films, which respectively have a plurality of through-holes formed correspondingly to the regions of the electrodes to be inspected in Wafer W2 for test, were produced under the following conditions.

A material of these spacers is stainless steel (SUS304), and the thickness thereof is 30 μm.

The through-hole corresponding to each region of the electrodes to be inspected has dimensions of 3,500 μm in the lateral direction and 1,400 μm in the vertical direction.

(3) Mold:

A mold for molding elastic anisotropically conductive films was produced under the following conditions.

A top force and a bottom force in this mold respectively have base plates made of iron and each having a thickness of 6 mm. On the base plate, ferromagnetic substance layers for forming conductive parts for connection and ferromagnetic substance layers for forming conductive parts for non-connection, which are made of nickel, are arranged in accordance with a pattern corresponding to a pattern of the electrodes to be inspected in Wafer W2 for test. More specifically, the dimensions of each of the ferromagnetic substance layers for forming conductive parts for connection are 50 μm (lateral direction)×100 μm (vertical direction)×100 μm (thickness), and 50 ferromagnetic substance layers are arranged at a pitch of 100 μm in 2 lines (the number of ferromagnetic substance layers in a line: 25; clearance between ferromagnetic substance layers adjacent in the vertical direction: 350 μm) in the lateral direction. The ferromagnetic substance layers for forming conductive parts for non-connection are arranged outside the ferromagnetic substance layers located most outside in a direction that the ferromagnetic substance layers are arranged. The dimensions of each of these ferromagnetic substance layers are 50 μm (lateral direction)×200 μm (vertical direction)×100 μm (thickness).

Corresponding to the regions of the electrodes to be inspected in Wafer W2 for test, are formed 225 regions in total, in each of which 50 ferromagnetic substance layers for forming conductive parts for connection and 2 ferromagnetic substance layers for forming conductive parts for non-connection have been formed. In the whole base plate, are formed 11,250 ferromagnetic substance layers for forming conductive parts for connection and 450 ferromagnetic substance layers for forming conductive parts for non-connection.

Non-magnetic substance layers are formed by subjecting dry film resists to a curing treatment. The dimensions of each of recessed parts, at which the ferromagnetic substance layer for forming the conductive part for connection is located, are 50 μm (lateral direction)×100 μm (vertical direction)×30 μm (depth), the dimensions of each of recessed parts, at which the ferromagnetic substance layer for forming the conductive part for non-connection is located, are 50 μm (lateral direction)×200 μm (vertical direction)×30 μm (depth), and the thickness of other portions than the recessed parts is 130 μm (the thickness of the recessed parts: 100 μm).

(4) Elastic Anisotropically Conductive Film:

The above-described frame plate, spacers and mold were used to form elastic anisotropically conductive films in the frame plate in the following manner.

Paste (1-$a$) prepared as a molding material for elastic anisotropically conductive films in the same manner as in Example 1 was applied to the surfaces of the top force and bottom force of the mold by screen printing, thereby forming molding material layers in accordance with a patter of the elastic anisotropically conductive films to be formed, and the frame plate was superimposed in alignment on the molding surface of the bottom force through the spacer on the side of the bottom force. Further, the top force was superimposed in alignment on the frame plate through the spacer on the side of the top force.

The molding material layers formed between the top force and the bottom force were subjected to a curing treatment under conditions of 100° C. for 1 hour while applying a magnetic field of 2 T to portions located between the corresponding ferromagnetic substance layers in the thickness-wise direction by electromagnets, thereby forming an elastic anisotropically conductive film in each of the anisotropically conductive film-arranging holes of the frame plate, thus producing an anisotropically conductive connector. This anisotropically conductive connector will hereinafter be referred to as "Anisotropically Conductive Connector C21".

The elastic anisotropically conductive films thus obtained will be described specifically. Each of the elastic anisotropically conductive films has dimensions of 3,500 μm in the lateral direction and 1,400 μm in the vertical direction. In a functional part in each of the elastic anisotropically conductive films, 50 conductive parts for connection are arranged at a pitch of 100 μm in 2 lines (the number of conductive parts for connection in a line: 25; clearance between conductive parts for connection adjacent in the vertical direction: 350 μm) in the lateral direction. The dimensions of each of the conductive parts for connection are 50 μm in the lateral direction, 100 μm in the vertical direction and 200 μm in thickness. The thickness of the insulating part in the functional part is 140 μm. Conductive parts for non-connection are arranged between the conductive parts for connection located most outside in the lateral direction and the frame plate. The dimensions of each of the conductive parts for non-connection are 50 μm in the lateral direction, 200 μm in the vertical direction and 200 μm in thickness. The thickness (thickness of one of the forked portions) of the part to be supported in each of the elastic anisotropically conductive films is 30 μm.

The content of the conductive particles in the conductive parts for connection in each of the elastic anisotropically conductive films of Anisotropically Conductive Connector C21 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

(5) Circuit Board for Inspection:

A glass-reinforced epoxy resin was used as a base material to produce a circuit board for inspection, in which inspection electrodes had been formed in accordance with a pattern corresponding to the pattern of the electrodes to be inspected in Wafer W2 for test. This circuit board for inspection is rectangular with dimensions of 16 cm×16 cm as a whole. The inspection electrodes thereof each have dimensions of 50 μm in the lateral direction and 100 μm in the vertical direction. This circuit board for inspection will hereinafter be referred to as "Inspection Circuit Board T2".

(6) Sheet-Like Connector:

A laminate material obtained by laminating a copper layer having a thickness of 15 μm on one surface of an insulating sheet formed of polyimide and having a thickness of 20 μm was provided, and 11,250 through-holes each extending through in the thickness-wise direction of the insulating sheet and having a diameter of 30 μm were formed in the insulating sheet of the laminate material in accordance with a pattern corresponding to the pattern of electrodes to be inspected in Wafer W2 for test by subjecting the insulating sheet to laser machining. This laminate material was then subjected to photolithography and plating treatment with nickel, whereby short circuit parts integrally connected to the copper layer were formed in the through-holes in the insulating sheet, and at the same time, projected front-surface electrode parts integrally connected to the respective short circuit parts were formed on the front surface of the insulating sheet. The diameter of each of the front-surface electrode parts was 40 μm, and the height from the surface of the insulating sheet was 20 μm. Thereafter, the copper layer of the laminate material was subjected to a photo-etching treatment to remove a part thereof, thereby forming rectangular back-surface electrode parts each having dimensions of 20 μm×60 μm. Further, the front-surface electrode parts and back-surface electrode parts were subjected to a plating treatment with gold, thereby forming electrode structures, thus producing a sheet-like connector. This sheet-like connector will hereinafter be referred to as "Sheet-like Connector M2".

(7) Test 3:

Wafer W2 for test was arranged on a test table equipped with an electric heater, and Anisotropically Conductive Connector C21 was arranged on this Wafer W2 for test in alignment in such a manner that the conductive parts for connection thereof are located on the respective electrodes to be inspected of Wafer W2 for test. Inspection Circuit Board T2 was then arranged on this Anisotropically Conductive Connector C21 in alignment in such a manner that the inspection electrodes thereof are located on the respective conductive parts for connection of Anisotropically Conductive Connector C21. Further, Inspection Circuit Board T2 was pressurized downward under a load of 90 kg (load applied to every conductive part for connection: about 8 g on the average). A conduction resistance of the conductive parts for connection in Anisotropically Conductive Connector C21 at room temperature (25° C.) to count the number of conductive parts for connection that the conduction resistance was 1 Ω or higher. The above-described process is referred to as "Process (1)".

After the test table was then heated to 85° C. and held for 1 minute in a state that Inspection Circuit Board T2 had been pressurized as it is, the conduction resistance of the conductive parts for connection in Anisotropically Conductive Connector C21 was measured to count the number of conductive parts for connection that the conduction resistance was 1 Ω or higher. The pressure against the circuit board for inspection was then released. Thereafter, the test table was cooled to room temperature. The above-described process is referred to as "Process (2)".

The above-described Processes (1) and (2) were regarded as a cycle, and the cycle was continuously repeated 50,000 times in total.

In the above-described test, those that the conduction resistance of the conductive parts for connection is 1 Ω or higher are difficult to be actually used in electrical inspection of integrated circuits formed on a wafer.

The results are shown in the following Table 5.

EXAMPLE 6

An anisotropically conductive connector was produced in the same manner as in Example 5 except that Paste (1-*d*) prepared in the same manner as in Example 4 was used in place of Paste (1-*a*). This anisotropically conductive connector will hereinafter be referred to as "Anisotropically Conductive Connector C24".

The content of the conductive particles in the conductive parts for connection in each of the elastic anisotropically conductive films of Anisotropically Conductive Connector C24 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C24 was used in place of Anisotropically Conductive Connector C21. The results are shown in the following Table 5.

EXAMPLE 7

A conductive paste composition was prepared in the same manner as in Example 4 except that Silicone Rubber (2) was used in place of Silicone Rubber (1). This conductive paste composition will be referred to as "Paste (2-d)".

An anisotropically conductive connector was produced in the same manner as in Example 5 except that Paste (2-d) was used in place of Paste (1-*a*). This anisotropically conductive connector will hereinafter be referred to as "Anisotropically Conductive Connector C25".

The content of the conductive particles in the conductive parts for connection in each of the elastic anisotropically conductive films of Anisotropically Conductive Connector C25 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C25 was used in place of Anisotropically Conductive Connector C21. The results are shown in the following Table 5.

EXAMPLE 8

A conductive paste composition was prepared in the same manner as in Example 4 except that Silicone Rubber (3) was used in place of Silicone Rubber (1). This conductive paste composition will be referred to as "Paste (3-a)".

An anisotropically conductive connector was produced in the same manner as in Example 5 except that Paste (3-a) was used in place of Paste (1-*a*). This anisotropically conductive connector will hereinafter be referred to as "Anisotropically Conductive Connector C26".

The content of the conductive particles in the conductive parts for connection in each of the elastic anisotropically conductive films of Anisotropically Conductive Connector C26 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C26 was used in place of Anisotropically Conductive Connector C21. The results are shown in the following Table 5.

COMPARATIVE EXAMPLE 9

An anisotropically conductive connector was produced in the same manner as in Example 5 except that Paste (1-*a*1) prepared in the same manner as in Comparative Example 1 was used in place of Paste (1-*a*). This anisotropically conductive connector will hereinafter be referred to as "Anisotropically Conductive Connector C31".

The content of the conductive particles in the conductive parts for connection in each of the elastic anisotropically conductive films of Anisotropically Conductive Connector C31 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C31 was used in place of Anisotropically Conductive Connector C21. The results are shown in the following Table 5.

COMPARATIVE EXAMPLE 10

An anisotropically conductive connector was produced in the same manner as in Example 5 except that Paste (1-*c*1) prepared in the same manner as in Comparative Example 2 was used in place of Paste (1-*a*). This anisotropically conductive connector will hereinafter be referred to as "Anisotropically Conductive Connector C32".

The content of the conductive particles in the conductive parts for connection in each of the elastic anisotropically conductive films of Anisotropically Conductive Connector C32 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C32 was used in place of Anisotropically Conductive Connector C21. The results are shown in the following Table 5.

COMPARATIVE EXAMPLE 11

An anisotropically conductive connector was produced in the same manner as in Example 5 except that Paste (1-*d*1) prepared in the same manner as in Comparative Example 3 was used in place of Paste (1-*a*). This anisotropically conductive connector will hereinafter be referred to as "Anisotropically Conductive Connector C33".

The content of the conductive particles in the conductive parts for connection in each of the elastic anisotropically conductive films of Anisotropically Conductive Connector C33 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C33 was used in place of Anisotropically Conductive Connector C21. The results are shown in the following Table 5.

COMPARATIVE EXAMPLE 12

An anisotropically conductive connector was produced in the same manner as in Example 5 except that Paste (1-*e*1) prepared in the same manner as in Comparative Example 4 was used in place of Paste (1-*a*). This anisotropically conductive connector will hereinafter be referred to as "Anisotropically Conductive Connector C34".

The content of the conductive particles in the conductive parts for connection in each of the elastic anisotropically conductive films of Anisotropically Conductive Connector C34 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C34 was used in place of Anisotropically Conductive Connector C21. The results are shown in the following Table 5.

COMPARATIVE EXAMPLE 13

An anisotropically conductive connector was produced in the same manner as in Example 5 except that Paste (1-*f*1) prepared in the same manner as in Comparative Example 5 was used in place of Paste (1-*a*). This anisotropically conductive connector will hereinafter be referred to as "Anisotropically Conductive Connector C35".

The content of the conductive particles in the conductive parts for connection in each of the elastic anisotropically conductive films of Anisotropically Conductive Connector C35 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C35 was used in place of Anisotropically Conductive Connector C21. The results are shown in the following Table 5.

COMPARATIVE EXAMPLE 14

An anisotropically conductive connector was produced in the same manner as in Example 5 except that Paste (1-*g*1) prepared in the same manner as in Comparative Example 6 was used in place of Paste (1-*a*). This anisotropically conductive connector will hereinafter be referred to as "Anisotropically Conductive Connector C36".

The content of the conductive particles in the conductive parts for connection in each of the elastic anisotropically conductive films of Anisotropically Conductive Connector C36 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C36 was used in place of Anisotropically Conductive Connector C21. The results are shown in the following Table 5.

COMPARATIVE EXAMPLE 15

An anisotropically conductive connector was produced in the same manner as in Example 5 except that Paste (1-*h*1) prepared in the same manner as in Comparative Example 7 was used in place of Paste (1-*a*). This anisotropically conductive connector will hereinafter be referred to as "Anisotropically Conductive Connector C37".

The content of the conductive particles in the conductive parts for connection in each of the elastic anisotropically conductive films of Anisotropically Conductive Connector C37 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C37 was used in place of Anisotropically Conductive Connector C21. The results are shown in the following Table 5.

COMPARATIVE EXAMPLE 16

An anisotropically conductive connector was produced in the same manner as in Example 5 except that Paste (1-*i*1) prepared in the same manner as in Example 8 was used in place of Paste (1-*a*). This anisotropically conductive connector will hereinafter be referred to as "Anisotropically Conductive Connector C38".

The content of the conductive particles in the conductive parts for connection in each of the elastic anisotropically conductive films of Anisotropically Conductive Connector C38 thus obtained was investigated. As a result, the content was about 30% in terms of a volume fraction in all the conductive parts for connection.

The parts to be supported and the insulating parts in the functional parts of the elastic anisotropically conductive films were observed. As a result, it was confirmed that the conductive particles are present in the parts to be supported and that the conductive particles are scarcely present in the insulating parts in the functional parts.

Test 3 was conducted in the same manner as in Example 5 except that Anisotropically Conductive Connector C38 was used in place of Anisotropically Conductive Connector C21. The results are shown in the following Table 5.

fixing to a wafer, which is an object of inspection, can be easily conducted in an electrically connecting operation to the wafer.

Since the proportion of the high-conductive metal to the core particles in the conductive particles contained in the conductive parts for connection in the elastic anisotropically conductive films is at least 15% by mass, and the thickness t of the coating layer formed of the high-conductive metal is at least 50 nm, the core particles in the conductive particles are prevented from being exposed to the surface even when the anisotropically conductive connector is used repeatedly many times. As a result, the necessary conductivity can be surely retained.

Even when the material making up the core particles in the conductive particles migrates into the high-conductive metal when the anisotropically conductive connector is used

TABLE 5

| | | Number of conductive parts for connection that conduction resistance was 1 Ω or higher (count) | | | | | | | |
|---|---|---|---|---|---|---|---|---|---|
| | Number of cycles | 1 | 1000 | 5000 | 10000 | 20000 | 30000 | 40000 | 50000 |
| Example 5 | Room temperature | 0 | 0 | 0 | 0 | 0 | 0 | 0 | 0 |
| | 85° C. | 0 | 0 | 0 | 0 | 0 | 0 | 0 | 0 |
| Example 6 | Room temperature | 0 | 0 | 0 | 0 | 0 | 0 | 0 | 0 |
| | 85° C. | 0 | 0 | 0 | 0 | 0 | 0 | 0 | 0 |
| Example 7 | Room temperature | 0 | 0 | 0 | 0 | 0 | 0 | 0 | 0 |
| | 85° C. | 0 | 0 | 0 | 0 | 0 | 0 | 0 | 0 |
| Example 8 | Room temperature | 0 | 0 | 0 | 0 | 0 | 18 | 34 | 82 |
| | 85° C. | 0 | 0 | 0 | 0 | 0 | 8 | 26 | 42 |
| Comparative Example 9 | Room temperature | 0 | 0 | 34 | 114 | 316 | 1038 | 3462 | 11250 |
| | 85° C. | 0 | 0 | 26 | 78 | 236 | 738 | 2380 | 5106 |
| Comparative Example 10 | Room temperature | 0 | 0 | 16 | 26 | 238 | 704 | 2734 | 11250 |
| | 85° C. | 0 | 0 | 8 | 18 | 124 | 342 | 1842 | 4404 |
| Comparative Example 11 | Room temperature | 0 | 0 | 0 | 26 | 80 | 104 | 862 | 3278 |
| | 85° C | 0 | 0 | 0 | 8 | 52 | 78 | 448 | 1810 |
| Comparative Example 12 | Room temperature | 0 | 0 | 0 | 0 | 88 | 124 | 1186 | 4702 |
| | 85° C. | 0 | 0 | 0 | 0 | 36 | 80 | 730 | 3024 |
| Comparative Example 13 | Room temperature | 0 | 0 | 0 | 0 | 158 | 632 | 1644 | 11250 |
| | 85° C. | 0 | 0 | 0 | 42 | 166 | 580 | 7832 | |
| Comparative Example 14 | Room temperature | 0 | 0 | 26 | 96 | 422 | 1028 | 11250 | 11250 |
| | 85° C. | 0 | 0 | 16 | 70 | 272 | 774 | 3304 | 11250 |
| Comparative Example 15 | Room temperature | 0 | 114 | 930 | 4490 | 11250 | 11250 | 11250 | 11250 |
| | 85° C. | 0 | 78 | 572 | 3058 | 11250 | 11250 | 11250 | 11250 |
| Comparative Example 16 | Room temperature | 0 | 0 | 8 | 18 | 70 | 150 | 2522 | 4640 |
| | 85° C. | 0 | 0 | 0 | 8 | 34 | 78 | 816 | 2180 |

As apparent from the results shown in Table 5, it was confirmed that according to Anisotropically Conductive Connector C21 and Anisotropically Conductive Connector C24 to Anisotropically Conductive Connector C26 of Example 5 to Example 8, good conductivity is achieved in the conductive parts for connection in the elastic anisotropically conductive films even when the pitch of the conductive parts for connection is small, and good conductivity is retained even when used repeatedly over many times.

Effects of the Invention

According to the anisotropically conductive connectors of the present invention, in each of the elastic anisotropically conductive films, the part to be supported is formed at a peripheral edge of the functional part having conductive parts for connection, and this part to be supported is fixed to the periphery about the anisotropically conductive film-arranging hole in the frame plate, so that such an anisotropically conductive connector is hard to be deformed and easy to handle, and the positioning and the holding and repeatedly under a high-temperature environment, it is prevented to markedly deteriorate the conductivity of the conductive particles because the high-conductive metal exists in a high proportion on the surfaces of the conductive particles.

The cured product of addition type liquid silicone rubber, whose compression set is at most 10% at 150° C. and whose durometer A hardness is 10 to 60, is used as the elastic polymeric substance forming the elastic anisotropically conductive films, whereby it is inhibited to cause permanent set on the conductive parts for connection even when the anisotropically conductive connector is used repeatedly over many times, thereby inhibiting the chains of the conductive particles in the conductive part for connection from being disordered. As a result, the necessary conductivity can be more surely retained.

That having a durometer A hardness of 25 to 40 is used as the elastic polymeric substance forming the elastic anisotropically conductive films, whereby it is inhibited to cause permanent set on the conductive parts for connection even when the anisotropically conductive connector is used repeatedly in a test under a high-temperature environment, thereby inhibiting the chains of the conductive particles in the conductive part for connection from being disordered. As a result, the necessary conductivity can be surely retained over a long period of time.

Since the anisotropically conductive film-arranging holes in the frame plate are formed correspondingly to electrode regions, in which electrodes to be inspected are arranged, of integrated circuits formed on a wafer, which is an object of inspection, and the elastic anisotropically conductive film arranged in each of the anisotropically conductive film-arranging holes in the frame plate may be small in area, the individual elastic anisotropically conductive films are easy to be formed. In addition, since the elastic anisotropically conductive film small in area is little in the absolute quantity of thermal expansion in a plane direction of the elastic anisotropically conductive film even when it is subjected to thermal hysteresis, the thermal expansion of the elastic anisotropically conductive film in the plane direction is surely restrained by the frame plate by using a material having a low coefficient of linear thermal expansion as that for forming the frame plate. Accordingly, a good electrically connected state can be stably retained even when the WLBI test is performed on a large-area wafer.

According to the conductive paste compositions of the present invention, the elastic anisotropically conductive films in the above-described anisotropically conductive connectors can be advantageously formed.

According to the probe members of the present invention, positioning, and holding and fixing to a wafer, which is an object of inspection, can be conducted with ease in an electrically connecting operation to the wafer, and the necessary conductivity can be retained even when used repeatedly over many times.

Specific silicone rubber is used as the elastic polymeric substance forming the elastic anisotropically conductive films in the anisotropically conductive connector, whereby the necessary conductivity can be retained over a long period of time even when used repeatedly in a test under a high-temperature environment.

According to the wafer inspection apparatus and wafer inspection method of the present invention, electrical connection to electrodes to be inspected of a wafer, which is an object of inspection, is achieved through the probe member, so that positioning, and holding and fixing to the wafer can be conducted with ease even when the pitch of the electrodes to be inspected is small. In addition, the necessary electrical inspection can be stably performed over a long period of time even when the apparatus is used repeatedly over many times or used repeatedly in a test under a high-temperature environment.

Since inspection can be conducted with high reliability according to the wafer inspection method of the present invention, integrated circuits having defects or latent defects can be sorted at high probability from among a great number of integrated circuits formed on a wafer, whereby semiconductor integrated circuit devices having defects or latent defects can be removed in a production process of semiconductor integrated circuit devices to surely provide non-defective products alone.

The wafer inspection method according to the present invention is applied to an inspection step in a production process of semiconductor integrated circuit devices, whereby productivity of the semiconductor integrated circuit devices can be improved. In addition, probability that semiconductor integrated circuit devices having defects or latent defects are included in mass-produced semiconductor integrated circuit devices can be reduced. Accordingly, according to a semiconductor integrated circuit device obtained by such a production process, high reliability is achieved in an electronic instrument that is a final product, into which the semiconductor integrated circuit devices are incorporated. In addition, since the incorporation of a semiconductor integrated circuit device having defects or latent defects into the electronic instrument that is a final product can be prevented at high probability, the frequency of occurrence of trouble in the resulting electronic instrument by long-term service can be reduced.

The invention claimed is:

1. An anisotropically conductive connector for electrically connecting a circuit board for inspection to a wafer by being arranged on the surface of the circuit board for inspection for conducting electrical inspection of each of a plurality of integrated circuits formed on the wafer in a state of the wafer, which comprises:

a frame plate, in which a plurality of anisotropically conductive film-arranging holes each extending in a thickness-wise direction of the frame plate have been formed correspondingly to electrode regions, in which electrodes to be inspected have been arranged, in all or part of the integrated circuits formed on the wafer, which is an object of inspection, and a plurality of elastic anisotropically conductive films arranged in the respective anisotropically conductive film-arranging holes in this frame plate and each supported by the peripheral edge about the anisotropically conductive film-arranging hole, wherein each of the elastic anisotropically conductive films is composed of a functional part having a plurality of conductive parts for connection formed of an elastic polymeric substance, containing conductive particles exhibiting magnetism at a high density and extending in the thickness-wise direction of the film, and arranged correspondingly to the electrodes to be inspected in the integrated circuits formed on the wafer, which is the object of inspection and an insulating part mutually insulating these conductive parts for connection, and a part to be supported integrally formed at a peripheral edge of the functional part and fixed to the peripheral edge about the anisotropically conductive film-arranging hole in the frame plate, wherein the conductive particles contained in the conductive part for connection in the elastic anisotropically conductive film are obtained by coating the surfaces of core particles exhibiting magnetism with a high-conductive metal, a proportion of the high-conductive metal to the core particles is at least 15% by mass, and the thickness t of the coating layer formed of the high-conductive metal, which is calculated out in accordance with the following equation (1), is at least 50 nm, and wherein the elastic polymeric substance forming the elastic anisotropically conductive films is a cured product of addition type liquid silicone rubber, whose compression set is at most 10% at 150° C. and whose durometer A hardness is 10 to 60:

$t=[1/Sw \cdot \rho] \times [N/(1-N)]$ Equation (1)

wherein t is the thickness (m) of the coating layer formed of the high-conductive metal, Sw is a BET specific surface area (m$^2$/kg) of the core particles, ρ is a specific gravity (kg/m$^3$) of the high-conductive metal, and N is a value of (mass of the high-conductive metal/total mass of the conductive particles).

2. The anisotropically conductive connector according to claim 1, wherein the conductive particles have an electric resistance value R of at most 0.3 Ω as determined by the following measuring method: Electric resistance value R: an electric resistance value determined after preparing a paste composition by kneading 0.6 g of the conductive particles and 0.8 g of liquid rubber, arranging this paste composition between a pair of electrodes each having a diameter of 1 mm and arranged so as to oppose to each other with a clearance of 0.5 mm, applying a magnetic field of 0.3 T between the pair of the electrodes, and leaving the paste composition to stand in this state until the electric resistance value between the pair of the electrodes becomes stable.

3. The anisotropically conductive connector according to claim 1, wherein the conductive particles have a BET specific surface area of 10 to 500 m$^2$/kg.

4. The anisotropically conductive connector according to claim 1, wherein the elastic polymeric substance forming the elastic anisotropically conductive films has a durometer A hardness of 25 to 40.

5. The anisotropically conductive connector according to claim 1, wherein the elastic polymeric substance forming the elastic anisotropically conductive films has tear strength of at least 8 kN/m.

6. The anisotropically conductive connector according to claim 1, wherein the coefficient of linear thermal expansion of the frame plate is at most $3\times10^{-5}$/K.

7. A conductive paste composition suitable for forming the elastic anisotropically conductive films in the anisotropically conductive connector according to claim 1, which comprises:
  curable liquid silicone rubber and conductive particles obtained by coating the surfaces of core particles exhibiting magnetism with a high-conductive metal, wherein a proportion of the high-conductive metal to the core particles in the conductive particles is at least 15% by mass, and the thickness t of the coating layer formed of the high-conductive metal, which is calculated out in accordance with the equation according to claim 1, is at least 50 nm, and
  wherein the liquid silicone rubber is such that a cured product thereof has a compression set of at most 10% at 150° C. and a durometer A hardness of 10 to 60.

8. A probe member suitable for use in conducting electrical inspection of each of a plurality of integrated circuits formed on a wafer in a state of the wafer, which comprises:
  a circuit board for inspection, on the surface of which inspection electrodes have been formed in accordance with a pattern corresponding to a pattern of electrodes to be inspected of the integrated circuits formed on the wafer, which is an object of inspection, and the anisotropically conductive connector according to any one of claims 1 to 3 and 4 to 6, which is arranged on the surface of the circuit board for inspection.

9. The probe member according to claim 8, wherein the coefficient of linear thermal expansion of the frame plate in the anisotropically conductive connector is at most $3\times10^{-5}$/K, and the coefficient of linear thermal expansion of a base material making up the circuit board for inspection is at most $3\times10^{-5}$/K.

10. A wafer inspection apparatus for conducting electrical inspection of each of a plurality of integrated circuits formed on a wafer in a state of the wafer, which comprises the probe member according to claim 8, wherein electrical connection to the integrated circuits formed on the wafer, which is an object of inspection, is achieved though the probe member.

11. A wafer inspection method comprising electrically connecting each of a plurality of integrated circuits formed on a wafer to a tester though the probe member according to claim 8 to perform electrical inspection of the integrated circuits formed on the wafer.

12. The probe member according to claim 8, wherein a sheet-like connector composed of an insulating sheet and a plurality of electrode structures each extending through in a thickness-wise direction of the insulating sheet and arranged in accordance with a pattern corresponding to the pattern of the electrodes to be inspected is arranged on the anisotropically conductive connector.

13. A wafer inspection apparatus for conducting electrical inspection of each of a plurality of integrated circuits formed on a wafer in a state of the wafer, which comprises the probe member according to claim 12, wherein electrical connection to the integrated circuits formed on the wafer, which is an object of inspection, is achieved though the probe member.

14. A wafer inspection method comprising electrically connecting each of a plurality of integrated circuits formed on a wafer to a tester though the probe member according to claim 12 to perform electrical inspection of the integrated circuits formed on the wafer.

* * * * *